(12) United States Patent
Yang et al.

(10) Patent No.: US 11,461,528 B2
(45) Date of Patent: Oct. 4, 2022

(54) INTEGRATED CIRCUIT, SYSTEM FOR AND METHOD OF FORMING AN INTEGRATED CIRCUIT

(71) Applicant: TAIWAN SEMICONDUCTOR MANUFACTURING COMPANY, LTD., Hsinchu (TW)

(72) Inventors: Jung-Chan Yang, Longtan Township (TW); Ting-Wei Chiang, New Taipei (TW); Jerry Chang-Jui Kao, Taipei (TW); Hui-Zhong Zhuang, Kaohsiung (TW); Lee-Chung Lu, Taipei (TW); Li-Chun Tien, Tainan (TW); Meng-Hung Shen, Zhubei (TW); Shang-Chih Hsieh, Yangmei (TW); Chi-Yu Lu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 112 days.

(21) Appl. No.: 16/908,288

(22) Filed: Jun. 22, 2020

(65) Prior Publication Data

US 2020/0320244 A1 Oct. 8, 2020

Related U.S. Application Data

(62) Division of application No. 15/792,289, filed on Oct. 24, 2017, now Pat. No. 10,740,531.

(Continued)

(51) Int. Cl.
*G06F 30/394* (2020.01)
*H01L 23/522* (2006.01)
(Continued)

(52) U.S. Cl.
CPC ........ *G06F 30/394* (2020.01); *H01L 23/5226* (2013.01); *H01L 23/5286* (2013.01);
(Continued)

(58) Field of Classification Search
CPC ............... G06F 30/394; H01L 23/5226; H01L 23/5286; H01L 27/0207; H01L 27/11807; H01L 2027/11887
(Continued)

(56) References Cited

U.S. PATENT DOCUMENTS 6,476,493 B2 11/2002 Or-Bach
6,617,621 B1 9/2003 Gheewala
(Continued)

FOREIGN PATENT DOCUMENTS

CN 105374813 3/2016
JP 9-293843 11/1997
(Continued)

OTHER PUBLICATIONS

Office Action dated Aug. 28, 2018 from corresponding application No. TW 106141615.

(Continued)

*Primary Examiner* — Tu-Tu V Ho
(74) *Attorney, Agent, or Firm* — Hauptman Ham, LLP

(57) ABSTRACT

An integrated circuit structure includes a first, a second and a third set of conductive structures and a first and a second set of vias. The first set of conductive structures extend in a first direction, and is located at a first level. The second set of conductive structures extends in a second direction, overlaps the first set of conductive structures, and is located at a second level. The first set of vias is between, and electrically couples the first and the second set of conductive structures. The third set of conductive structures extends in the first direction, overlaps the second set of conductive
(Continued)

structures, covers a portion of the first set of conductive structures, and is located at a third level. The second set of vias is between, and electrically couples the second and the third set of conductive structures.

20 Claims, 39 Drawing Sheets

Related U.S. Application Data

(60) Provisional application No. 62/427,635, filed on Nov. 29, 2016.

(51) Int. Cl.
  *H01L 27/118* (2006.01)
  *H01L 23/528* (2006.01)
  *H01L 27/02* (2006.01)

(52) U.S. Cl.
  CPC .... *H01L 27/0207* (2013.01); *H01L 27/11807* (2013.01); *H01L 2027/11887* (2013.01)

(58) Field of Classification Search
  USPC .......................................................... 257/401
  See application file for complete search history.

(56) References Cited

U.S. PATENT DOCUMENTS

| | | | |
|---|---|---|---|
| 7,271,488 | B2 | 9/2007 | Arakawa et al. |
| 7,989,849 | B2 | 8/2011 | Sherlekar |
| 8,742,464 | B2 | 6/2014 | Sherlekar |
| 8,863,063 | B2 | 10/2014 | Becker |
| 9,165,882 | B2 | 10/2015 | Lin |
| 9,431,300 | B1 | 8/2016 | Zeng et al. |
| 9,524,972 | B2 | 12/2016 | Mojumder et al. |
| 9,563,733 | B2 | 2/2017 | Becker |
| 10,204,858 | B2 | 2/2019 | Kirimura |
| 10,474,783 | B2 | 11/2019 | Rastogi |
| 10,573,643 | B2 | 2/2020 | Do |
| 2006/0113567 | A1 | 6/2006 | Ohmori |
| 2006/0166434 | A1 | 7/2006 | Kinoshita et al. |
| 2006/0184808 | A1* | 8/2006 | Chua-Eoan ........... G06F 1/3203 713/300 |
| 2006/0289994 | A1 | 12/2006 | Greenberg |
| 2007/0102765 | A1 | 5/2007 | Tsai |
| 2009/0152728 | A1 | 6/2009 | Maede |
| 2010/0044755 | A1 | 2/2010 | Tsuda et al. |
| 2010/0127347 | A1* | 5/2010 | Quinn ................ H01L 23/5225 257/532 |
| 2013/0087932 | A1 | 4/2013 | Lu |
| 2014/0327153 | A1 | 11/2014 | Yuan |
| 2015/0035070 | A1 | 2/2015 | Chiang |
| 2015/0048425 | A1 | 2/2015 | Park |
| 2015/0262936 | A1 | 9/2015 | Bansal et al. |
| 2016/0063166 | A1 | 3/2016 | Hsieh et al. |
| 2016/0064322 | A1 | 3/2016 | Chen et al. |
| 2016/0078164 | A1 | 3/2016 | Hsieh |
| 2016/0240539 | A1 | 8/2016 | Mojumder et al. |
| 2017/0098608 | A1 | 4/2017 | Jung |

FOREIGN PATENT DOCUMENTS

| | | |
|---|---|---|
| JP | 2006-190732 | 7/2006 |
| JP | 2015-15502 | 1/2015 |

OTHER PUBLICATIONS

Office Action dated Dec. 10, 2018 from corresponding application No. KR 10-2017-0159565.

Office Action dated Oct. 22, 2019 from corresponding application No. KR 10-2017-0159565.

\* cited by examiner

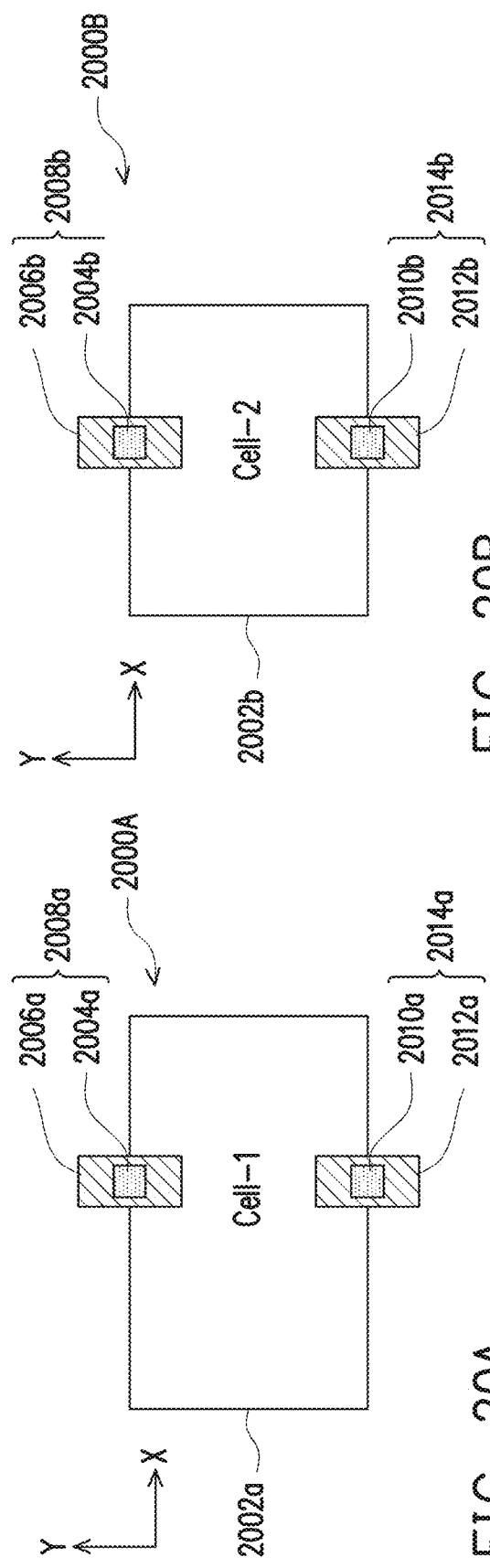
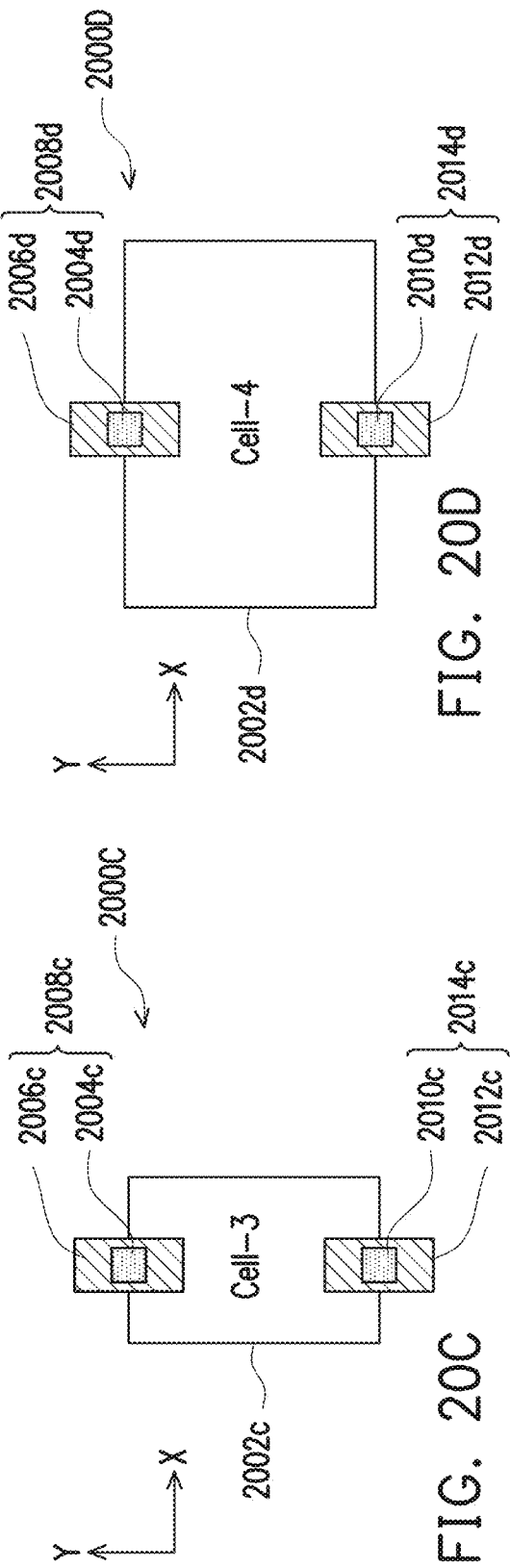
FIG. 20A  FIG. 20B  FIG. 20C  FIG. 20D

INTEGRATED CIRCUIT, SYSTEM FOR AND METHOD OF FORMING AN INTEGRATED CIRCUIT

PRIORITY CLAIM

The present application is a divisional of U.S. application Ser. No. 15/792,289, filed Oct. 24, 2017, now U.S. Pat. No. 10,740,531, issued Aug. 11, 2020, which claims the priority of U.S. Provisional Application No. 62/427,635, filed Nov. 29, 2016, which are incorporated herein by reference in their entireties.

BACKGROUND

In many integrated circuits (ICs), power rails are used to distribute power to functional circuit elements formed in a substrate. Power is often delivered to power rails using metal layers between the power rails and power straps at a level above the level of the power rails.

The resistance of an IC structure including such metal layers can affect the efficiency of power delivery, heat generation, and susceptibility to electromigration (EM). Routing of the metal layers can also impact the routing of additional electrical connections to the functional circuit elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A-20D are diagrams of layout designs of an IC structure, in accordance with some embodiments.

DETAILED DESCRIPTION

Figure 1:
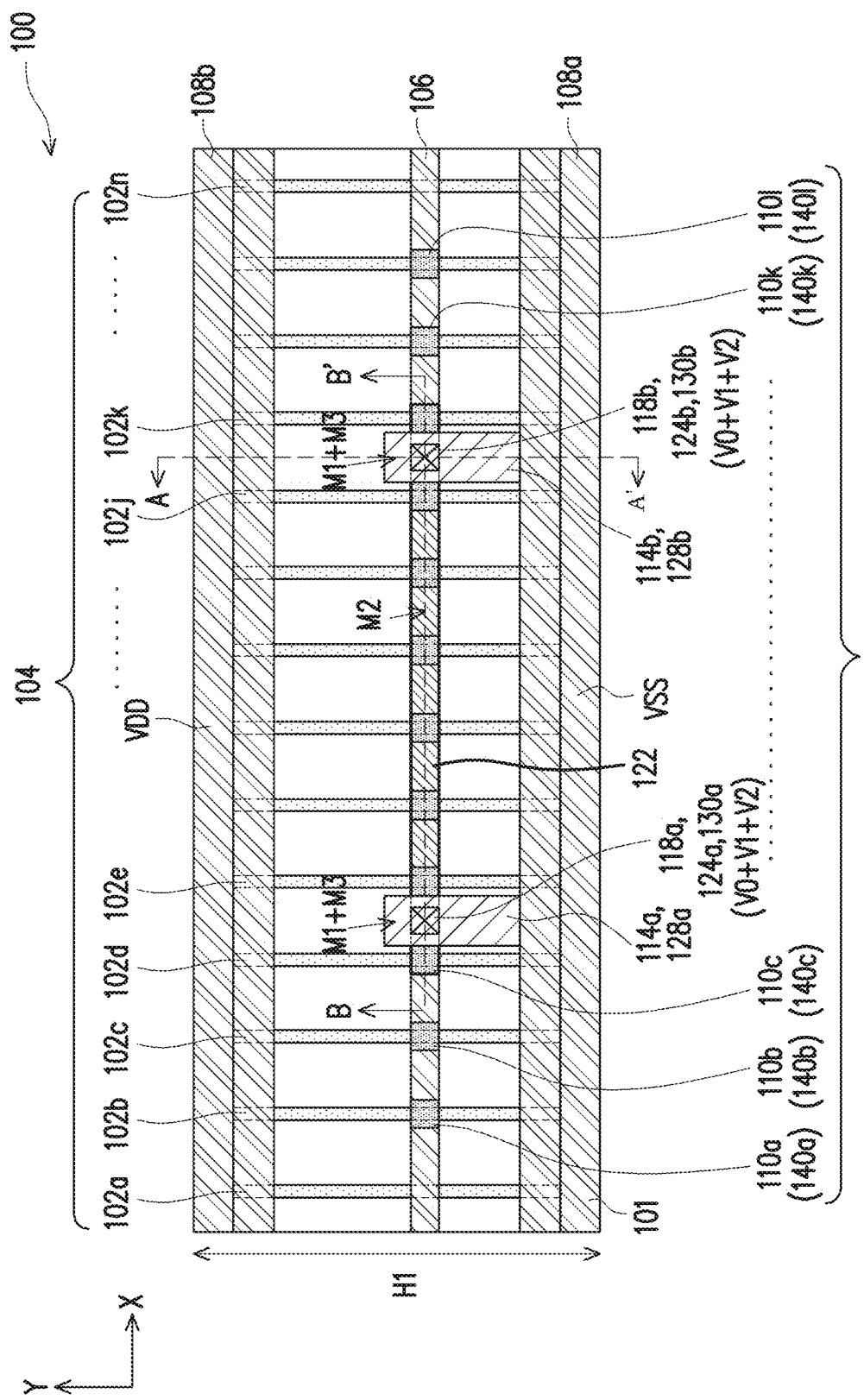
FIG. 1 is a diagram of a layout design of an IC structure, in accordance with some embodiments

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an IC structure includes a set of gate structures, a first conductive structure, a first and second set of vias, and a first set of conductive structures. The set of gate structures is located at a first level. The first conductive structure extends in a first direction, overlaps the set of gate structures and is located at a second level. The first set of vias is between the set of gate structures and the first conductive structure. The first set of vias couple the set of gate structures to the first conductive structure. The first set of conductive structures extend in a second direction, overlap the first conductive structure, and is located at a third level. The second set of vias couple the first set of conductive structures to the first conductive structure, and is between the first set of conductive structures and the first conductive structure. In some embodiments, the IC structure is part of an input pin or an output pin. In some embodiments, the first conductive structure is on a first metal level (e.g., M0). In some embodiments, the first set of conductive structures is on a second metal level (e.g., M1).

In some embodiments, a center of a via of the first set of vias is aligned in the first direction X in the second direction Y with a center of a via of the second set of vias, and is referred to as a stacked configuration. In some embodiments, vias arranged in a stacked configuration have a lower resistance than other approaches.

FIG. 1 is a diagram of a layout design 100 of an IC structure, in accordance with some embodiments. In some embodiments, layout design 100 corresponds to a layout design of a dual-input pin having a first pin (e.g., conductive structure layout patterns 114a, 128a) and a second pin (e.g., conductive structure layout patterns 114b, 128b). Other configurations, locations or number of elements in layout design 100 of FIG. 1 are within the scope of the present disclosure.

Layout design 100 includes one or more gate layout patterns 102a, 102b, . . . , 102n (collectively referred to as a "set of gate layout patterns 104") separated from each other in a first direction X. Set of gate layout patterns 104 extends in a second direction Y, and is over an active region layout pattern (not shown). The second direction Y is different from the first direction X. Each of the layout patterns of the set of gate layout patterns 104 is separated from an adjacent layout pattern of the set of gate layout patterns 104 in the first direction X by a pitch P1 (not shown). The set of gate layout patterns 104 is usable to manufacture a corresponding set of gates 202 (shown in FIGS. 2A-2B) of IC structure 200. Set of gate layout patterns 104 is on a first layout level of layout design 100. Other configurations or quantities of gates in the set of gate layout patterns 104 are within the scope of the present disclosure.

Layout design 100 further includes a first conductive structure layout pattern 106 between a set of rail layout patterns 108a, 108b. Each of first conductive structure layout pattern 106 and set of rail layout patterns 108a, 108b extend in the first direction X and are separated from one another in the second direction Y. The first conductive structure layout pattern 106 is usable to manufacture a corresponding first conductive structure 206 (shown in FIGS. 2A-2B) of IC structure 200. The set of rail layout patterns 108a, 108b is usable to manufacture a corresponding set of rails 208a, 208b (shown in FIGS. 2A-2B) of IC structure 200. Rail 208a is configured to supply a first supply voltage VDD, and rail 208b is configured to supply a second supply voltage VSS different from the first supply voltage VDD. In some embodiments, rail 208a is configured to supply the second supply voltage VSS, and rail 208b is configured to supply the first supply voltage VDD.

In some embodiments, a distance D1 (not shown) between the first conductive structure layout pattern 106 and rail layout pattern 108a is the same as a distance D2 (not shown) between the first conductive structure layout pattern 106 and rail layout pattern 108b. In some embodiments, the distance D1 (not shown) between the first conductive structure layout pattern 106 and rail layout pattern 108a is different from the distance D2 (not shown) between the first conductive structure layout pattern 106 and rail layout pattern 108b.

First conductive structure layout pattern 106 or set of rail layout patterns 108a, 108b is on a second layout level of layout design 100. Second layout level of layout design 100 is different from the first layout level. First conductive structure layout pattern 106 overlaps the set of gate layout patterns 104. In some embodiments, rail layout patterns 108a, 108b overlaps the set of gate layout patterns 104. In some embodiments, the second layout level is the metal zero (M0) layer. The first conductive structure layout pattern 106 is on a same layout level as one or more of set of rail layout patterns 108a, 108b. One or more of first conductive structure layout pattern 106 or rail layout patterns 108a, 108b is on a different layout level from the set of gate layout patterns 104. Other configurations or quantities of first conductive structure layout pattern 106 or rails in the set of rail layout patterns 108a, 108b are within the scope of the present disclosure.

Layout design 100 further includes one or more via layout patterns 110a, 110b, . . . , 110l (collectively referred to as "first set of via layout patterns 112"). First set of via layout patterns 112 are usable to manufacture a corresponding first set of vias 212a, 212b, 212c . . . , 212g (shown in FIGS. 2A-2B) of IC structure 200. Each via layout pattern of the first set of via layout patterns 112 is over a corresponding gate layout pattern of the set of gate layout patterns 104. First set of via layout patterns 112 is between the set of gate layout patterns 104 and the first conductive structure layout pattern 106. In some embodiments, each via layout pattern of the first set of via layout patterns 112 is located where the first conductive structure layout pattern 106 overlaps the corresponding gate layout pattern of the set of gate layout patterns 104. In some embodiments, a center of one or more via layout patterns of the first set of via layout patterns 112 is over a center of a corresponding gate layout pattern of the set of gate layout patterns 104. In some embodiments, the center of a via layout pattern of the set of via layout patterns 112 is aligned in the first direction X with another via layout pattern of the first set of via layout patterns 112. First set of via layout patterns 112 is on a via contact (VC) layout level of layout design 100 between the first layout level and the second layout level. Other configurations of the first set of via layout patterns 112 is within the scope of the present disclosure.

Layout design 100 further includes conductive structure layout patterns 114a and 114b (collectively referred to as a "first set of conductive structure layout patterns 114 (not shown)). Each layout pattern of the first set of conductive structure layout patterns 114 (not shown) extends in the second direction Y, and is separated from one another in the first direction X. First set of conductive structure layout patterns 114 (not shown) overlaps first conductive structure layout pattern 106. The conductive structure layout patterns 114a, 114b are usable to manufacture corresponding conductive structures 214a, 214b (shown in FIGS. 2A-2B) of IC structure 200.

Conductive structure layout pattern 114a is positioned between gate layout patterns 102d and 102e. Conductive structure layout pattern 114b is positioned between gate layout patterns 102j and 102k. Conductive structure layout pattern 114a does not overlap gate layout patterns 102d and 102e. Conductive structure layout pattern 114b does not overlap gate layout patterns 102j and 102k. In some embodiments, conductive structure layout pattern 114a overlaps at least gate layout pattern 102d or 102e. In some embodiments, conductive structure layout pattern 114b overlaps at least gate layout pattern 102j or 102k.

In some embodiments, conductive structure layout pattern 114a and 114b each have a same length (not labelled) as the other in the second direction Y. In some embodiments, conductive structure layout pattern 114a and 114b each have a different length (not shown) as the other in the second direction Y. In some embodiments, conductive structure layout pattern 114a and 114b each have a same width (not labelled) as the other in the first direction X. In some embodiments, conductive structure layout pattern 114a and 114b each have a different width (not shown) as the other in the first direction X.

First set of conductive structure layout patterns 114 (not shown) is on a third layout level of layout design 100. Third layout level of layout design 100 is different from the first layout level and the second layout level. In some embodiments, the third layout level is the metal one (M1) layer. Conductive structure layout pattern 114a is on a same layout level as conductive structure layout pattern 114b. Other configurations or quantities of first set of conductive structure layout pattern 114 are within the scope of the present disclosure.

Layout design 100 further includes a set of conductive structure layout patterns 140. Each layout pattern of the set of conductive structure layout patterns 140 extends in the second direction Y, and is separated from one another in the first direction X. Set of conductive structure layout patterns 140 are between first set of via layout patterns 112 and set of gate layout patterns 104. In some embodiments, each conductive structure layout pattern of the set of conductive structure layout patterns 140 is between a corresponding via layout pattern of the first set of via layout patterns 112 and a corresponding gate layout pattern of the set of gate layout patterns 104.

Set of conductive structure layout patterns 140 is placed on a metal over poly (MP) layout level. Set of conductive structure layout patterns 140 includes one or more of conductive structure layout patterns 140a, 140b, . . . , 140g. Set of conductive structure layout patterns 140 are usable to manufacture a corresponding set of contacts 204a, 204b, . . . , 204g (shown in FIGS. 2A-2B) of IC structure 200.

The set of conductive structure layout patterns 140 overlaps the set of gate layout patterns 104. In some embodiments, set of conductive structure layout patterns 140 are not included in layout design 100. Other configurations or quantities of set of conductive structure layout pattern 140 are within the scope of the present disclosure.

Layout design 100 further includes one or more via layout patterns 118a, 118b (collectively referred to as "second set of via layout patterns 118" (not shown)). Second set of via layout patterns 118 are usable to manufacture a corresponding second set of vias 218a and 218b (shown in FIGS. 2A-2B) of IC structure 200. Second set of via layout patterns 118 (not shown) is between the first set of conductive structure layout patterns 114 and the first conductive structure layout pattern 106. Each via layout pattern 118a, 118b of the second set of via layout patterns 118 (not shown) is over a corresponding layout pattern 114a, 114b of the first set of conductive structure layout patterns 114 (not shown). In some embodiments, each via layout pattern 118a, 118b of the second set of via layout patterns 118 is located where the corresponding layout pattern 114a, 114b of the first set of conductive structure layout patterns 114 (not shown) overlaps the conductive structure layout pattern 106.

In some embodiments, a center of one or more via layout patterns 118a, 118b of the second set of via layout patterns 118 is over a center of a corresponding layout pattern 114a, 114b of the first set of conductive structure layout patterns 114 (not shown). In some embodiments, the center of a via layout pattern of the second set of via layout patterns 118 (not shown) is aligned in the first direction X or the second direction Y with a center of a layout pattern of the first set of conductive structure layout patterns 114 (not shown). Second set of via layout patterns 118 (not shown) is on a layout level (V0) of layout design 100 between the second layout level and the third layout level. Other configurations of the second set of via layout patterns 118 (not shown) is within the scope of the present disclosure.

Layout design 100 further includes a second conductive structure layout pattern 122. Second conductive structure layout pattern 122 extends in the first direction X and is between the set of rail layout patterns 108a, 108b. The second conductive structure layout pattern 122 is usable to manufacture a corresponding second conductive structure 222 (shown in FIGS. 2A-2B) of IC structure 200. In some embodiments, a distance D1' (not shown) between the second conductive structure layout pattern 122 and rail layout pattern 108a is the same as a distance D2' (not shown) between the second conductive structure layout pattern 122 and rail layout pattern 108b. In some embodiments, the distance D1' (not shown) between the second conductive structure layout pattern 122 and rail layout pattern 108a is different from the distance D2' (not shown) between the second conductive structure layout pattern 122 and rail layout pattern 108b.

In some embodiments, each of first conductive structure layout pattern 106 and second conductive structure layout pattern 122 have a different length (not shown) in the first direction X from each other. In some embodiments, each of first conductive structure layout pattern 106 and second conductive structure layout pattern 122 have a same length (not shown) in the first direction X from each other.

In some embodiments, each of first conductive structure layout pattern 106 and second conductive structure layout pattern 122 have a different width (not shown) in the second direction Y from each other. In some embodiments, each of first conductive structure layout pattern 106 and second conductive structure layout pattern 122 have a same width (not shown) in the second direction Y from each other.

Second conductive structure layout pattern 122 is on a fourth layout level of layout design 100. Fourth layout level of layout design 100 is different from the first layout level, the second layout level and the third layout level. In some embodiments, the fourth layout level is the metal two (M2) layer. Second conductive structure layout pattern 122 overlaps the set of gate layout patterns 104 and in the first set conductive structure layout patterns 116 (not shown). Other configurations or quantities of second conductive structure layout pattern 122 is within the scope of the present disclosure.

Layout design 100 further includes one or more via layout patterns 124a, 124b (collectively referred to as "third set of via layout patterns 124" (not shown)). Third set of via layout patterns 124 are usable to manufacture a corresponding third set of vias 224a and 224b (shown in FIGS. 2A-2B) of IC structure 200. Third set of via layout patterns 124 (not shown) is between the first set of conductive structure layout patterns 114 and the second conductive structure layout pattern 122. Each via layout pattern 124a, 124b of the third set of via layout patterns 124 (not shown) is over a corresponding layout pattern 114a, 114b of the first set of conductive structure layout patterns 114 (not shown). In some embodiments, each via layout pattern 124a, 124b of the third set of via layout patterns 124 is located where the second conductive structure layout pattern 122 overlaps the corresponding layout pattern 114a, 114b of the first set of conductive structure layout patterns 114 (not shown).

In some embodiments, a center of one or more via layout patterns 124a, 124b of the third set of via layout patterns 124 is over a center of a corresponding layout pattern 114a, 114b of the first set of conductive structure layout patterns 114 (not shown). In some embodiments, a center of via layout pattern 124a, 124b of the third set of via layout patterns 124 is aligned in the first direction X or the second direction Y with a center of a corresponding via layout pattern 118a, 18b of the second set of via layout patterns 118 (not shown). Third set of via layout patterns 124 (not shown) is on a layout level (V1) of layout design 100 between the third layout level and the fourth layout level. Other configurations of the third set of via layout patterns 124 (not shown) is within the scope of the present disclosure.

Layout design 100 further includes conductive structure layout patterns 128a and 128b (collectively referred to as a "second set of conductive structure layout patterns 128 (not shown).) Each layout pattern of the second set of conductive structure layout patterns 128 (not shown) extends in the second direction Y, and is separated from one another in the first direction X. Second set of conductive structure layout patterns 128 (not shown) overlaps second conductive structure layout pattern 122. The conductive structure layout patterns 128a, 128b are usable to manufacture corresponding conductive structures 228a, 228b (shown in FIGS. 2A-2B) of IC structure 200.

Conductive structure layout pattern 128a is positioned between gate layout patterns 102d and 102e. Conductive structure layout pattern 128b is positioned between gate layout patterns 102j and 102k. Conductive structure layout pattern 128a does not overlap gate layout patterns 102d and 102e. Conductive structure layout pattern 128b does not overlap gate layout patterns 102j and 102k. In some embodiments, conductive structure layout pattern 128a overlaps at least gate layout pattern 102d or 102e. In some embodiments, conductive structure layout pattern 128b overlaps at least gate layout pattern 102j or 102k.

In some embodiments, at least two of conductive structure layout patterns 114a, 114b, 128a and 128b have a same length (not shown) in the second direction Y. In some embodiments, at least two of conductive structure layout pattern 114a, 114b, 128a and 128b have a different length (not shown) in the second direction Y. In some embodiments, at least two of conductive structure layout pattern 114a, 114b, 128a and 128b have a same width (not shown) in the first direction X. In some embodiments, at least two of conductive structure layout pattern 114a, 114b, 128a and 128b have a different width (not shown) in the first direction X.

Second set of conductive structure layout patterns 128 (not shown) is on a fifth layout level of layout design 100. Fifth layout level of layout design 100 is different from the first layout level, the second layout level, the third layout level and the fourth layout level. In some embodiments, the fifth layout level is the metal three (M3) layer. Conductive structure layout pattern 128a is on a same layout level as conductive structure layout pattern 128b. Other configurations or quantities of the second set of conductive structure layout pattern 128 are within the scope of the present disclosure.

Layout design 100 further includes one or more via layout patterns 130a, 130b (collectively referred to as "fourth set of via layout patterns 130" (not shown)). Fourth set of via layout patterns 130 are usable to manufacture a corresponding fourth set of vias 230a and 230b (shown in FIGS. 2A-2B) of IC structure 200. Fourth set of via layout patterns 130 (not shown) is between the second conductive structure layout pattern 122 and the second set of conductive structure layout patterns 122.

Each via layout pattern 130a, 130b of the fourth set of via layout patterns 130 (not shown) is below a corresponding layout pattern 128a, 128b of the second set of conductive structure layout patterns 128 (not shown). Each via layout pattern 130a, 130b of the fourth set of via layout patterns 130 (not shown) is over a corresponding layout pattern 114a, 114b of the first set of conductive structure layout patterns 114 (not shown). In some embodiments, each via layout pattern 130a, 130b of the fourth set of via layout patterns 130 is located where the corresponding layout pattern 128a, 128b of the second set of conductive structure layout patterns 128 (not shown) overlaps the second conductive structure layout pattern 122.

In some embodiments, a center of via layout pattern 130a is aligned in the first direction X with a center of via layout pattern 130b. In some embodiments, a center of via layout pattern 130a, 130b of the fourth set of via layout patterns 130 is aligned in the first direction X or the second direction Y with a center of a corresponding via layout pattern 118a, 118b of the second set of via layout patterns 118 (not shown) or a center of a corresponding via layout pattern 124a, 124b of the third set of via layout patterns 124 (not shown). Fourth set of via layout patterns 130 (not shown) is on a layout level (V2) of layout design 100 between the fourth layout level and the fifth layout level. Other configurations of the fourth set of via layout patterns 130 (not shown) is within the scope of the present disclosure.

In some embodiments, a center of one or more via layout patterns of the set of via layout patterns 118, 124 or 130 is aligned in the first direction X and the second direction Y with a center of another layout pattern of the set of via layout patterns 118, 124 or 130. In some embodiments, the set of via layout patterns 118, 124, 130 are referred to as a stacked via configuration since the center of each via is aligned in the first direction X and the second direction Y with a center of at least another via layout pattern of the set of via layout patterns 118, 124, 130 on another layer. In some embodiments, by using a stacked via configuration, resistance of an IC structure (e.g., IC structure 200) manufactured using layout design 100 is reduced compared with other approaches.

In some embodiments, by utilizing at least conductive structure layout patterns 106, 114a, 114b, 122, 128a or 128b and via layout patterns 112, 118a, 118b, 124a, 124b, 130a, 130b yields a metal mesh structure (e.g., integrated circuit 200) configured as a dual-input pin. In some embodiments, the first conductive structure layout pattern 106 of the M0 layer occupies one M0 routing track and the second conductive structure layout pattern 122 of the M2 layer occupies one M2 routing track.

In some embodiments, by utilizing layout design 100, the number of via layout patterns (e.g., set of via layout patterns 112, 118, 124 and 130) is increased, resulting in more connections between underlying and overlying conductive feature layout patterns (e.g., metal layers M0, M1, M2, M3 or the like), yielding lower resistance than other approaches. In some embodiments, the second set of via layout patterns 118, third set of via layout patterns 130 and fourth set of via layout patterns 130 are aligned in a stacked via configuration, yielding lower resistance. In some embodiments, each of second set of via layout patterns 118, third set of via layout patterns 130 and fourth set of via layout patterns 130 has 2 square via layout patterns.

In some embodiments, the first set of conductive structure layout patterns 114 of the M1 layer and the second set of conductive structure layout patterns 128 of the M3 layer are aligned, yielding lower resistance than other approaches. In some embodiments, the first set of conductive structure layout patterns 114 of the M1 layer and the second set of conductive structure layout patterns 128 of the M3 layer use two or more one width (1W) M1 or two M3 routing tracks yielding lower resistance than other approaches. In some embodiments, as the number of via layout patterns in each of the second set of via layout patterns 118, third set of via layout patterns 124 and the fourth set of via layout patterns 130 increases and the number of conductive structure layout patterns in the first set of conductive structure layout patterns 114 and the second set of conductive structure layout patterns 128 increases, more input pins are provided in layout design 100 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 100 having better speed performance than other approaches.

In some embodiments, as the number of via layout patterns in each of the second set of via layout patterns 118, third set of via layout patterns 130 and the fourth set of via layout patterns 130 increases, the resistance of the corresponding layout design is further reduced. In some embodiments, one or more of layout designs 100 or 300-1100, 1300-1900 or 2300A-2300D or 2500A-2700D of FIG. 1, 3-11, 13-19 or 23A-23D or 25A-27D has at least the same direct current (DC) electromigration (EM) performance, root mean square (RMS) EM performance or peak EM performance as other approaches. In some embodiments, one or more of layout designs 100 or 300-1100, 1300-1900 or 2300A-2300D or 2500A-2700D of FIG. 1, 3-11, 13-19 or 23A-23D or 25A-27D results in an 87.5% improvement in timing compared with other approaches. In some embodiments, one or more of layout designs 100 or 300-1100, 1300-1900 or 2300A-2300D or 2500A-2700D of FIG. 1, 3-11, 13-19 or 23A-23D or 25A-27D are constructed within the cell boundary and does not result in an increase in the area of the corresponding layout design compared with other approaches.

In some embodiments, layout design 100 is a standard cell 101 of an IC structure. Standard cell 101 or standard cell 1101 (shown in FIG. 11) has a width (not shown) in first direction X, and a height H1 in second direction Y. In some embodiments, standard cell 101 or standard cell 1101 (shown in FIG. 11) is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM) read only memory (ROM), or the like. In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors, or the like. Standard cell 101 or standard cell 1101 (shown in FIG. 11) includes other features not shown for ease of illustration.

Figure 2B:
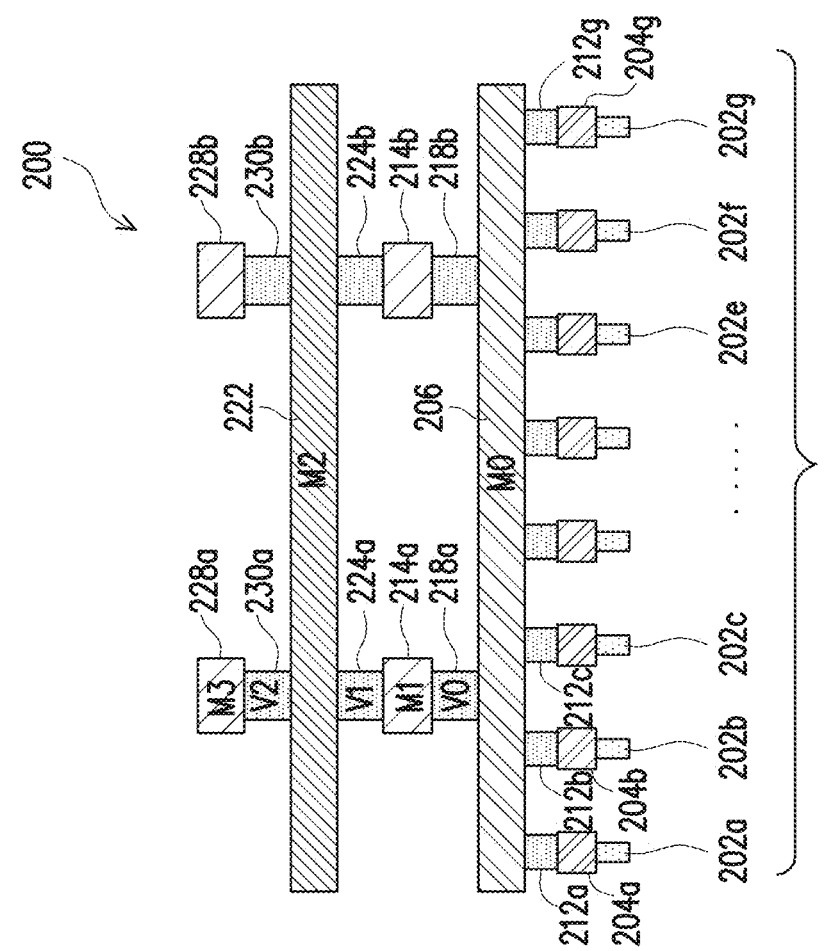
FIGS. 2A and 2B are diagrams of an IC structure, in accordance with some embodiments.
Figure 2A:
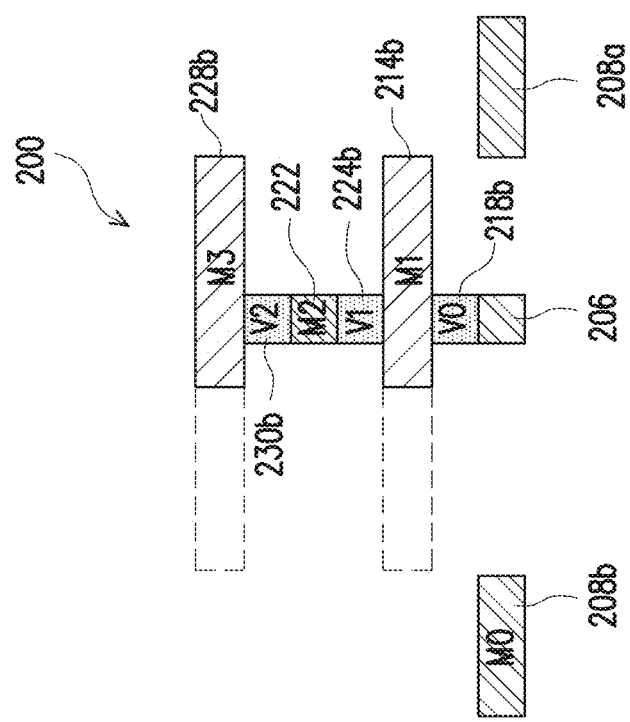

FIGS. 2A and 2B are diagrams of an IC structure 200, in accordance with some embodiments. FIG. 2A is a cross-sectional view of IC structure 200 corresponding to layout design 100 as intersected by plane A-A', and FIG. 2B is a cross-sectional view of IC structure 200 corresponding to layout design 100 as intersected by plane B-B', in accordance with some embodiments. IC structure 200 is manufactured by layout design 100.

Structural relationships including alignment, lengths and widths, as well as configurations of IC structure 200 are similar to the structural relationships and configurations of layout design 100 of FIG. 1, and will not be described in FIGS. 2A-2B for brevity.

IC structure 200 includes a set of gates 202 on a first level of IC structure 200. Each gate of the set of gates 202 being separated from one another in the first direction X, and extending in the second direction Y. In some embodiments, one or more gates of the set of gates 202 is part of one or more transistor devices (not shown).

Other quantities of gates or configurations of set of gates 202 are within the scope of the present disclosure.

IC structure 200 further includes a first conductive structure 206 extending in the first direction X and overlapping the set of gates 202.

IC structure 200 further includes a set of rails 208a, 208b extending in the first direction X and overlapping the set of gates 202. First conductive structure 206 is between the set of rails 208a, 208b. First conductive structure 206 and set of rails 208a, 208b are on a second level of IC structure 200. One or more of first conductive structure 206 or set of rails 208a, 208b is on a second level (M0) of IC structure 200. The second level of IC structure 200 is above the first level of IC structure 200. Other quantities of gates or configurations of first conductive structure 206 or set of rails 208a, 208b are within the scope of the present disclosure.

In some embodiments, the set of rails 208a, 208b is configured to provide the first supply voltage VDD or the second supply voltage VSS to IC structure 200. In some embodiments, the set of rails 208a, 208b are electrically coupled to first conductive structure 206 (not shown).

IC structure 200 further includes one or more contacts 204a, 204b, 204c, 204d, 204e, 204f, 204g (collectively referred to as "a set of contacts 204"). Each contact of the set of contacts 204 is over a corresponding gate of the set of gates 202. Each contact of the set of contacts 204 is electrically coupled to a corresponding gate of the set of gates 202. In some embodiments, IC structure 200 does not include the set of contacts 204. One or more contacts of the set of contacts 204 is on a metal over poly level (MP) of IC structure 200. The MP level of IC structure 200 is above the first level of IC structure 200. In some embodiments, set of contacts 204 are not included in IC structure 200, and the first set of vias 212 is coupled to the set of gates 202. Other quantities of contacts or configurations of the set of contacts 204 are within the scope of the present disclosure.

IC structure 200 further includes one or more vias 212a, 212b, ..., 212g (collectively referred to as "a first set of vias 212") between the set of gate structures 202 and the first conductive structure 206. Each via of the first set of vias 212 is over a corresponding gate of the set of gates 202. Each via of the first set of vias 212 being located where the first conductive structure 206 overlaps each gate of the set of gates 202. The first set of vias 212 electrically couple the set of gates 202 to the first conductive structure 206. Each via of the set of vias 212 is electrically coupled to a corresponding gate of the set of gates 202.

One or more vias of the set of vias 212 is on a via contact (VC layer) level of IC structure 200. The VC level of IC structure 200 is above the first level of IC structure 200. Other quantities of vias or configurations of first set of vias 212 are within the scope of the present disclosure.

IC structure 200 further includes a first set of conductive structures 214 extending in the second direction Y and overlapping the first conductive structure 206. First set of conductive structures includes conductive structures 214a and 214b. Each conductive structure 214a, 214b of the first set of conductive structures is separated from each other in the first direction X, and is positioned between a pair of gates of the set of gate 202. For example, conductive structure 214a is positioned between gate 202b and 202c. Similarly, conductive structure 214b is positioned between gate 202e and 202f.

One or more of conductive structure of the first set of conductive structures 214a, 214b is on a third level (M1) of IC structure 200. The third level of IC structure 200 is above the first level and the second level of IC structure 200. Other quantities of conductive structures or configurations of first set of conductive structures 214a, 214b are within the scope of the present disclosure.

IC structure 200 further includes a second set of vias 218a and 218b between the first set of conductive structures 214a, 214b and the first conductive structure 206. Each via of the second set of vias 218a, 218b is below a corresponding conductive structure of the first set of conductive structures 214a, 214b. Each via of the second set of vias 218a, 218b being located where the first set of conductive structures 214a, 214b overlaps the first conductive structure 206. The second set of vias 218a, 218b electrically couple the first set of conductive structures 214a, 214b to the first conductive structure 206.

The first set of conductive structures 214a, 214b is electrically coupled to one or more gates of the set of gates 202 by at least one or more vias of the set of vias 218a, 218b. One or more vias of second set of vias 218a, 218b is on a V0 level of IC structure 200. The V0 level of IC structure 200 is above the first level and second level of IC structure 200. Other quantities of vias or configurations of second set of vias 218a, 218b are within the scope of the present disclosure.

IC structure 200 further includes a second conductive structure 222 extending in the first direction X, and overlapping the first set of conductive structures 214a, 214b. Second conductive structure 222 is between the set of rails 208a, 208b. In some embodiments, second conductive structure 222 covers the first conductive structure 206. In some embodiments, a side of the second conductive structure 222 is aligned with a side of the first conductive structure 206 in at least the first direction X or the second direction Y.

Conductive structure 222 is on a fourth level (M2) of IC structure 200. The fourth level of IC structure 200 is above the first level, the second level and the third level of IC structure 200. Other quantities or configurations of conductive structure 222 are within the scope of the present disclosure.

IC structure 200 further includes a third set of vias 224a and 224b between the second conductive structure 222 and the first set of conductive structures 214a, 214b. Each via of the third set of vias 224a, 224b is above a corresponding conductive structure of the first set of conductive structures 214a, 214b.

Each via of the third set of vias 224a, 224b being located where the second conductive structure 222 overlaps the first set of conductive structures 214a, 214b. The third set of vias 224a, 224b electrically couple the second conductive structure 222 to the first set of conductive structures 214a, 214b. One or more vias of third set of vias 224a, 224b is on a V1 level of IC structure 200. The V1 level of IC structure 200 is above the first level, the second level and the third level of IC structure 200. Other quantities of vias or configurations of third set of vias 224a, 224b are within the scope of the present disclosure.

IC structure 200 further includes a second set of conductive structures 228 extending in the second direction Y, and overlapping the second conductive structure 222 and the first conductive structure 206. Second set of conductive structures includes conductive structures 228a and 228b.

Each conductive structure 228a, 228b of the second set of conductive structures is separated from each other in the first direction X, and is positioned between a pair of gates of the set of gates 202. For example, conductive structure 228a is positioned between gate 202b and 202c. Similarly, conductive structure 228b is positioned between gate 202e and 202f.

In some embodiments, a conductive structure 228a, 228b of the second set of conductive structures 228 covers a corresponding conductive structure 214a, 214b of the first set of conductive structures 214. In some embodiments, a side of a conductive structure 228a, 228b of the second set of conductive structures 228 is aligned with a side of a corresponding conductive structure 214a, 214b of the first set of conductive structures 214 in at least the first direction X or the second direction Y.

In some embodiments, at least two of conductive structures 214a, 214b, 228a and 228b have a same length (not shown) in the second direction Y. In some embodiments, at least two of conductive structures 214a, 214b, 228a and 228b have a different length (not shown) in the second direction Y. In some embodiments, at least two of conductive structures 214a, 214b, 228a and 228b have a same width (not shown) in the first direction X. In some embodiments, at least two of conductive structures 214a, 214b, 228a and 228b have a different width (not shown) in the first direction X.

One or more conductive structure of the second set of conductive structures 228a, 228b is on a fifth level (M3) of IC structure 200. The fifth level of IC structure 200 is above the first level, the second level, the third level and the fourth level of IC structure 200. Other quantities of conductive structures or configurations of second set of conductive structures 228a, 228b are within the scope of the present disclosure.

IC structure 200 further includes a fourth set of vias 230a and 230b between the second set of conductive structures 228a, 228b and the second conductive structure 222. Each via of the fourth set of vias 230a, 230b is below a corresponding conductive structure of the second set of conductive structures 228a, 228b. Each via of the fourth set of vias 230a, 230b being located where the second set of conductive structures 228a, 228b overlaps the second conductive structure 222. The fourth set of vias 230a, 230b electrically couple the second set of conductive structures 228a, 228b to the second conductive structure 222.

One or more vias of fourth set of vias 230a, 230b is on a V2 level of IC structure 200. The V2 level of IC structure 200 is above the first level, the second level, the third level and the fourth level of IC structure 200. Other quantities of vias or configurations of fourth set of vias 230a, 230b are within the scope of the present disclosure.

M0 is separated from set of gates 202 by VC. In some embodiments M0 is separated from set of gates 202 by VC and MP. In some embodiments, one or more metal layers (not shown) separate set of gates 202, VC, MP or M0. M1 is separated from M0 by V0. In some embodiments, one or more metal layers (not shown) separate M0 and M1. M2 is separated from M1 by V1. In some embodiments, one or more metal layers (not shown) separate M1 and M2. M3 is separated from M2 by V2. In some embodiments, one or more metal layers (not shown) separate M2 and M3. In some embodiments, each of the conductive structures of IC structure 200, 1200 located in M0 or M3 extend in the same direction. In some embodiments, each of the conductive structures of IC structure 200, 1200 located in M1 or M2 extend in the same direction. Other configurations of via layers or metal layers are within the scope of the present disclosure.

In some embodiments, one or more of the first conductive structure 206, the first set of vias 212, the first set of conductive structures 214, the second set of vias 218, the second conductive structure 222, the third set of vias 224, the second set of conductive structures 228 and the fourth set of vias 230 are referred to as an input pin. In some embodiments, the input pin is electrically coupled to an input side of one or more transistor devices (not shown). In some embodiments, one or more gates of the set of gates 202 corresponds to the input side of the one or more transistor devices (not shown). In some embodiments, the input pin is also referred to as a metal mesh structure. In some embodiments, the input pin is configured to provide the first supply voltage VDD or the second supply voltage VSS the set of gates 202. In some embodiments, input pin of IC structure 200 is known as a dual-input pin because the first set of conductive structures 114 or the second set of conductive structures 228 has two conductive structures (e.g., conductive structures 214a, 214b or conductive structures 228a, 228b). In some embodiments, the locations of elements in IC structure 200 are adjustable to be in other positions, and the number of elements in IC structure 200 are adjustable to be other numbers. Other configurations, locations or number of elements in IC structure 200 of FIG. 2 are within the scope of the present disclosure.

In some embodiments, a center of one or more vias of the set of vias 218, 224 or 230 is aligned in the first direction X and the second direction Y with a center of a via of the set of vias 218, 224 or 230. In some embodiments, by using a stacked via configuration, resistance of an IC structure (e.g., IC structure 200) manufactured using layout design 100 is reduced compared with other approaches.

In some embodiments, by utilizing at least conductive structures 206, 214a, 214b, 222, 228a or 228b and vias 218a, 218b, 224a, 224b, 230a, 230b yields a metal mesh structure (e.g., integrated circuit 200) configured as a dual-input pin. In some embodiments, the first conductive structure 206 of the M0 layer occupies one M0 routing track and the second conductive structure 222 of the M2 layer occupies one M2 routing track.

In some embodiments, by utilizing integrated circuit 200, the number of vias (e.g., vias 212a, . . . , 212g, 218a, 218b, 224a, 224b, 230a and 230b) is increased, yielding lower resistance than other approaches. In some embodiments, vias 218a, 224a, 230a, and vias 218b, 224b and 230b are aligned in separate stacked via configurations, yielding lower resistance than other approaches. In some embodiments, each of vias 218a, 224a, 230a, and vias 218b, 224b and 230b is a square via.

In some embodiments, conductive structure 214a, 214b of the M1 layer and corresponding conductive structure 228a, 228b of the M3 layer are aligned, yielding lower resistance than other approaches. In some embodiments, conductive structure 214a, 214b of the M1 layer use two or more 1W M1 routing tracks and conductive structure 228a, 228b of the M3 layer use two M3 routing tracks yielding lower resistance than other approaches. In some embodiments, as the number of vias 218a, 218b, 224a, 224b, 230a and 230b increases and the number of conductive structures 214a, 214b, 222, 228a and 228b increases, more input pins are provided in integrated circuit 200 resulting in more current paths between underlying and overlying conductive structures (e.g., metal layer M0, M1, M2, M3, or the like). In some embodiments, as the number of current paths increases, the distance of each corresponding current path is reduced resulting in integrated circuit 200 having better speed performance than other approaches.

In some embodiments, as the number of vias 218a, 218b, 224a, 224b, 230a and 230b increases, the resistance of the corresponding integrated circuit is further reduced. In some embodiments, one or more of integrated circuits 200, 1200 or 2400 of FIG. 2, 12 or 24 has at least the same DC EM performance, RMS EM performance or peak EM performance as other approaches. In some embodiments, one or more of integrated circuits 200, 1200 or 2400 of FIG. 2, 12 or 24 results in an 87.5% improvement in timing compared with other approaches.

Figure 3:
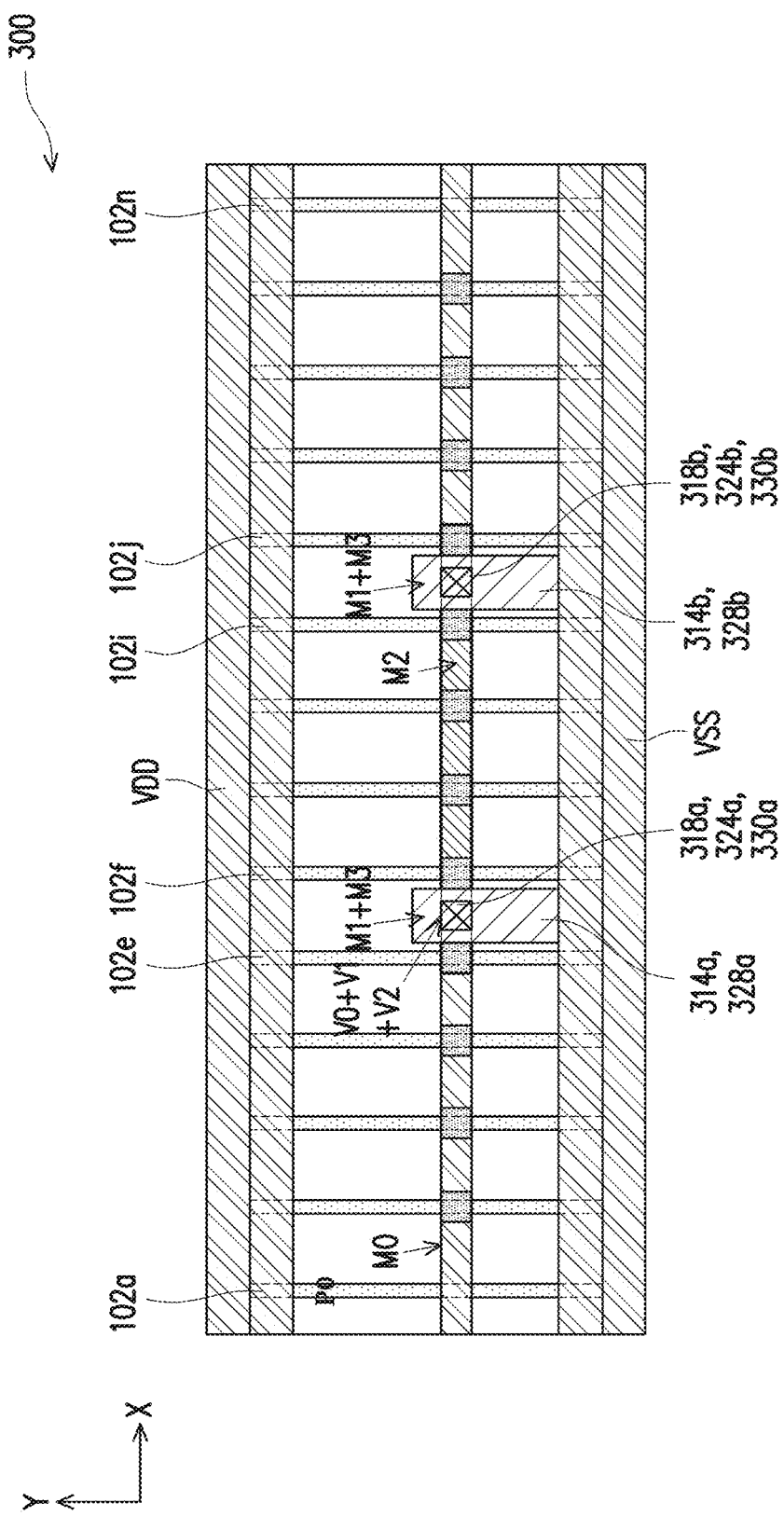
FIG. 3 is a diagram of a layout design, in accordance with some embodiments.

FIG. 3 is a diagram of a layout design 300 of an IC structure, in accordance with some embodiments. Components that are the same or similar to those in one or more of FIGS. 1, 3-10 (shown below), 11-19 (shown below), and 20A-30 (shown below) are given the same reference numbers, and detailed description thereof is thus omitted.

Layout design 300 is a variation of layout design 100 of FIG. 1. In some embodiments, layout design 300 corresponds to a layout design of a dual-input pin having a first pin (e.g., conductive structure layout patterns 314a, 328a) and a second pin (e.g., conductive structure layout patterns 314b, 328b). In some embodiments, layout design 300 illustrates that the locations of elements in the dual-input pin are adjustable to be in other positions, and the number of elements in the dual-input pin are adjustable to be other numbers. Other configurations, locations or number of elements in layout design 300 of FIG. 3 are within the scope of the present disclosure.

In comparison with layout design 100 of FIG. 1, conductive structure layout patterns 314a, 328a, 314b, 328b of layout design 300 replaces corresponding conductive structure layout patterns 114a, 128a, 114b and 128b. In comparison with layout design 100 of FIG. 1, via layout patterns 318a, 324a, 330a, 318b, 324b and 330b of layout design 300 replaces corresponding via layout patterns 118a, 124a, 130a, 118b, 124b and 130b.

Conductive structure layout patterns 314a, 328a, 314b, 328b are similar to corresponding conductive structure layout patterns 114a, 128a, 114b and 128b, and similar detailed description of these layout patterns is therefore omitted. Via layout patterns 318a, 324a, 330a, 318b, 324b and 330b are similar to corresponding via layout patterns 118a, 124a, 130a, 118b, 124b and 130b, and similar detailed description of these layout patterns is therefore omitted.

Conductive structure layout patterns 314a and 328a, and via layout patterns 318a, 324a and 330a are positioned between gate layout patterns 102e and 102f. Conductive structure layout patterns 314b and 328b, and via layout patterns 318b, 324b and 330b are positioned between gate layout patterns 102i and 102j. Other configurations of via layout patterns or conductive structure layout patterns of FIGS. 3-10 are within the scope of the present disclosure.

In some embodiments, by utilizing layout design 300 yields a metal mesh structure configured as a dual-input pin. In some embodiments, by utilizing layout design 300, the number of via layout patterns (e.g., via layout patterns 112, 318a, 318b, 324a, 324b, 330a and 330b) is increased resulting in more connections between underlying and overlying conductive feature layout patterns (e.g., metal layers M0, M1, M2, M3 or the like), yielding lower resistance than other approaches. In some embodiments, via layout patterns 318a, 324a and 330a are aligned in a stacked via configuration, yielding lower resistance than other approaches. In some embodiments, via layout patterns 318b, 324b and 330b are aligned in a stacked via configuration, yielding lower resistance than other approaches. In some embodiments, one or more of via layout patterns via layout patterns 112, 318a, 318b, 324a, 324b, 330a and 330b is a square via layout pattern. In some embodiments, conductive structure layout patterns 314a, 314b of the M1 layer and corresponding conductive structure layout patterns 328a, 328b of the M3 layer are aligned, yielding lower resistance than other approaches. In some embodiments, conductive structure layout patterns 314a, 314b of the M1 layer each use 1W routing track, and conductive structure layout patterns 328a, 328b of the M3 layer each use one M3 routing track yielding lower resistance than other approaches. In some embodiments, as the number of via layout patterns 318a, 318b, 324a, 324b, 330a and 330b increases and the number of conductive structure layout patterns 314a, 314b, 328a, 328b increases, more input pins are provided in layout design 300 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 300 having better speed performance than other approaches.

Figure 4:
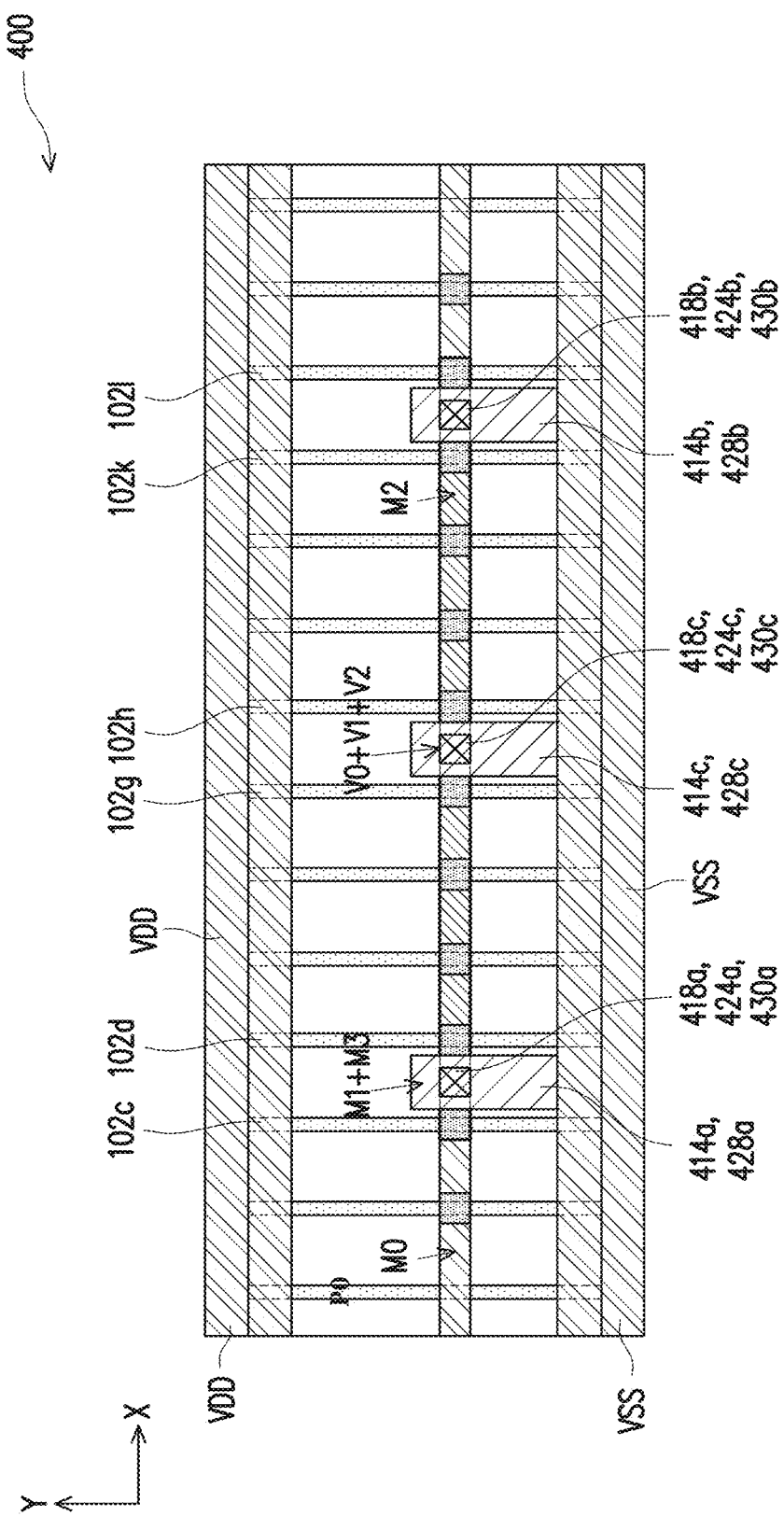
FIG. 4 is a diagram of a layout design of an IC structure, in accordance with some embodiments.

FIG. 4 is a diagram of a layout design 400 of an IC structure, in accordance with some embodiments.

Layout design 400 is a variation of layout design 100 of FIG. 1. In some embodiments, layout design 400 corresponds to a layout design of a triple-input pin having a first pin (e.g., conductive structure layout patterns 414a, 428a), a second pin (e.g., conductive structure layout patterns 414b, 428b) and a third pin (e.g., conductive structure layout patterns 414c, 428c). In some embodiments, layout design 400 illustrates that the locations of elements in the triple-input pin are adjustable to be in other positions, and the number of elements in the triple-input pin are adjustable to be other numbers. Other configurations, locations or number of elements in layout design 400 of FIG. 4 are within the scope of the present disclosure.

In comparison with layout design 100 of FIG. 1, conductive structure layout patterns 414a, 428a, 414b, 428b of layout design 400 replace corresponding conductive structure layout patterns 114a, 128a, 114b and 128b. In comparison with layout design 100 of FIG. 1, via layout patterns 418a, 424a, 430a, 418b, 424b and 430b of layout design 400 replace corresponding via layout patterns 118a, 124a, 130a, 118b, 124b and 130b. In comparison with layout design 100 of FIG. 1, layout design 400 of FIG. 4 further includes conductive structure layout patterns 414c and 428c, and via layout patterns 418c, 424c and 430c.

Conductive structure layout patterns 414a, 428a, 414b, 428b are similar to corresponding conductive structure layout patterns 114a, 128a, 114b and 128b, and similar detailed description of these layout patterns is therefore omitted. Via layout patterns 418a, 424a, 430a, 418b, 424b and 430b are similar to corresponding via layout patterns 118a, 124a, 130a, 118b, 124b and 130b, and similar detailed description of these layout patterns is therefore omitted. Conductive structure layout patterns 414c and 428c are similar to corresponding conductive structure layout patterns 114a and 128a, and similar detailed description of these layout patterns is therefore omitted. Via layout patterns 418c, 424c and 430c are similar to corresponding via layout patterns 118a, 124a and 130a, and similar detailed description of these layout patterns is therefore omitted.

Conductive structure layout patterns 414a and 428a, and via layout patterns 418a, 424a and 430a are positioned between gate layout patterns 102c and 102d. Conductive structure layout patterns 414b and 428b, and via layout patterns 418b, 424b and 430b are positioned between gate layout patterns 102k and 102l. Conductive structure layout patterns 414c and 428c, and via layout patterns 418c, 424c and 430c are positioned between gate layout patterns 102g and 102h.

In some embodiments, by utilizing layout design 400 yields a metal mesh structure configured as a triple-input pin. In some embodiments, by utilizing layout design 400, the number of via layout patterns (e.g., via layout patterns 112, 418a, 418b, 418c, 424a, 424b, 424c, 430a, 430b and 430c) is increased, resulting in more connections between underlying and overlying conductive feature layout patterns (e.g., metal layers M0, M1, M2, M3 or the like), yielding lower resistance than other approaches. In some embodiments, via layout patterns 418a, 424a and 430a are aligned in a stacked via configuration, yielding lower resistance than other approaches. In some embodiments, via layout patterns 418*b*, 424*b* and 430*b* are aligned in a stacked via configuration, yielding lower resistance than other approaches. In some embodiments, via layout patterns 418*c*, 424*c* and 430*c* are aligned in a stacked via configuration, yielding lower resistance than other approaches. In some embodiments, one or more of via layout patterns via layout patterns 112, 418*a*, 418*b*, 418*c*, 424*a*, 424*b*, 424*c*, 430*a*, 430*b* and 430*c* is a square via layout pattern. In some embodiments, conductive structure layout patterns 414*a*, 414*b*, 414*c* of the M1 layer and corresponding conductive structure layout patterns 428*a*, 428*b*, 428*c* of the M3 layer are aligned, yielding lower resistance than other approaches. In some embodiments, conductive structure layout patterns 414*a*, 414*b*, 414*c* of the M1 layer each use 1W routing track, and conductive structure layout patterns 428*a*, 428*b*, 428*c* of the M3 layer each use one M3 routing track yielding lower resistance than other approaches. In some embodiments, as the number of via layout patterns 418*a*, 418*b*, 418*c*, 424*a*, 424*b*, 424*c*, 430*a*, 430*b*, 430*c* increases and the number of conductive structure layout patterns 414*a*, 414*b*, 414*c*, 428*a*, 428*b*, 428*c* increases, more input pins are provided in layout design 400 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 400 having better speed performance than other approaches.

Figure 5:
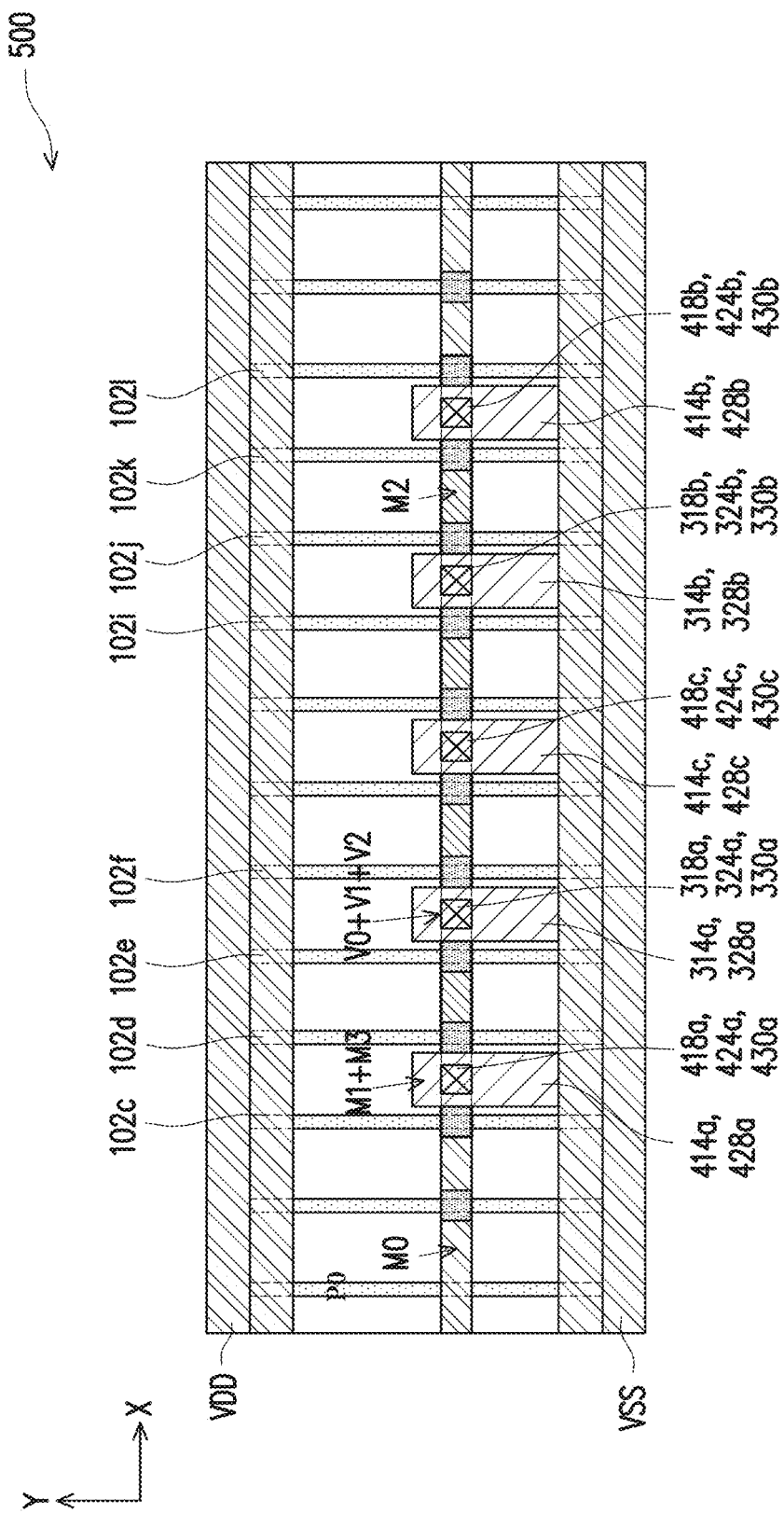
FIG. 5 is a diagram of a layout design of an IC structure, in accordance with some embodiments.

FIG. 5 is a diagram of a layout design 500 of an IC structure, in accordance with some embodiments.

Layout design 500 is a variation of layout design 300 of FIG. 3 and layout design 400 of FIG. 4. In some embodiments, layout design 500 corresponds to a layout design of a penta-input pin having a first pin (e.g., conductive structure layout patterns 414*a*, 428*a*), a second pin (e.g., conductive structure layout patterns 414*b*, 428*b*), a third pin (e.g., conductive structure layout patterns 414*c*, 428*c*), a fourth pin (e.g., conductive structure layout patterns 314*a*, 328*a*), a and a fifth pin (e.g., conductive structure layout patterns 314*b*, 328*b*). In some embodiments, layout design 500 illustrates that the locations of elements in the penta-input pin are adjustable to be in other positions, and the number of elements in the penta-input pin are adjustable to be other numbers. Other configurations, locations or number of elements in layout design 500 of FIG. 5 are within the scope of the present disclosure.

Layout design 500 combines layout design 300 and layout design 400. For example, layout design 500 includes five M1 conductive structure layout patterns (e.g., conductive structure layout patterns 314*a*, 314*b*, 414*a*, 414*b* and 414*c*), five M3 conductive structure layout patterns (e.g., conductive structure layout patterns 328*a*, 328*b*, 428*a*, 428*b* and 428*c*), five V0 via layout patterns (e.g., via layout patterns 318*a*, 318*b*, 418*a*, 418*b* and 418*c*), five V1 via layout patterns (e.g., via layout patterns 324*a*, 324*b*, 424*a*, 424*b* and 424*c*), and five V2 via layout patterns (e.g., via layout patterns 330*a*, 330*b*, 430*a*, 430*b* and 430*c*).

In some embodiments, by utilizing layout design 500 yields a metal mesh structure configured as a penta-input pin. In some embodiments, by utilizing layout design 500, the number of via layout patterns (e.g., via layout patterns 112, 318*a*, 318*b*, 418*a*, 418*b*, 418*c*, 324*a*, 324*b*, 424*a*, 424*b*, 424*c*, 330*a*, 330*b*, 430*a*, 430*b* and 430*c*) is increased, resulting in more connections between underlying and overlying conductive feature layout patterns (e.g., metal layers M0, M1, M2, M3 or the like), yielding lower resistance than other approaches. In some embodiments, via layout patterns 318*a*, 324*a* and 330*a* are aligned in a stacked via configuration, yielding lower resistance than other approaches. In some embodiments, via layout patterns 318*b*, 324*b* and 330*b* are aligned in a stacked via configuration, yielding lower resistance than other approaches. In some embodiments, via layout patterns 418*a*, 424*a* and 430*a* are aligned in a stacked via configuration, yielding lower resistance than other approaches. In some embodiments, via layout patterns 418*b*, 424*b* and 430*b* are aligned in a stacked via configuration, yielding lower resistance than other approaches. In some embodiments, via layout patterns 418*c*, 424*c* and 430*c* are aligned in a stacked via configuration, yielding lower resistance than other approaches. In some embodiments, conductive structure layout patterns 314*a*, 314*b*, 414*a*, 414*b*, 414*c* of the M1 layer and corresponding conductive structure layout patterns 328*a*, 328*b*, 428*a*, 428*b*, 428*c* of the M3 layer are aligned, yielding lower resistance than other approaches. In some embodiments, conductive structure layout patterns 314*a*, 314*b*, 414*a*, 414*b*, 414*c* of the M1 layer each use 1W routing track, and conductive structure layout patterns 328*a*, 328*b*, 428*a*, 428*b*, 428*c* of the M3 layer each use one M3 routing track yielding lower resistance than other approaches. In some embodiments, one or more of via layout patterns via layout patterns 112, 318*a*, 318*b*, 418*a*, 418*b*, 418*c*, 324*a*, 324*b*, 424*a*, 424*b*, 424*c*, 330*a*, 330*b*, 430*a*, 430*b* and 430*c* is a square via layout pattern. In some embodiments, as the number of via layout patterns 318*a*, 318*b*, 418*a*, 418*b*, 418*c*, 324*a*, 324*b*, 424*a*, 424*b*, 424*c*, 330*a*, 330*b*, 430*a*, 430*b*, 430*c* increases and the number of conductive structure layout patterns 314*a*, 314*b*, 414*a*, 414*b*, 414*c*, 328*a*, 328*b*, 428*a*, 428*b*, 428*c* increases, more input pins are provided in layout design 500 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 500 having better speed performance than other approaches.

Figure 6:
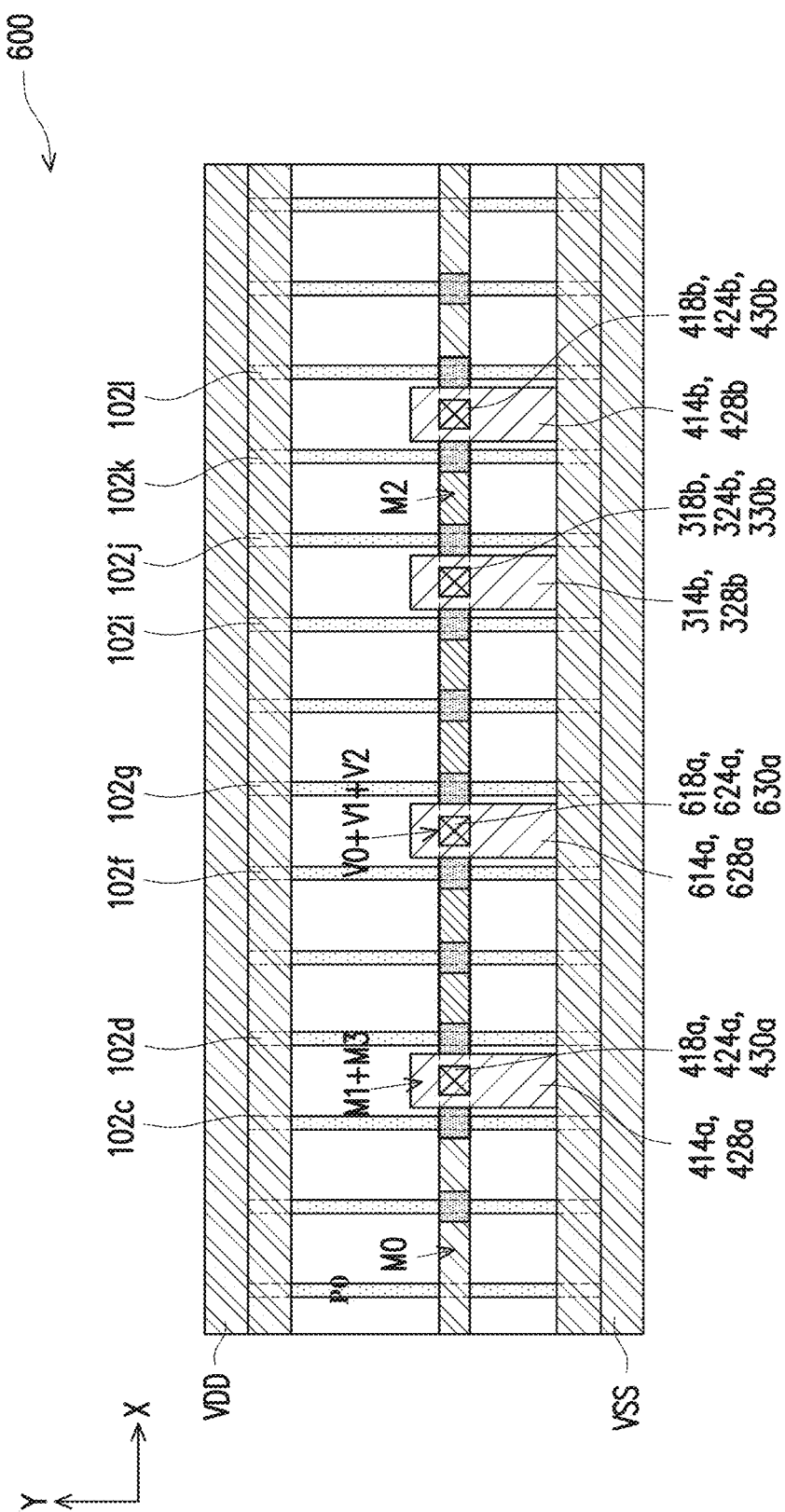
FIG. 6 is a diagram of a layout design of an IC structure, in accordance with some embodiments.

FIG. 6 is a diagram of a layout design 600 of an IC structure, in accordance with some embodiments.

Layout design 600 is a variation of layout design 500 of FIG. 5. In some embodiments, layout design 600 corresponds to a layout design of a quad-input pin a first pin (e.g., conductive structure layout patterns 414*a*, 428*a*), a second pin (e.g., conductive structure layout patterns 414*b*, 428*b*), a third pin (e.g., conductive structure layout patterns 314*b*, 328*b*) and a fourth pin (e.g., conductive structure layout patterns 614*a*, 628*a*). In some embodiments, layout design 600 illustrates that the locations of elements in the quad-input pin are adjustable to be in other positions, and the number of elements in the quad-input pin are adjustable to be other numbers. Other configurations, locations or number of elements in layout design 600 of FIG. 6 are within the scope of the present disclosure.

In comparison with layout design 500 of FIG. 5, layout design 600 of FIG. 6 does not include conductive structure layout patterns 414*c* and 428*c*, and via layout patterns 418*c*, 424*c* and 430*c*.

In comparison with layout design 500 of FIG. 5, conductive structure layout patterns 614*a* and 628*a* of layout design 600 replace corresponding conductive structure layout patterns 314*a* and 328*a*, and via layout patterns 618*a*, 624*a* and 630*a* of layout design 600 replace corresponding via layout patterns 318*a*, 324*a* and 330*a*.

Conductive structure layout patterns 614*a* and 628*a*, and via layout patterns 618*a*, 624*a* and 630*a* are positioned between gate layout patterns 102f and 102g. Conductive structure layout patterns 614a and 628a are similar to corresponding conductive structure layout patterns 314a and 328a, and similar detailed description of these layout patterns is therefore omitted. Via layout patterns 618a, 624a and 630a are similar to corresponding via layout patterns 318a, 324a and 330a, and similar detailed description of these layout patterns is therefore omitted.

In some embodiments, layout design 600 includes four M1 conductive structure layout patterns (e.g., conductive structure layout patterns 314b, 414a, 414b and 614a), four M3 conductive structure layout patterns (e.g., conductive structure layout patterns 328b, 428a, 428b and 628a), four V0 via layout patterns (e.g., via layout patterns 318b, 418a, 418b and 618a), four V1 via layout patterns (e.g., via layout patterns 324b, 424a, 424b and 624a), and four V2 via layout patterns (e.g., via layout patterns 330b, 430a, 430b and 630a).

In some embodiments, by utilizing layout design 600 yields a metal mesh structure configured as a quad-input pin. In some embodiments, by utilizing layout design 600, the number of via layout patterns (e.g., via layout patterns 112, 318b, 324b, 330b, 418a, 418b, 424a, 424b, 430a, 430b, 618a, 624a and 630a) is increased, resulting in more connections between underlying and overlying conductive feature layout patterns (e.g., metal layers M0, M1, M2, M3 or the like), yielding lower resistance than other approaches. In some embodiments, via layout patterns 318b, 324b and 330b are aligned in a stacked via configuration, yielding lower resistance than other approaches. In some embodiments, via layout patterns 418a, 424a and 430a are aligned in a stacked via configuration, yielding lower resistance than other approaches. In some embodiments, via layout patterns 418b, 424b and 430b are aligned in a stacked via configuration, yielding lower resistance than other approaches. In some embodiments, via layout patterns 618a, 624a and 630a are aligned in a stacked via configuration, yielding lower resistance than other approaches. In some embodiments, conductive structure layout patterns 314b, 414a, 414b, 614a of the M1 layer and corresponding conductive structure layout patterns 328b, 428a, 428b, 628a of the M3 layer are aligned, yielding lower resistance than other approaches. In some embodiments, conductive structure layout patterns 314b, 414a, 414b, 614a of the M1 layer each use 1W routing track, and conductive structure layout patterns 328b, 428a, 428b, 628a of the M3 layer each use one M3 routing track yielding lower resistance than other approaches. In some embodiments, one or more of via layout patterns via layout patterns 112, 318b, 324b, 330b, 418a, 418b, 424a, 424b, 430a, 430b, 618a, 624a and 630a is a square via layout pattern. In some embodiments, as the number of via layout patterns 318b, 324b, 330b, 418a, 418b, 424a, 424b, 430a, 430b, 618a, 624a, 630a increases and the number of conductive structure layout patterns 314b, 414a, 414b, 614a, 328b, 428a, 428b, 628a increases, more input pins are provided in layout design 600 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 600 having better speed performance than other approaches.

Figure 7:
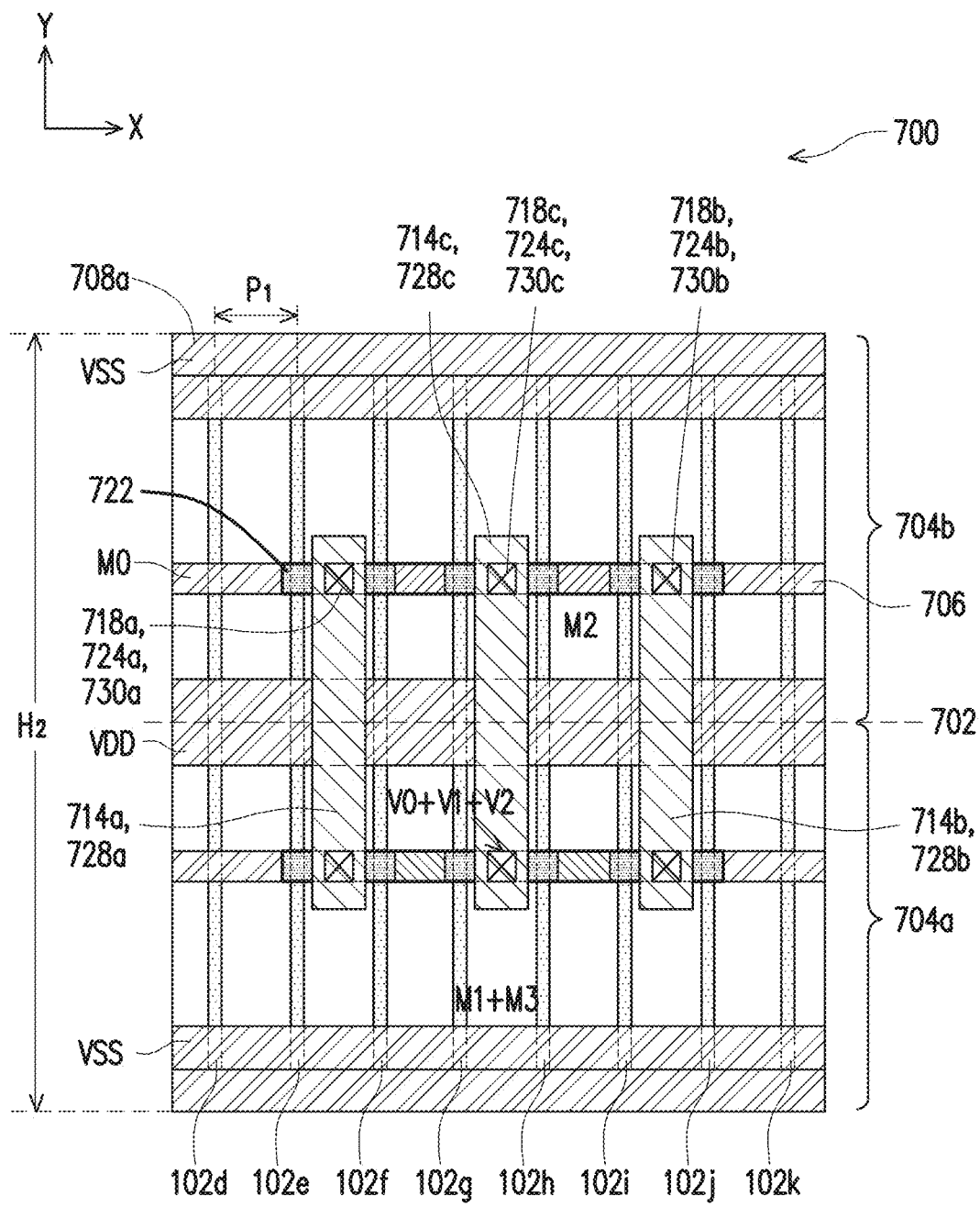
FIG. 7 is a diagram of a layout design of an IC structure, in accordance with some embodiments.

FIG. 7 is a diagram of a layout design 700 of an IC structure, in accordance with some embodiments.

Layout design 700 is a variation of layout design 500 of FIG. 5. In some embodiments, layout design 700 corresponds to a layout design of a double height, triple-input pin having a first pin (e.g., conductive structure layout patterns 714a, 728a), a second pin (e.g., conductive structure layout patterns 714b, 728b) and a third pin (e.g., conductive structure layout patterns 714c, 728c). In some embodiments, layout design 700 illustrates that the locations of elements in the triple-input pin are adjustable to be in other positions, and the number of elements in the triple-input pin are adjustable to be other numbers. Other configurations, locations or number of elements in layout design 700 of FIG. 7 are within the scope of the present disclosure.

Layout design 700 shows a zoomed-in portion of layout design 500 extending from gate layout pattern 102d to gate layout pattern 102k.

Layout design 700 has a height H2 that is double the height H1 of one or more of layout designs 100 and 300-600.

In comparison with layout design 500 of FIG. 5, layout design 700 includes a first portion 704a and a second portion 704b. The first portion 704a is a minor image of the second portion 704b with respect to a first line 702. In some embodiments, the first portion 704a is not a minor image of the second portion 704b with respect to the first line 702. Layout design 700 is symmetric with respect to first line 702.

The first portion 704a includes layout patterns as described in layout pattern 500 of FIG. 5, and similar detailed description of these layout patterns is therefore omitted.

The second portion 704b includes a third conductive structure layout pattern 706, a rail layout pattern 708a, a fourth conductive structure layout pattern 722, and via layout patterns 718a, 724a, 730a, 718b, 724b, 730b, 718c, 724c and 730c.

In comparison with layout design 500 of FIG. 5, conductive structure layout patterns 714a, 728a, 714b, 728b, 714c, and 728c of layout design 700 replace corresponding conductive structure layout patterns 314a, 324a, 314b, 324b, 414c, and 428c. Conductive structure layout patterns 714a, 728a, 714b, 728b, 714c, and 728c are similar to the corresponding conductive structure layout patterns 314a, 328a, 314b, 328b, 414c, and 428c, and similar detailed description of these layout patterns is therefore omitted.

Conductive structure layout patterns 714a, 728a, 714b, 728b, 714c, and 728c extend in the second direction Y to overlap the first line 702 into the second portion 704b of layout design 700.

Layout patterns in the second portion 704b are similar to corresponding layout patterns in the first portion 704a, and similar detailed description of these layout patterns is therefore omitted.

Via layout patterns 718a, 724a and 730a are similar to via layout patterns 318a, 324a and 330a, and similar detailed description of these layout patterns is therefore omitted.

Via layout patterns 718b, 724b and 730b are similar to via layout patterns 318b, 324b and 330b, and similar detailed description of these layout patterns is therefore omitted.

Via layout patterns 718c, 724c and 730c are similar to via layout patterns 418a, 424a and 430a, and similar detailed description of these layout patterns is therefore omitted.

Third conductive structure layout pattern 706 is similar to first conductive structure layout pattern 106, and similar detailed description of these layout patterns is therefore omitted.

Fourth conductive structure layout pattern 722 is similar to second conductive structure layout pattern 122, and similar detailed description of these layout patterns is therefore omitted.

Rail layout pattern 708a is similar to rail layout pattern 108a, and similar detailed description of these layout patterns is therefore omitted.

In some embodiments, layout design 700 includes three M1 conductive structure layout patterns (e.g., conductive structure layout patterns 714a, 714b and 714c), three M3 conductive structure layout patterns (e.g., conductive structure layout patterns 728a, 728b and 728c), six V0 via layout patterns (e.g., via layout patterns 318a, 318b, 418c, 718a, 718b and 718c), six V1 via layout patterns (e.g., via layout patterns 324a, 324b, 424c, 724a, 724b and 724c), and six V2 via layout patterns (e.g., via layout patterns 330a, 330b, 430c, 730a, 730b and 730c). In some embodiments, layout design 700 includes two M2 conductive structure layout patterns (e.g., conductive structure layout patterns 122 and 722), and two M0 conductive structure layout patterns (e.g., conductive structure layout patterns 106 and 706).

In some embodiments, by utilizing layout design 700 yields a metal mesh structure configured as a double height, triple-input pin. In some embodiments, by utilizing layout design 700, the number of via layout patterns (e.g., via layout patterns 112, 318a, 318b, 324a, 324b, 330a, 330b, 418c, 424c, 430c, 718a, 718b, 718c, 724a, 724b, 724c, 730a, 730b and 730c) is increased, resulting in more connections between underlying and overlying conductive feature layout patterns (e.g., metal layers M0, M1, M2, M3 or the like), yielding lower resistance than other approaches. In some embodiments, via layout patterns 318a, 324a and 330a are aligned in a stacked via configuration, yielding lower resistance than other approaches. In some embodiments, via layout patterns 318b, 324b and 330b are aligned in a stacked via configuration, yielding lower resistance than other approaches. In some embodiments, via layout patterns 418c, 424c and 430c are aligned in a stacked via configuration, yielding lower resistance than other approaches. In some embodiments, via layout patterns 718a, 724a and 730a are aligned in a stacked via configuration, yielding lower resistance than other approaches. In some embodiments, via layout patterns 718b, 724b and 730b are aligned in a stacked via configuration, yielding lower resistance than other approaches. In some embodiments, via layout patterns 718c, 724c and 730c are aligned in a stacked via configuration, yielding lower resistance than other approaches. In some embodiments, conductive structure layout patterns 714a, 714b, 714c of the M1 layer and corresponding conductive structure layout patterns 728a, 728b, 728c of the M3 layer are aligned, yielding lower resistance than other approaches. In some embodiments, conductive structure layout patterns 714a, 714b, 714c of the M1 layer each use 1W routing track, and conductive structure layout patterns 728a, 728b, 728c of the M3 layer each use one M3 routing track yielding lower resistance than other approaches. In some embodiments, one or more of via layout patterns via layout patterns 112, 318a, 318b, 324a, 324b, 330a, 330b, 418c, 424c, 430c, 718a, 718b, 718c, 724a, 724b, 724c, 730a, 730b and 730c is a square via layout pattern. In some embodiments, as the number of via layout patterns 318a, 318b, 324a, 324b, 330a, 330b, 418c, 424c, 430c, 718a, 718b, 718c, 724a, 724b, 724c, 730a, 730b, 730c increases and the number of conductive structure layout patterns 714a, 714b, 714c, 728a, 728b, 728c increases, more input pins are provided in layout design 700 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 700 having better speed performance than other approaches.

Figure 8:
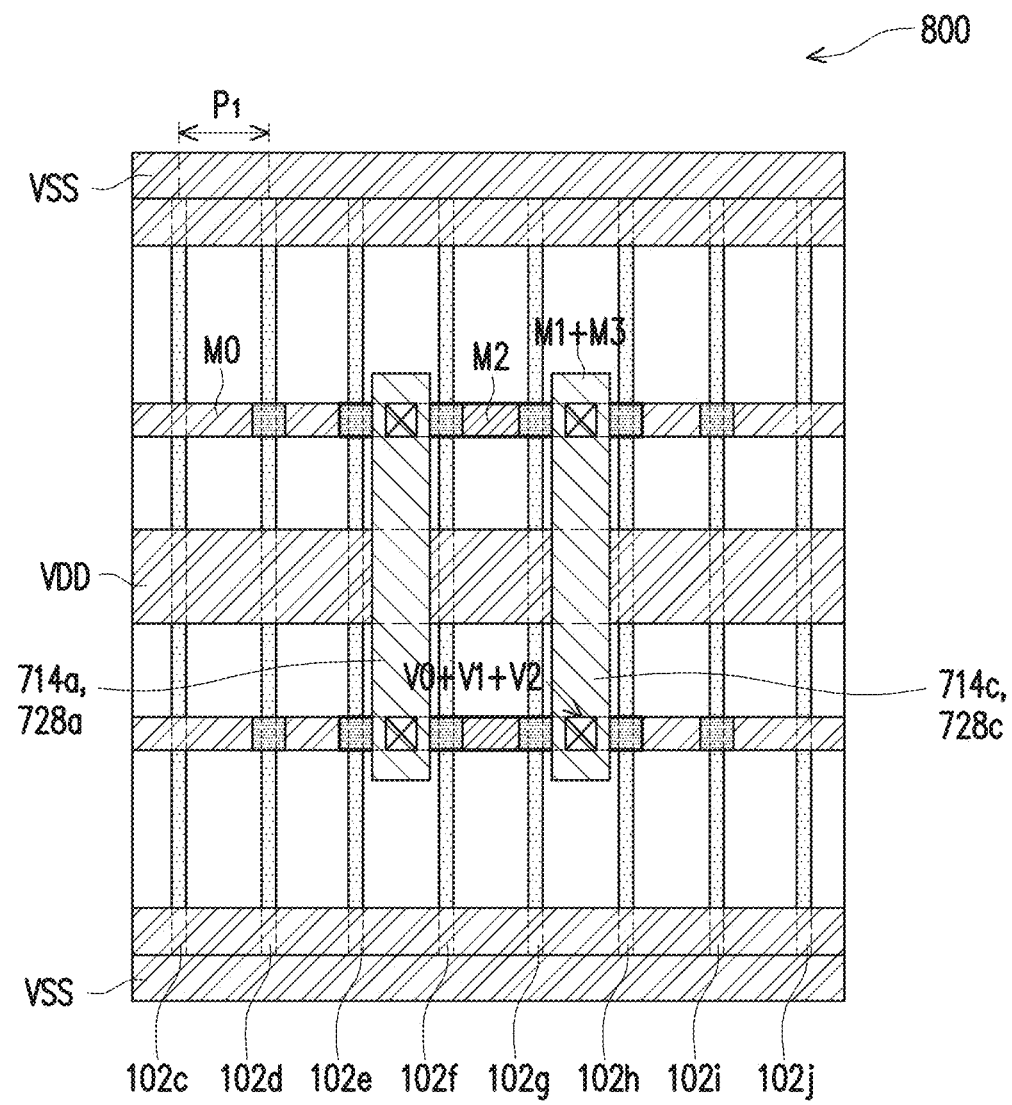
FIG. 8 is a diagram of a layout design of an IC structure, in accordance with some embodiments.

FIG. 8 is a diagram of a layout design 800 of an IC structure, in accordance with some embodiments.

Layout design 800 is a variation of layout design 700 of FIG. 7. In some embodiments, layout design 800 corresponds to a layout design of a double height, dual-input pin having a first pin (e.g., conductive structure layout patterns 714a, 728a), and a second pin (e.g., conductive structure layout patterns 714c, 728c). In some embodiments, layout design 800 illustrates that the locations of elements in the dual-input pin are adjustable to be in other positions, and the number of elements in the dual-input pin are adjustable to be other numbers. Other configurations, locations or number of elements in layout design 800 of FIG. 8 are within the scope of the present disclosure.

In comparison with layout design 700 of FIG. 7, layout design 800 of FIG. 8 does not include conductive structure layout patterns 714b and 728b, and via layout patterns 718b, 724b, 730b, 318b, 324b and 330b.

Layout design 800 shows a zoomed-in portion of layout design 500 extending from gate layout pattern 102c to gate layout pattern 102j. In comparison with layout design 700 of FIG. 7, layout design 800 of FIG. 8 is shifted in the first direction X by one poly pitch (P1) and therefore extends from gate layout pattern 102c to gate layout pattern 102j.

In some embodiments, by utilizing layout design 800 yields a metal mesh structure configured as a double height, dual-input pin. In some embodiments, by utilizing layout design 800, the number of via layout patterns (e.g., via layout patterns 112, 318a, 324a, 330a, 418c, 424c, 430c, 718a, 718c, 724a, 724c, 730a and 730c) is increased, resulting in more connections between underlying and overlying conductive feature layout patterns (e.g., metal layers M0, M1, M2, M3 or the like), yielding lower resistance than other approaches. In some embodiments, via layout patterns 318a, 324a and 330a are aligned in a stacked via configuration, yielding lower resistance than other approaches. In some embodiments, via layout patterns 418c, 424c and 430c are aligned in a stacked via configuration, yielding lower resistance than other approaches. In some embodiments, via layout patterns 718a, 724a and 730a are aligned in a stacked via configuration, yielding lower resistance than other approaches. In some embodiments, via layout patterns 718c, 724c and 730c are aligned in a stacked via configuration, yielding lower resistance than other approaches. In some embodiments, conductive structure layout patterns 714a, 714c of the M1 layer and corresponding conductive structure layout patterns 728a, 728c of the M3 layer are aligned, yielding lower resistance than other approaches. In some embodiments, conductive structure layout patterns 714a, 714c of the M1 layer each use 1W routing track, and conductive structure layout patterns 728a, 728c of the M3 layer each use one M3 routing track yielding lower resistance than other approaches. In some embodiments, one or more of via layout patterns via layout patterns 112, 318a, 324a, 330a, 418c, 424c, 430c, 718a, 718c, 724a, 724c, 730a and 730c is a square via layout pattern. In some embodiments, as the number of via layout patterns 318a, 324a, 330a, 418c, 424c, 430c, 718a, 718c, 724a, 724c, 730a, 730c increases and the number of conductive structure layout patterns 714a, 714c, 728a, 728c increases, more input pins are provided in layout design 800 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 800 having better speed performance than other approaches.

Figure 9:
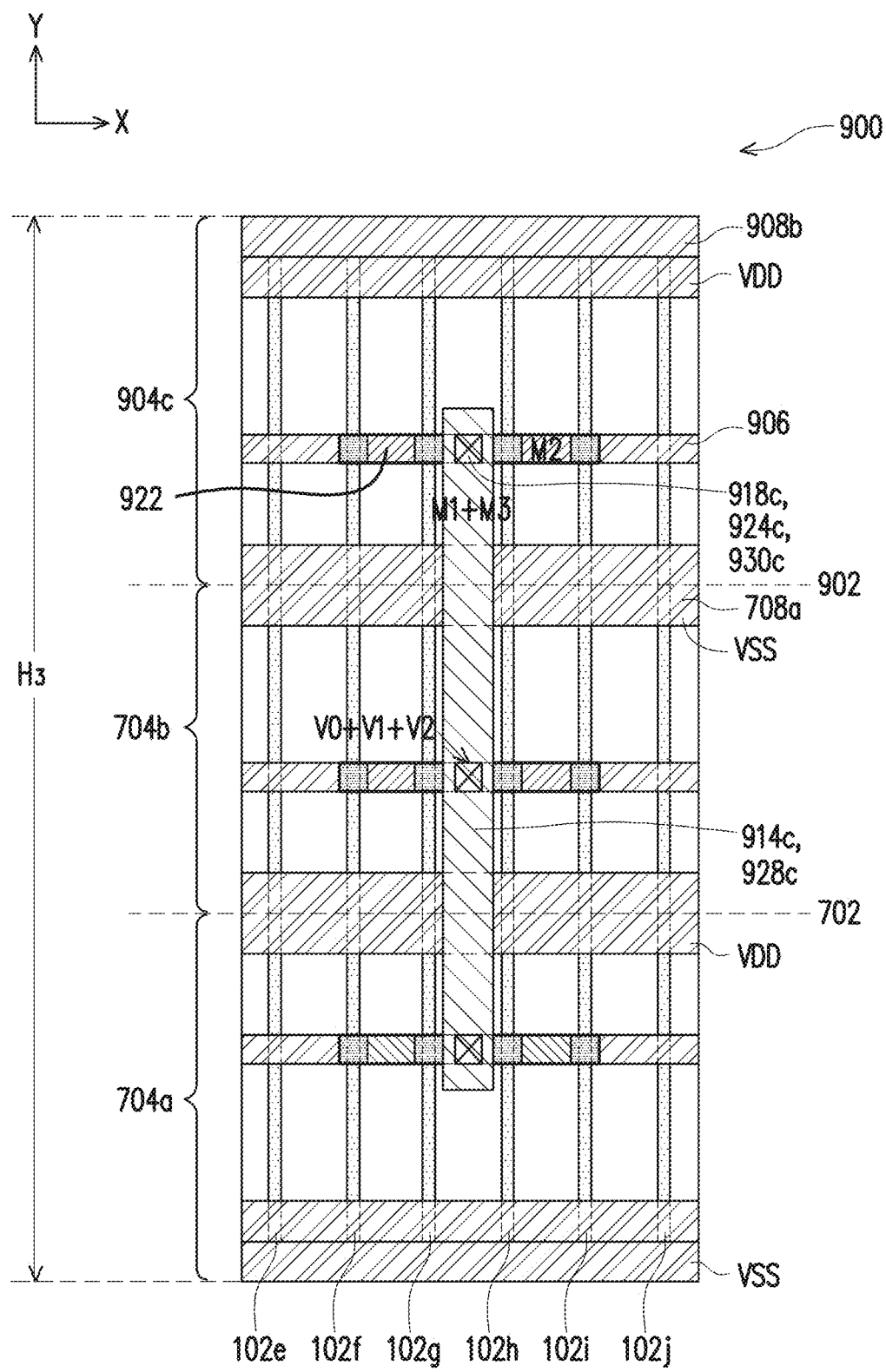
FIG. 9 is a diagram of a layout design of an IC structure, in accordance with some embodiments.

FIG. 9 is a diagram of a layout design 900 of an IC structure, in accordance with some embodiments.

Layout design 900 is a variation of layout design 700 of FIG. 7. In some embodiments, layout design 900 corresponds to a layout design of a triple height, single input pin having a first pin (e.g., conductive structure layout patterns 914c, 928c). In some embodiments, layout design 900 illustrates that the locations of elements in the single-input pin are adjustable to be in other positions, and the number of elements in the input pin are adjustable to be other numbers. Other configurations, locations or number of elements in layout design 900 of FIG. 9 are within the scope of the present disclosure.

Layout design 900 shows a zoomed-in portion of layout design 700 extending from gate layout pattern 102e to gate layout pattern 102j.

Layout design 900 has a height H3 that is triple the height H1 of one or more of layout designs 100 and 300-600.

In comparison with layout design 700 of FIG. 7, layout design 900 further includes a third portion 904c. The third portion 904c is a minor image of the second portion 704b with respect to a second line 902. In some embodiments, the second portion 904c is not a minor image of the second portion 704b with respect to the second line 902.

The third portion 904c includes a fifth conductive structure layout pattern 906, a rail layout pattern 908b, a sixth conductive structure layout pattern 922, and via layout patterns 918c, 924c and 930c.

In comparison with layout design 700 of FIG. 7, layout design 900 does not include conductive structure layout patterns 714a, 728a, 714b, 728b and via layout patterns 718a, 724a 730a, 718b, 724b and 730b.

In comparison with layout design 700 of FIG. 7, conductive structure layout patterns 914c and 928c of layout design 900 replace corresponding conductive structure layout patterns 714c and 728c. Conductive structure layout patterns 914c and 928c are similar to the corresponding conductive structure layout patterns 714c and 728c, and similar detailed description of these layout patterns is therefore omitted. Conductive structure layout patterns 914c and 928c extend in the second direction Y to overlap the first line 702 and the second line 902 into the third portion 904c of layout design 900.

Layout patterns in the third portion 904c are similar to corresponding layout patterns in the first portion 704a or the second portion 704b, and similar detailed description of these layout patterns is therefore omitted.

Via layout patterns 918c, 924c and 930c are similar to via layout patterns 318a, 324a and 330a or via layout patterns 718c, 724c and 730c, and similar detailed description of these layout patterns is therefore omitted.

Fifth conductive structure layout pattern 906 is similar to first conductive structure layout pattern 106 or third conductive structure layout pattern 706, and similar detailed description of these layout patterns is therefore omitted.

Sixth conductive structure layout pattern 922 is similar to second conductive structure layout pattern 122 or fourth conductive structure layout pattern 722, and similar detailed description of these layout patterns is therefore omitted.

Rail layout pattern 908b is similar to rail layout pattern 108b, and similar detailed description of these layout patterns is therefore omitted.

In some embodiments, by utilizing layout design 900 yields a metal mesh structure configured as a triple height, single-input pin. In some embodiments, by utilizing layout design 900, the number of via layout patterns (e.g., via layout patterns 112, 418c, 424c, 430c, 718c, 724c, 730c, 918c, 924c and 930c) is increased, yielding lower resistance than other approaches. In some embodiments, via layout patterns 418c, 424c and 430c are aligned in a stacked via configuration, yielding lower resistance than other approaches. In some embodiments, via layout patterns 718c, 724c and 730c are aligned in a stacked via configuration, yielding lower resistance than other approaches. In some embodiments, via layout patterns 918c, 924c and 930c are aligned in a stacked via configuration, yielding lower resistance than other approaches. In some embodiments, conductive structure layout patterns 914c of the M1 layer and corresponding conductive structure layout patterns 928c of the M3 layer are aligned, yielding lower resistance than other approaches. In some embodiments, conductive structure layout patterns 914c of the M1 layer each use 1W routing track, and conductive structure layout patterns 928c of the M3 layer each use one M3 routing track yielding lower resistance than other approaches. In some embodiments, one or more of via layout patterns via layout patterns 112, 418c, 424c, 430c, 718c, 724c, 730c, 918c, 924c and 930c is a square via layout pattern. In some embodiments, as the number of via layout patterns 418c, 424c, 430c, 718c, 724c, 730c, 918c, 924c, 930c increases and the number of conductive structure layout patterns 914a, 914c increases, more input pins are provided in layout design 900 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 900 having better speed performance than other approaches.

Figure 10:
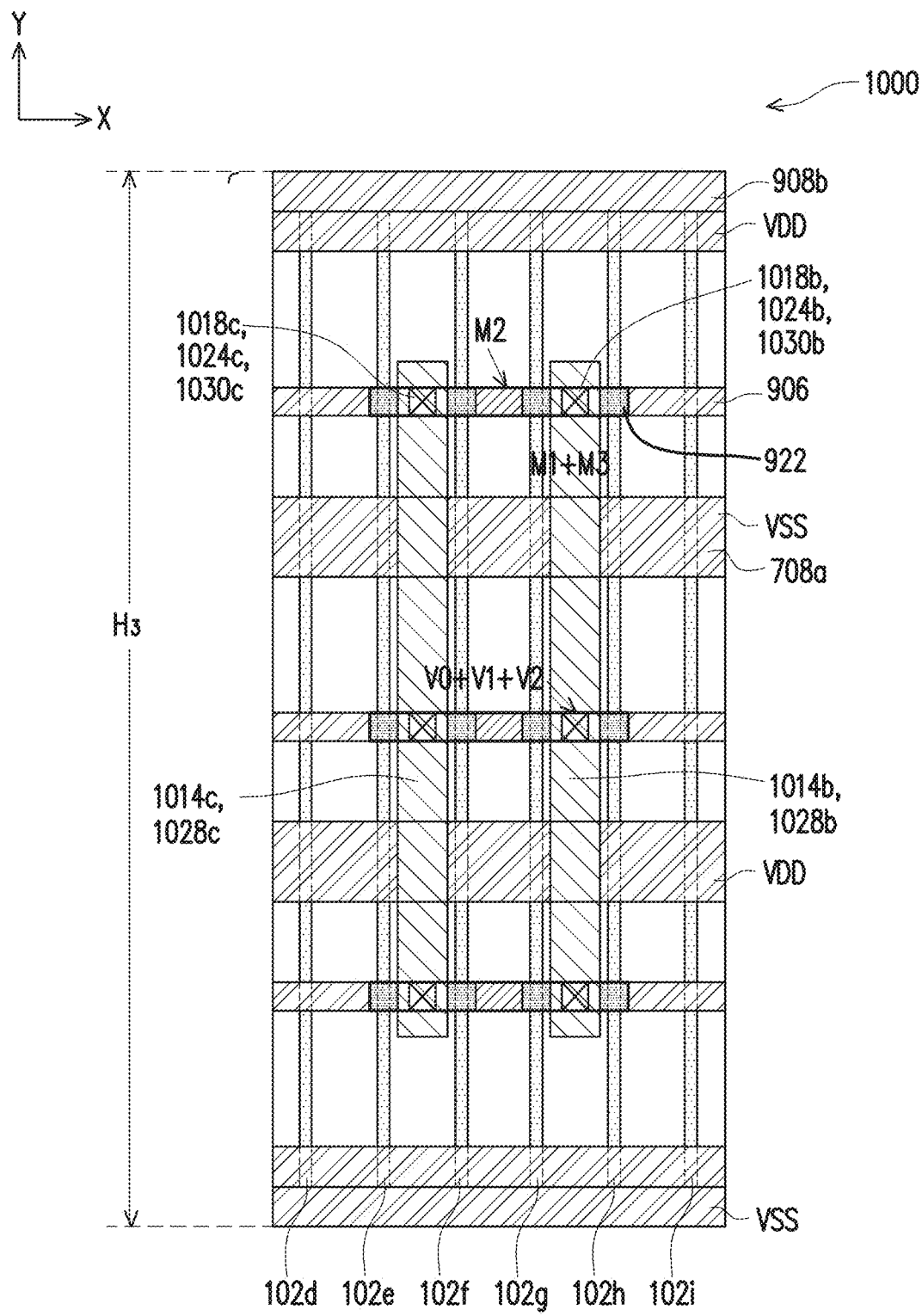
FIG. 10 is a diagram of a layout design of an IC structure, in accordance with some embodiments.

FIG. 10 is a diagram of a layout design 1000 of an IC structure, in accordance with some embodiments.

Layout design 1000 is a variation of layout design 800 of FIG. 8 and layout design 900 of FIG. 9. In some embodiments, layout design 1000 corresponds to a layout design of a triple height, dual-input pin having a first pin (e.g., conductive structure layout patterns 1014b, 1028b), and a second pin (e.g., conductive structure layout patterns 1014c, 1028c). In some embodiments, layout design 1000 illustrates that the locations of elements in the triple height, dual-input pin are adjustable to be in other positions, and the number of elements in the triple height, dual-input pin are adjustable to be other numbers. Other configurations, locations or number of elements in layout design 1000 of FIG. 10 are within the scope of the present disclosure.

Layout design 1000 combines features from layout design 800 and layout design 900. For example, layout design 1000 incorporates some of the features of layout design 800 with a height H3 similar to layout design 900. Layout design 1000 has a height H3 that is triple the height H1 of one or more of layout designs 100 and 300-600.

Layout design 1000 shows a zoomed-in portion of layout design 900 extending from gate layout pattern 102d to gate layout pattern 102i.

In comparison with layout design 800 of FIG. 8, conductive structure layout patterns 1014c, 1028c, 1014b and 1028b of layout design 1000 replace corresponding conductive structure layout patterns 714a, 728a, 714c and 728c. Conductive structure layout patterns 1014c, 1028c, 1014b and 1028b are similar to the corresponding conductive structure layout patterns 714a, 728a, 714c and 728c, and similar detailed description of these layout patterns is therefore omitted. Conductive structure layout patterns 1014*c*, 1028*c*, 1014*b* and 1028*b* extend in the second direction Y to overlap the first line 702 and the second line 902 into the third portion 904*c* of layout design 1000.

Similar to layout design 900, layout design 1000 also includes third portion 904*c*.

The third portion 904*c* of layout design 1000 includes fifth conductive structure layout pattern 906, rail layout pattern 908*b*, sixth conductive structure layout pattern 922, and via layout patterns 1018*b*, 1024*b*, 1030*b*, 1018*c*, 1024*c* and 1030*c*.

Via layout patterns 1018*b*, 1024*b* and 1030*b* are similar to via layout patterns 318*a*, 324*a* and 330*a* or via layout patterns 718*a*, 724*a* and 730*a*, and similar detailed description of these layout patterns is therefore omitted. Via layout patterns 1018*c*, 1024*c* and 1030*c* are similar to via layout patterns 418*c*, 424*c* and 430*c* or via layout patterns 718*c*, 724*c* and 730*c*, and similar detailed description of these layout patterns is therefore omitted.

In some embodiments, by utilizing layout design 1000 yields a metal mesh structure configured as a triple height, dual-input pin. In some embodiments, by utilizing layout design 1000, the number of via layout patterns (e.g., via layout patterns 112, 418*c*, 424*c*, 430*c*, 718*c*, 724*c*, 730*c*, 918*c*, 924*c*, 930*c*, 1018*b*, 1024*b*, 1030*b*, 1018*c*, 1024*c* and 1030*c*) is increased, yielding lower resistance than other approaches. In some embodiments, via layout patterns 418*c*, 424*c* and 430*c* are aligned in a stacked via configuration, yielding lower resistance than other approaches. In some embodiments, via layout patterns 718*c*, 724*c* and 730*c* are aligned in a stacked via configuration, yielding lower resistance than other approaches. In some embodiments, via layout patterns 918*c*, 924*c* and 930*c* are aligned in a stacked via configuration, yielding lower resistance than other approaches. In some embodiments, via layout patterns 1018*b*, 1024*b* and 1030*b* are aligned in a stacked via configuration, yielding lower resistance than other approaches. In some embodiments, via layout patterns 1018*c*, 1024*c* and 1030*c* are aligned in a stacked via configuration, yielding lower resistance than other approaches. In some embodiments, conductive structure layout patterns 1014*b*, 1014*c* of the M1 layer and corresponding conductive structure layout patterns 1028*b*, 1028*c* of the M3 layer are aligned, yielding lower resistance than other approaches. In some embodiments, conductive structure layout patterns 1014*b*, 1014*c* of the M1 layer each use 1W routing track, and conductive structure layout patterns 1028*b*, 1028*c* of the M3 layer each use one M3 routing track yielding lower resistance than other approaches. In some embodiments, one or more of via layout patterns via layout patterns 112, 418*c*, 424*c*, 430*c*, 718*c*, 724*c*, 730*c*, 918*c*, 924*c* and 930*c* is a square via layout pattern. In some embodiments, as the number of via layout patterns 418*c*, 424*c*, 430*c*, 718*c*, 724*c*, 730*c*, 918*c*, 924*c*, 930*c*, 1018*b*, 1024*b*, 1030*b*, 1018*c*, 1024*c*, 1030*c* increases and the number of conductive structure layout patterns 1014*c*, 1028*c*, 1014*b* and 1028*b* increases, more input pins are provided in layout design 1000 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1000 having better speed performance than other approaches.

Figure 11:
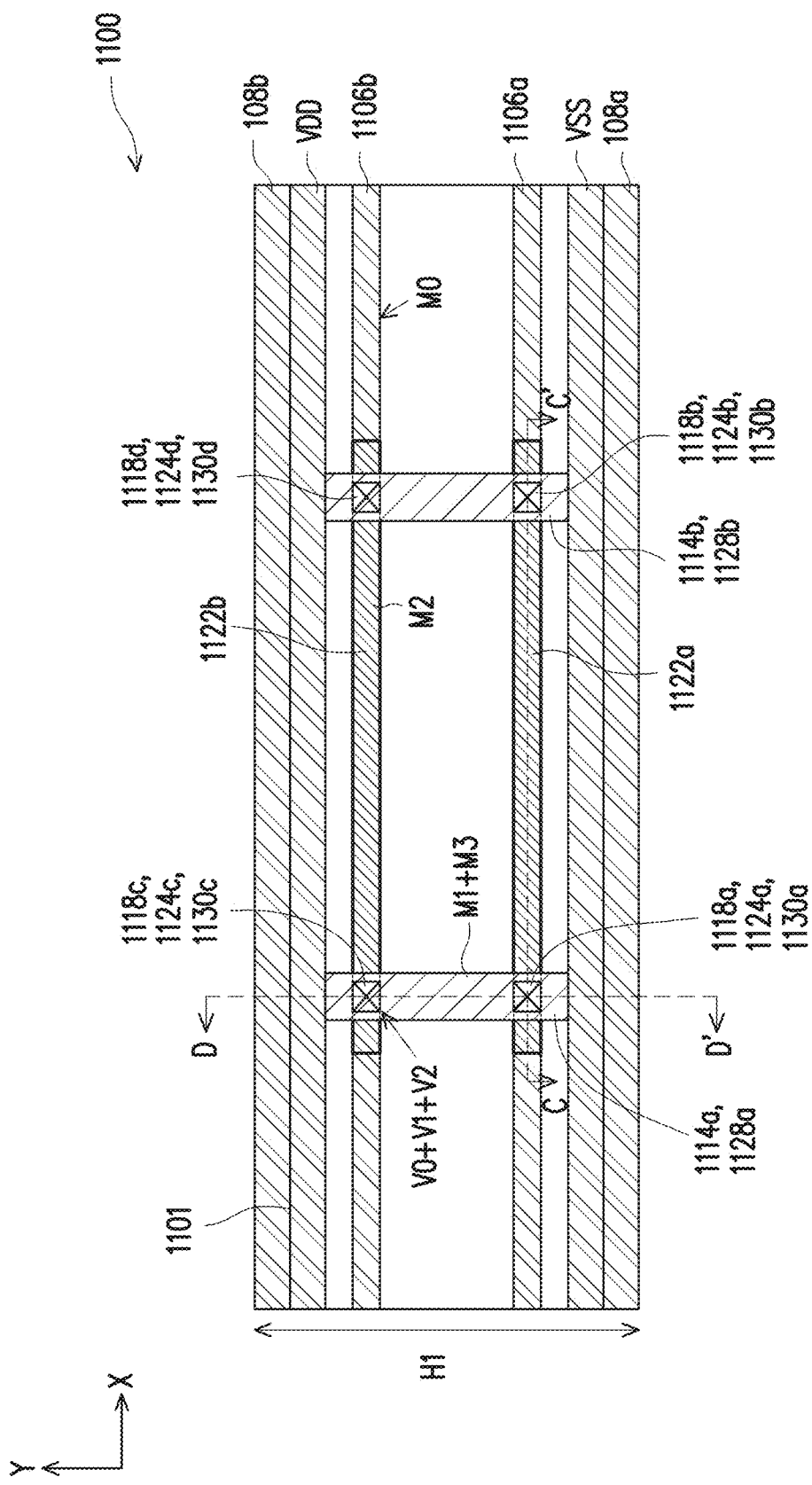
FIG. 11 is a diagram of a layout design of an IC structure, in accordance with some embodiments.

FIG. 11 is a diagram of a layout design 1100 of an IC structure, in accordance with some embodiments.

In some embodiments, layout design 1100 corresponds to a layout design of a dual-output pin having a first pin (e.g., conductive structure layout patterns 1114*a*, 1128*a*), and a second pin (e.g., conductive structure layout patterns 1114*b*, 1128*b*). Other configurations, locations or number of elements in layout design 1100 of FIG. 11 are within the scope of the present disclosure.

Layout design 1100 includes other features not shown for ease of illustration. For example, set of gate layout patterns 104 which are located on a first layout level (e.g., Poly).

Layout design 1100 has a width (not shown) in first direction X, and height H1 in second direction Y. Layout design 1100 is a standard cell 1101. In some embodiments, standard cell 1101 is a logic gate cell.

Layout design 1100 includes a conductive structure layout pattern 1106*a* and a conductive structure layout pattern 1106*b* between set of rail layout patterns 108*a*, 108*b*. The conductive structure layout pattern 1106*a*, 1106*b* (collectively referred to as a "set of conductive structure layout patterns 1106 (not shown) extends in the first direction X, and is located at the second layout level (e.g., M0). Each conductive structure layout pattern 1106*a*, 1106*b* of the set of conductive structure layout patterns 1106 is separated from each other in the second direction Y. Conductive structure layout pattern 1106*a*, 1106*b* is usable to manufacture a corresponding conductive structure 1206*a*, 1206*b* (shown in FIGS. 12A-12B) of IC structure 1200. One or more layout patterns of conductive structure layout patterns 1106*a*, 1106*b* or set of rail layout patterns 108*a*, 108*b* is on a same layout level as one or more other layout patterns of conductive structure layout patterns 1106*a*, 1106*b* or set of rail layout patterns 108*a*, 108*b*.

Conductive structure layout pattern 1106*a* is separated from conductive structure layout pattern 1106*b* by a distance D3 (not shown). Conductive structure layout pattern 1106*a* is separated from rail layout pattern 108*a* by a distance D4 (not shown). Conductive structure layout pattern 1106*b* is separated from rail layout pattern 108*b* by a distance D5 (not shown).

Other configurations or quantities of conductive structure layout pattern 1106*a*, 1106*b* or rails in the set of rail layout patterns 108*a*, 108*b* are within the scope of the present disclosure.

Layout design 1100 further includes conductive structure layout patterns 1114*a*, 1114*b* (collectively referred to as a "set of conductive structure layout patterns 1114" (not shown)) extending in the second direction Y and overlapping the set of conductive structures 1106. Conductive structure layout pattern 1114*a*, 1114*b* is usable to manufacture a corresponding conductive structure 1214*a*, 1214*b* (shown in FIGS. 12A-12B) of IC structure 1200. The set of conductive structure layout patterns 1114 is located at the third layout level (M1). Each conductive structure layout pattern 1114*a*, 1114*b* of the set of conductive structure layout patterns 1114 is separated from each other in the first direction X. Conductive structure layout pattern 1114*a* is separated from conductive structure layout pattern 1114*b* by a distance D6 (not shown). Other configurations or quantities of conductive structure layout pattern 1114*a*, 1114*b* are within the scope of the present disclosure.

Layout design 1100 further includes via layout patterns 1118*a*, 1118*b*, 1118*c*, 1118*d* (collectively referred to as "set of via layout patterns 1118" (not shown). Via layout patterns 1118*a*, 1118*b*, 1118*c*, 1118*d* are usable to manufacture a corresponding via structure 1218*a*, 1218*b*, 1218*c*, 1218*d* (shown in FIGS. 12A-12B) of IC structure 1200. Set of via layout patterns 1118 are between the set of conductive structure layout patterns 1114 and the set of conductive structure layout patterns 1106. Via layout pattern 1118*a*, 1118*b* of the set of via layout patterns 1118 is over layout pattern 1106*a* of the set of conductive structure layout patterns 1106. Via layout pattern 1118*c*, 1118*d* of the set of via layout patterns 1118 is over a layout pattern 1106*b* of the set of conductive structure layout patterns 1106. In some embodiments, each via layout pattern 1118*a*, 1118*b*, 1118*c*, 1118*d* of the set of via layout patterns 1118 is located where each conductive structure layout pattern 1114*a*, 1114*b* of the set of conductive structure layout patterns 1114 overlaps each conductive structure layout pattern 1106*a*, 1106*b* of the set of conductive structure layout patterns 1106.

In some embodiments, a center of one or more via layout patterns 1118*a*, 1118*b* of the set of via layout patterns 1118 is over a center of layout pattern 1106*a* of the set of conductive structure layout patterns 1106. In some embodiments, a center of one or more via layout patterns 1118*c*, 1118*d* of the set of via layout patterns 1118 is over a center of layout pattern 1106*b* of the set of conductive structure layout patterns 1106. In some embodiments, the center of a via layout pattern of the set of via layout patterns 1118 is aligned in the first direction X or the second direction Y with a center of a layout pattern of the set of conductive structure layout patterns 1106. Set of via layout patterns 1118 is on the V0 layout level of layout design 1100 between the second layout level and the third layout level. Other configurations of the set of via layout patterns 1118 is within the scope of the present disclosure.

Layout design 1100 further includes conductive structure layout patterns 1122*a*, 1122*b* between set of rail layout patterns 108*a*, 108*b*. The conductive structure layout patterns 1106*a*, 1106*b* (collectively referred to as a "set of conductive structure layout patterns 1122 (not shown) extend in the first direction X, and are located at the fourth layout level (e.g., M2). Each conductive structure layout pattern 1122*a*, 1122*b* of the set of conductive structure layout patterns 1122 is separated from each other in the second direction Y. Conductive structure layout pattern 1122*a*, 1122*b* is usable to manufacture a corresponding conductive structure 1222*a*, 1222*b* (shown in FIGS. 12A-12B) of IC structure 1200. The set of conductive structure layout patterns 1122 overlaps the set of conductive structure layout patterns 1114. In some embodiments, a conductive structure 1122*a*, 1122*b* of the set of conductive structures 1122 covers at least a portion of a corresponding conductive structure 1106*a*, 1106*b* of the set of conductive structures 1106. In some embodiments, a side of conductive structure 1122*a*, 1122*b* of the set of conductive structures 1122 is aligned with a corresponding side of a corresponding conductive structure 1106*a*, 1106*b* of the set of conductive structures 1106 in at least the first direction X or the second direction Y.

Conductive structure layout pattern 1122*a* is separated from conductive structure layout pattern 1122*b* by a distance D3' (not shown). Conductive structure layout pattern 1122*a* is separated from rail layout pattern 108*a* by a distance D4' (not shown). Conductive structure layout pattern 1122*b* is separated from rail layout pattern 108*b* by a distance D5' (not shown).

In some embodiments, one or more layout patterns of the set of conductive structure layout patterns 1106, 1122 has a different length (not shown) in the first direction X from another layout pattern of the set of conductive structure layout patterns 1106, 1122. In some embodiments, one or more layout patterns of the set of conductive structure layout patterns 1106, 1122 has a same length (not shown) in the first direction X from another layout pattern the set of conductive structure layout patterns 1106, 1122.

In some embodiments, one or more layout patterns of the set of conductive structure layout patterns 1106, 1122 has a different width (not shown) in the second direction Y from another layout pattern of the set of conductive structure layout patterns 1106, 1122. In some embodiments, one or more layout patterns of the set of conductive structure layout patterns 1106, 1122 has a same width (not shown) in the second direction Y from another layout pattern of the set of conductive structure layout patterns 1106, 1122.

Other configurations or quantities of conductive structure layout patterns 1122*a*, 1122*b* are within the scope of the present disclosure.

Layout design 1100 further includes via layout patterns 1124*a*, 1124*b*, 1124*c*, 1124*d* (collectively referred to as "set of via layout patterns 1124" (not shown). Via layout patterns 1124*a*, 1124*b*, 1124*c*, 1124*d* are usable to manufacture a corresponding via structure 1224*a*, 1224*b*, 1224*c*, 1224*d* (shown in FIGS. 12A-12B) of IC structure 1200. Set of via layout patterns 1124 are between the set of conductive structure layout patterns 1122 and the set of conductive structure layout patterns 1114. The set of via layout patterns 1118 is over the set of conductive structure layout patterns 1114. In some embodiments, each via layout pattern 1124*a*, 1124*b*, 1124*c*, 1124*d* of the set of via layout patterns 1118 is located where each conductive structure layout pattern 1122*a*, 1122*b* of the set of conductive structure layout patterns 1122 overlaps each conductive structure layout pattern 1114*a*, 1114*b* of the set of conductive structure layout patterns 1114.

In some embodiments, a center of one or more via layout patterns 1124*a*, 1124*c* of the set of via layout patterns 1124 is over a center of layout pattern 1114*a* of the set of conductive structure layout patterns 1114. In some embodiments, a center of one or more via layout patterns 1124*b*, 1124*d* of the set of via layout patterns 1124 is over a center of layout pattern 1114*b* of the set of conductive structure layout patterns 1114. In some embodiments, the center of a via layout pattern of the set of via layout patterns 1124 is aligned in the first direction X or the second direction Y with a center of a layout pattern of the set of conductive structure layout patterns 1114. Set of via layout patterns 1124 is on the V1 layout level of layout design 1100 between the third layout level and the fourth layout level. Other configurations of the set of via layout patterns 1124 is within the scope of the present disclosure.

Layout design 1100 further includes conductive structure layout patterns 1128*a*, 1128*b* (collectively referred to as a "set of conductive structure layout patterns 1128 (not shown) extending in the second direction Y, and are located at the fifth layout level (e.g., M3). Each conductive structure layout pattern 1128*a*, 1128*b* of the set of conductive structure layout patterns 1128 is separated from each other in the first direction X. Conductive structure layout pattern 1128*a*, 1128*b* is usable to manufacture a corresponding conductive structure 1228*a*, 1228*b* (shown in FIGS. 12A-12B) of IC structure 1200. The set of conductive structure layout patterns 1128 overlaps the set of conductive structure layout patterns 1106 and 1122. In some embodiments, a conductive structure 1128*a*, 1128*b* of the set of conductive structures 1128 covers at least a portion of a corresponding conductive structure 1114*a*, 1114*b* of the set of conductive structures 1114. In some embodiments, a side of conductive structure 1128*a*, 1128*b* of the set of conductive structures 1128 is aligned with a corresponding side of a corresponding conductive structure 1114a, 1114b of the set of conductive structures 1114 in at least the first direction X or the second direction Y.

Conductive structure layout pattern 1128a is separated from conductive structure layout pattern 1128b by a distance D6' (not shown).

In some embodiments, one or more layout patterns of the set of conductive structure layout patterns 1114, 1128 has a different length (not shown) in the first direction X from another layout pattern of the set of conductive structure layout patterns 1114, 1128. In some embodiments, one or more layout patterns of the set of conductive structure layout patterns 1114, 1128 has a same length (not shown) in the first direction X from another layout pattern the set of conductive structure layout patterns 1114, 1128.

In some embodiments, one or more layout patterns of the set of conductive structure layout patterns 1114, 1128 has a different width (not shown) in the second direction Y from another layout pattern of the set of conductive structure layout patterns 1114, 1128. In some embodiments, one or more layout patterns of the set of conductive structure layout patterns 1114, 1128 has a same width (not shown) in the second direction Y from another layout pattern of the set of conductive structure layout patterns 1114, 1128.

Other configurations or quantities of conductive structure layout patterns 1128a, 1128b are within the scope of the present disclosure.

Layout design 1100 further includes via layout patterns 1130a, 1130b, 1130c, 1130d (collectively referred to as "set of via layout patterns 1130" (not shown). Via layout patterns 1130a, 1130b, 1130c, 1130d are usable to manufacture a corresponding via structure 1230a, 1230b, 1230c, 1230d (shown in FIGS. 12A-12B) of IC structure 1200. Set of via layout patterns 1130 are between the set of conductive structure layout patterns 1128 and the set of conductive structure layout patterns 1122. Via layout pattern 1130a, 1130b of the set of via layout patterns 1130 is over a layout pattern 1122a of the set of conductive structure layout patterns 1122. Via layout pattern 1130c, 1130d of the set of via layout patterns 1130 is over a layout pattern 1122b of the set of conductive structure layout patterns 1122. In some embodiments, each via layout pattern 1130a, 1130b, 1130c, 1130d of the set of via layout patterns 1130 is located where each conductive structure layout pattern 1128a, 1128b of the set of conductive structure layout patterns 1128 overlaps each conductive structure layout pattern 1122a, 1122b of the set of conductive structure layout patterns 1122.

In some embodiments, a center of one or more via layout patterns 1130a, 1130b of the set of via layout patterns 1130 is over a center of layout pattern 1106a of the set of conductive structure layout patterns 1106 or a center of layout pattern 1122a of the set of conductive structure layout patterns 1122. In some embodiments, a center of one or more via layout patterns 1130c, 1130d of the set of via layout patterns 1130 is over a center of layout pattern 1106b of the set of conductive structure layout patterns 1106 or a center of layout pattern 1122b of the set of conductive structure layout patterns 1122. In some embodiments, the center of a via layout pattern of the set of via layout patterns 1130 is aligned in the first direction X or the second direction Y with a center of a layout pattern of the set of conductive structure layout patterns 1106 or 1122. Set of via layout patterns 1130 is on the V2 layout level of layout design 1100 between the fourth layout level and the fifth layout level. Other configurations of the set of via layout patterns 1130 is within the scope of the present disclosure.

In some embodiments, a center of at least one via layout pattern of the set of via layout patterns 1118, 1124, 1130 is aligned in the first direction X or the second direction Y with a center of at least another via layout pattern of the set of via layout patterns 1118, 1124, 1130. In some embodiments, the set of via layout patterns 1118, 1124, 1130 are referred to as a stacked via configuration since the center of each via is aligned in the first direction X and the second direction Y with a center of at least another via layout pattern of the set of via layout patterns 1118, 1124, 1130 on another layer. In some embodiments, by using a stacked via configuration, resistance is reduced compared with other approaches.

In some embodiments, since layout design 1100 occupies 2 M2 routing tracks (e.g., conductive structure layout patterns 1128a and 1128b) that provide more routing resources to upper metal layers (e.g., metal 3, metal 4, etc.) than other approaches. In some embodiments, by utilizing at least conductive structure layout patterns 1106a, 1106b, 1114a, 1114b, 1122a, 1122b, 1128a or 1128b and via layout patterns 1118a, 1118b, 1124a, 1124b, 1130a, 1130b yields a metal mesh structure (e.g., integrated circuit 1200) configured as a dual-output pin. In some embodiments, the set of conductive structure layout patterns 1106 of the M0 layer occupies two M0 routing tracks and the set of conductive structure layout patterns 1122 of the M2 layer occupies two M2 routing tracks.

In some embodiments, by utilizing layout design 1100, the number of via layout patterns (e.g., set of via layout patterns 1118, 1124 and 1130) is increased, resulting in more connections between underlying and overlying conductive feature layout patterns (e.g., metal layers M0, M1, M2, M3 or the like), yielding lower resistance than other approaches. In some embodiments, the set of via layout patterns 1118, set of via layout patterns 1124 and set of via layout patterns 1130 are aligned in a stacked via configuration, yielding lower resistance than other approaches. In some embodiments, each layout pattern of the set of via layout patterns 1118, set of via layout patterns 1124 and set of via layout patterns 1130 has 4 square via layout patterns.

In some embodiments, the set of conductive structure layout patterns 1114 of the M1 layer and the set of conductive structure layout patterns 1128 of the M3 layer are aligned, yielding lower resistance than other approaches. In some embodiments, the set of conductive structure layout patterns 1114 of the M1 layer and the set of conductive structure layout patterns 1128 of the M3 layer use two or more 1W M1 or two M3 routing tracks yielding lower resistance than other approaches. In some embodiments, as the number of via layout patterns in each of the set of via layout patterns 1118, set of via layout patterns 1124 and the set of via layout patterns 1130 increases and the number of conductive structure layout patterns in the set of conductive structure layout patterns 1114 and the set of conductive structure layout patterns 1128 increases, more output pins are provided in layout design 1100 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1100 having better speed performance than other approaches.

FIGS. 12A and 12B are diagrams of an IC structure 1200, in accordance with some embodiments. FIG. 12A is a cross-sectional view of IC structure 1200 corresponding to layout design 1100 as intersected by plane A-A', and FIG. 12B is a cross-sectional view of IC structure 1200 corresponding to layout design 1100 as intersected by plane B-B', in accordance with some embodiments. IC structure 1200 is manufactured by layout design 1100.

Structural relationships including alignment, lengths and widths, as well as configurations of IC structure 1200 are similar to the structural relationships and configurations of layout design 1100 of FIG. 11, and will not be described in FIGS. 12A-12B for brevity.

IC structure 1200 includes other features not shown for ease of illustration. For example, a set of gates similar to set of gates 204 are located on the first level of IC structure 200.

IC structure 1200 includes conductive structures 1206a, 1206b (collectively referred to as a "set of conductive structures 1206 (not shown) extending in the first direction X, and being separated from each other in the second direction Y.

IC structure 1200 further includes a set of rails 208a, 208b extending in the first direction X. Set of conductive structures 1206 is between the set of rails 208a, 208b. Set of conductive structures 1206 and set of rails 208a, 208b are on a second level of IC structure 1200. One or more of conductive structure 1206a, 1206b or set of rails 208a, 208b is on the second level (M0) of IC structure 1200. The second level of IC structure 1200 is above the first level of IC structure 1200. Other quantities of conductive structures 1206a, 1206b or set of rails 208a, 208b are within the scope of the present disclosure.

In some embodiments, the set of rails 208a, 208b is configured to provide the first supply voltage VDD or the second supply voltage VSS to IC structure 1200. In some embodiments, the set of rails 208a, 208b are electrically coupled to conductive structure 1206a, 1206b (not shown).

In some embodiments, the set of conductive structures 1206 is electrically coupled to one or more drains or sources of a transistor devices (not shown).

IC structure 1200 further includes a set of conductive structures 1214 extending in the second direction Y and overlapping the set of conductive structures 1206. Set of conductive structures includes conductive structures 1214a and 1214b. Each conductive structure 1214a, 1214b of the set of conductive structures is separated from each other in the first direction X.

Conductive structures 1214a, 1214b are on a third level (M1) of IC structure 1200. The third level of IC structure 1200 is above the first level and the second level of IC structure 1200. Other quantities of conductive structures or configurations of conductive structures 1214a, 1214b are within the scope of the present disclosure.

IC structure 1200 further includes a set of vias 1218 between conductive structures 1214a, 1214b and conductive structures 1206a, 1206b. Set of vias 1218 include one or more of vias 1218a, 1218b, 1218c, 1218d. Each via 1218a, 1218b, 1218c, 1218d of the set of vias 1218 is below a conductive structure 1214a, 1214b of the set of conductive structures 1214.

Each via 1218a, 1218b, 1218c, 1218d of the set of vias 1218 being located where the set of conductive structures 1214 overlaps the set of conductive structures 1206. The set of vias 1218 electrically couple the set of conductive structures 1214 to the set of conductive structures 1206. One or more vias 1218a, 1218b, 1218c, 1218d of set of vias 1218 is on a V0 level of IC structure 1200. The V0 level of IC structure 1200 is above the first level and second level of IC structure 1200. Other quantities of vias or configurations of set of vias 1218 are within the scope of the present disclosure.

IC structure 1200 further includes conductive structures 1222a, 1222b (collectively referred to as a "set of conductive structures 1222 (not shown) extending in the first direction X, and overlapping the set of conductive structures 1214. Each conductive structure 1222a, 1222b of the set of conductive structures 1222 is separated from each other in the second direction Y.

Set of conductive structures 1222 is between the set of rails 208a, 208b. In some embodiments, a conductive structure 1222a, 1222b of the set of conductive structures 1222 covers at least a portion of a corresponding conductive structure 1206a, 1206b of the set of conductive structures 1206. In some embodiments, a side of a conductive structure 1222a, 1222b of the set of conductive structures 1222 is aligned with a side of a corresponding conductive structure 1206a, 1206b of the set of conductive structures 1206 in at least the first direction X or the second direction Y. Set of conductive structures 1222 is on a fourth level (M2) of IC structure 1200. The fourth level of IC structure 1200 is above the first level, the second level and the third level of IC structure 1200. Other quantities or configurations of set of conductive structures 1222 are within the scope of the present disclosure.

IC structure 1200 further includes a set of vias 1224 between the set of conductive structures 1222 and the set of conductive structures 1214. Set of vias 1224 include one or more of vias 1224a, 1224b, 1224c, 1224d.

Vias 1224a, 1224c of the set of vias 1224 is above conductive structure 1224a of the set of conductive structures 1224. Vias 1224b, 1224d of the set of vias 1224 is above conductive structure 1224b of the set of conductive structures 1224. Each via 1224a, 1224b, 1224c, 1224d of the set of vias 1224 being located where the set of conductive structures 1222 overlaps the set of conductive structures 1214. The set of vias 1224 electrically couple the set of conductive structures 1222 to the set of conductive structures 1214. One or more vias 1224a, 1224b, 1224c, 1224d of set of vias 1224 is on a V2 level of IC structure 1200. The V2 level of IC structure 1200 is above the first level, the second level and the third level of IC structure 1200. Other quantities of vias or configurations of set of vias 1224 are within the scope of the present disclosure.

IC structure 1200 further includes a set of conductive structures 1228 extending in the second direction Y, and overlapping the set of conductive structures 1222 and set of conductive structures 1206. Set of conductive structures 1228 includes conductive structures 1228a and 1228b. Each conductive structure 1228a, 1228b of the set of conductive structures 1228 is separated from each other in the first direction X.

Set of conductive structures 1228 is between the set of rails 208a, 208b. In some embodiments, a conductive structure 1228a, 1228b of the set of conductive structures 1228 covers at least a portion of a corresponding conductive structure 1214a, 1214b of the set of conductive structures 1214. In some embodiments, at least a side of a conductive structure 1228a, 1228b of the set of conductive structures 1228 is aligned with a side of a corresponding conductive structure 1214a, 1214b of the set of conductive structures 1214 in at least the first direction X or the second direction Y. Set of conductive structures 1228 is on a fifth level (M3) of IC structure 1200. The fifth level of IC structure 1200 is above the first level, the second level, the third level and the fourth level of IC structure 1200.

In some embodiments, at least two of conductive structures 1214a, 1214b, 1228a and 1228b have a same length (not shown) in the second direction Y. In some embodiments, at least two of conductive structures 1214a, 1214b, 1228a and 1228b have a different length (not shown) in the second direction Y. In some embodiments, at least two of conductive structures 11214a, 1214b, 1228a and 1228b have a same width (not shown) in the first direction X. In some embodiments, at least two of conductive structures 1214a, 1214b, 1228a and 1228b have a different width (not shown) in the first direction X.

Other quantities of conductive structures or configurations of set of conductive structures 1228 are within the scope of the present disclosure.

IC structure 1200 further includes a set of vias 1230 between the set of conductive structures 1228 and the set of conductive structures 1222. Set of vias 1224 include one or more of vias 1230a, 1230b, 1230c, 1230d.

Vias 1230a, 1230b of the set of vias 1230 is above conductive structure 1222a of the set of conductive structures 1222. Vias 1230c, 1230d of the set of vias 1230 is above conductive structure 1222b of the set of conductive structures 1222. Each via 1230a, 1230b, 1230c, 1230d of the set of vias 1230 being located where the set of conductive structures 1228 overlaps the set of conductive structures 1222. The set of vias 1230 electrically couple the set of conductive structures 1228 to the set of conductive structures 1222. One or more vias 1230a, 1230b, 1230c, 1230d of the set of vias 1230 is on a V2 level of IC structure 1200. The V2 level of IC structure 1200 is above the first level, the second level, the third level and the fourth level of IC structure 1200. Other quantities of vias or configurations of set of vias 1230 are within the scope of the present disclosure.

Figure 12:
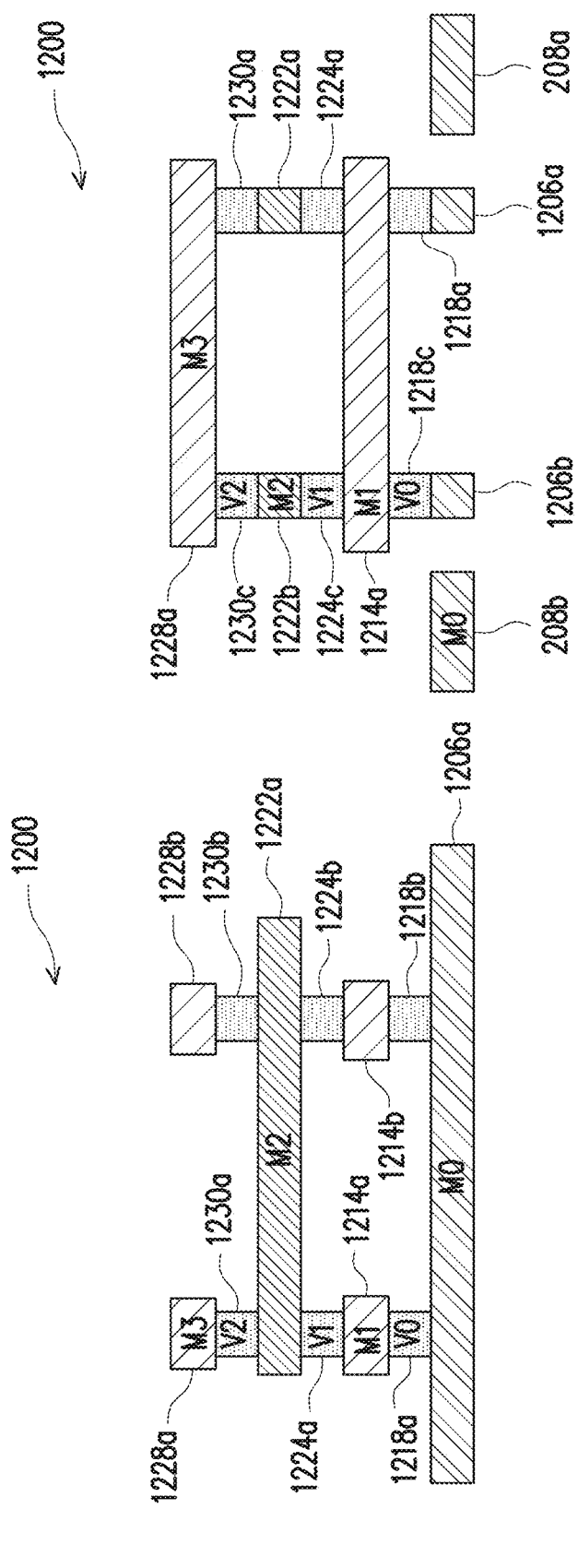
FIGS. 12A and 12B are diagrams of an IC structure, in accordance with some embodiments.

In some embodiments, one or more of the set of conductive structures 1206, the set of vias 1218, the set of conductive structures 1214, the set of vias 1224, the set of conductive structures 1222, the set of vias 1230, and the set of conductive structures 1228 are referred to as an output pin. In some embodiments, the output pin is electrically coupled to an output side (e.g., drain or source) of one or more transistor devices (not shown). In some embodiments, the output pin is also referred to as a metal mesh structure. In some embodiments, output pin of IC structure 1200 is known as a dual-output pin because the set of conductive structures 1214 or the set of conductive structures 1228 has two conductive structures (e.g., conductive structures 1214a, 1214b or conductive structures 1228a, 1228b). In some embodiments, the locations of elements in IC structure 1200 are adjustable to be in other positions, and the number of elements in IC structure 1200 are adjustable to be other numbers. Other configurations, locations or number of elements in IC structure 1200 of FIG. 12 are within the scope of the present disclosure.

In some embodiments, the set of vias 1218, 1224, 1230 are referred to as a stacked via configuration since the center of each via is aligned in the first direction X or the second direction Y with a center of at least another via of the set of vias 1218, 1224, 1230 on another layer. In some embodiments, IC structure 1200 has a lower resistance compared to other approaches because of the stacked via configuration. In some embodiments, as the number of vias 1218a, 1218b, 1224a, 1224b, 1230a and 1230b increases and the number of conductive structures 1214a, 1214b, 1222a, 1222b, 1228a and 1228b increases, more output pins are provided in integrated circuit 1200 resulting in more current paths between underlying and overlying conductive structures (e.g., metal layer M0, M1, M2, M3, or the like). In some embodiments, as the number of current paths increases, the distance of each corresponding current path is reduced resulting in integrated circuit 1200 having better speed performance than other approaches.

Figure 13:
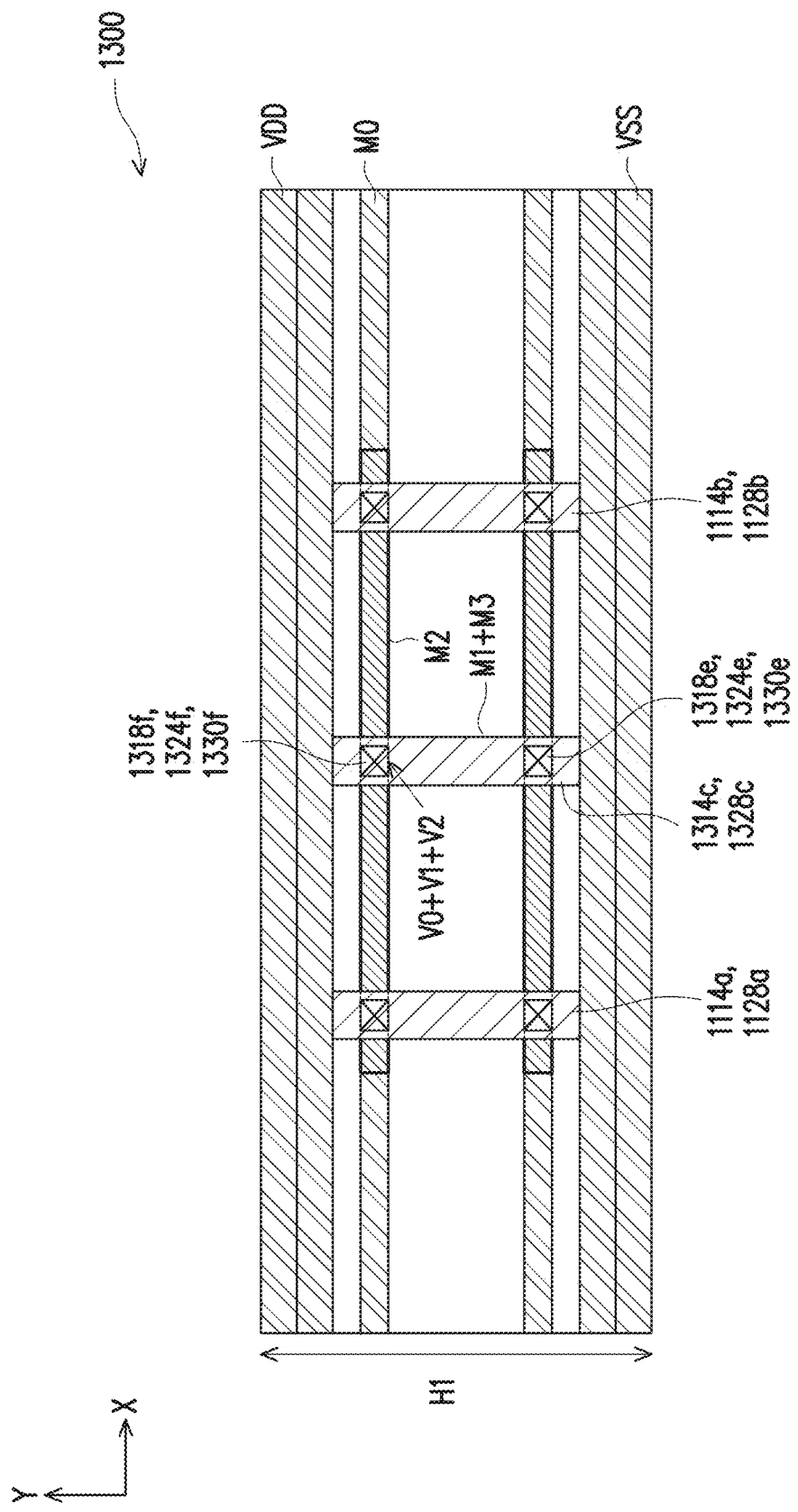
FIG. 13 is a diagram of a layout design of an IC structure, in accordance with some embodiments.

FIG. 13 is a diagram of a layout design 1300 of an IC structure, in accordance with some embodiments. Components that are the same or similar to those in one or more of FIGS. 1, 3-10, 11-19 (shown below), and 20A-30 (shown below) are given the same reference numbers, and detailed description thereof is thus omitted. Other configurations of via layout patterns or conductive structure layout patterns of FIGS. 11 and 13-19 are within the scope of the present disclosure.

Layout design 1300 is a variation of layout design 1100 of FIG. 11. In some embodiments, layout design 1300 corresponds to a layout design of a triple-output pin having a first pin (e.g., conductive structure layout patterns 1114a, 1128a), a second pin (e.g., conductive structure layout patterns 1114b, 1128b) and a third pin (e.g., conductive structure layout patterns 1314c, 1328c). In some embodiments, layout design 1300 illustrates that the locations of elements in the triple-output pin are adjustable to be in other positions, and the number of elements in the triple-output pin are adjustable to be other numbers. Other configurations, locations or number of elements in layout design 1300 of FIG. 13 are within the scope of the present disclosure.

In comparison with layout design 1100 of FIG. 11, layout design 1300 further includes a conductive structure layout pattern 1314c between conductive structure layout patterns 1114a and 1114b, and a conductive structure layout pattern 1328c between conductive structure layout patterns 1128a and 1128b. Conductive structure layout pattern 1314c, 1328c are similar to corresponding conductive structure layout patterns 1114a, 1128a, and similar detailed description of these layout patterns is therefore omitted.

In comparison with layout design 1100 of FIG. 11, layout design 1300 further includes via layout patterns 1318e, 1324e, 1330e, 1318f, 1324f and 1330f similar to corresponding via layout patterns 1118a, 1124a, 1130a, 1118c, 1124c and 1130c, and similar detailed description of these layout patterns is therefore omitted.

Each of via layout patterns 1318e, 1324e and 1330e are positioned between corresponding via layout patterns 1118a, 1124a, 1130a and corresponding via layout patterns 1118b, 1124b and 1130b. Each of via layout patterns 1318f, 1324f and 1330f are positioned between corresponding via layout patterns 1118c, 1124c, 1130c and corresponding via layout patterns 1118d, 1124d and 1130d.

In some embodiments, by utilizing layout design 1300 yields a metal mesh structure configured as a triple-output pin. In some embodiments, by utilizing layout design 1300, the number of via layout patterns (e.g., via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e and 1330f) is increased, resulting in more connections between underlying and overlying conductive feature layout patterns (e.g., metal layers M0, M1, M2, M3 or the like), yielding lower resistance than other approaches. In some embodiments, via layout patterns 1118a, 1124a and 1130a are aligned in a stacked via configuration, yielding lower resistance than other approaches. In some embodiments, via layout patterns 1118b, 1124b and 1130b are aligned in a stacked via configuration, yielding lower resistance than other approaches. In some embodiments, via layout patterns 1118c, 1124c and 1130c are aligned in a stacked via configuration, yielding lower resistance than other approaches. In some embodiments, via layout patterns 1118d, 1124d and 1130d are aligned in a stacked via configuration, yielding lower resistance than other approaches. In some embodiments, via layout patterns 1318e, 1324e and 1330e are aligned in a stacked via configuration, yielding lower resistance than other approaches. In some embodiments, via layout patterns 1318f, 1324f and 1330f are aligned in a stacked via configuration, yielding lower resistance than other approaches. In some embodiments, conductive structure layout patterns 1114a, 1114b, 1314c of the M1 layer and corresponding conductive structure layout patterns 1128a, 1128b, 1328c of the M3 layer are aligned, yielding lower resistance than other approaches. In some embodiments, conductive structure layout patterns 1114a, 1114b, 1314c of the M1 layer each use 1W routing track, and conductive structure layout patterns 1128a, 1128b, 1328c of the M3 layer each use one M3 routing track yielding lower resistance than other approaches. In some embodiments, one or more of via layout patterns via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e and 1330f is a square via layout pattern. In some embodiments, as the number of via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e and 1330f increases and the number of conductive structure layout patterns 1114a, 1114b, 1314c, 1128a, 1128b, 1328c increases, more output pins are provided in layout design 1300 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1300 having better speed performance than other approaches.

Figure 14:
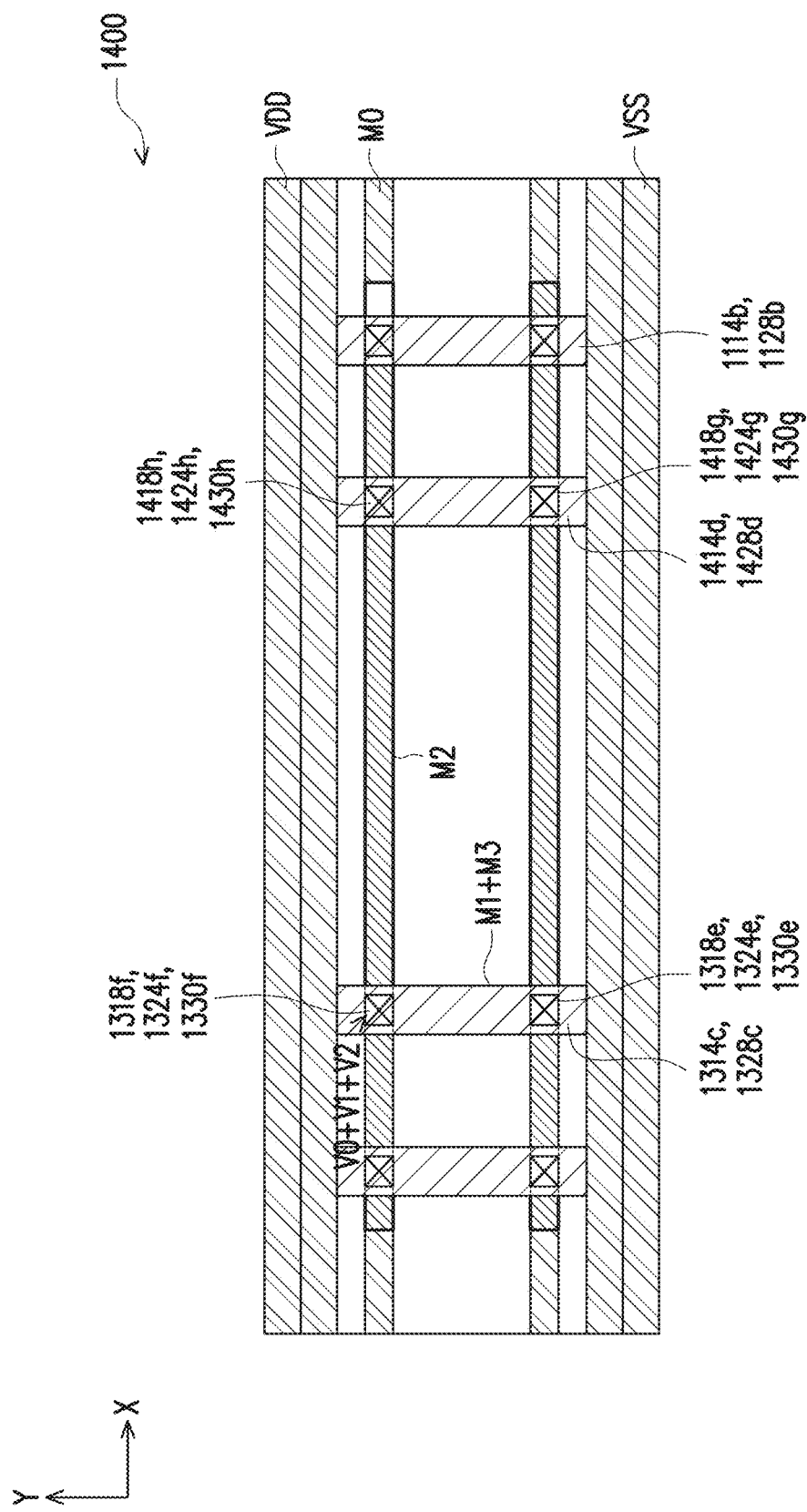
FIG. 14 is a diagram of a layout design of an IC structure, in accordance with some embodiments.

FIG. 14 is a diagram of a layout design 1400 of an IC structure, in accordance with some embodiments.

Layout design 1400 is a variation of layout design 1300 of FIG. 13. In some embodiments, layout design 1400 corresponds to a layout design of a quad-output pin having a first pin (e.g., conductive structure layout patterns 1114a, 1128a), a second pin (e.g., conductive structure layout patterns 1114b, 1128b), a third pin (e.g., conductive structure layout patterns 1314c, 1328c) and a fourth pin (e.g., conductive structure layout patterns 1414d, 1428d). In some embodiments, layout design 1400 illustrates that the locations of elements in the quad-output pin are adjustable to be in other positions, and the number of elements in the quad-output pin are adjustable to be other numbers. Other configurations, locations or number of elements in layout design 1400 of FIG. 14 are within the scope of the present disclosure.

In comparison with layout design 1300 of FIG. 13, layout design 1400 further includes a conductive structure layout pattern 1414d between conductive structure layout patterns 1314c and 1114b, and a conductive structure layout pattern 1428d between conductive structure layout patterns 1328c and 1128b. Conductive structure layout pattern 1414d, 1428d are similar to corresponding conductive structure layout patterns 1114a, 1128a, and similar detailed description of these layout patterns is therefore omitted.

In comparison with layout design 1300 of FIG. 13, layout design 1400 further includes via layout patterns 1418g, 1424g, 1430g, 1418h, 1424h and 1430h similar to corresponding via layout patterns 1118a, 1124a, 1130a, 1118c, 1124c and 1130c, and similar detailed description of these layout patterns is therefore omitted.

Each of via layout patterns 1418g, 1424g and 1430g are positioned between corresponding via layout patterns 1318e, 1324e and 1330e and corresponding via layout patterns 1118b, 1124b and 1130b. Each of via layout patterns 1418h, 1424h and 1430h are positioned between corresponding via layout patterns 1318f, 1324f and 1330f and corresponding via layout patterns 1118d, 1124d and 1130d.

In some embodiments, by utilizing layout design 1400 yields a metal mesh structure configured as a quad-output pin. In some embodiments, by utilizing layout design 1400, the number of via layout patterns (e.g., via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g and 1430h) is increased, resulting in more connections between underlying and overlying conductive feature layout patterns (e.g., metal layers M0, M1, M2, M3 or the like), yielding lower resistance than other approaches. In some embodiments, via layout patterns 1118a, 1124a and 1130a are aligned in a stacked via configuration, yielding lower resistance than other approaches. In some embodiments, via layout patterns 1118b, 1124b and 1130b are aligned in a stacked via configuration, yielding lower resistance than other approaches. In some embodiments, via layout patterns 1118c, 1124c and 1130c are aligned in a stacked via configuration, yielding lower resistance than other approaches. In some embodiments, via layout patterns 1118d, 1124d and 1130d are aligned in a stacked via configuration, yielding lower resistance than other approaches. In some embodiments, via layout patterns 1318e, 1324e and 1330e are aligned in a stacked via configuration, yielding lower resistance than other approaches. In some embodiments, via layout patterns 1318f, 1324f and 1330f are aligned in a stacked via configuration, yielding lower resistance than other approaches. In some embodiments, via layout patterns 1418g, 1424g and 1430g are aligned in a stacked via configuration, yielding lower resistance than other approaches. In some embodiments, via layout patterns 1418h, 1424h and 1430h are aligned in a stacked via configuration, yielding lower resistance than other approaches. In some embodiments, conductive structure layout patterns 1114a, 1114b, 1314c, 1414d of the M1 layer and corresponding conductive structure layout patterns 1128a, 1128b, 1328c, 1428d of the M3 layer are aligned, yielding lower resistance than other approaches. In some embodiments, conductive structure layout patterns 1114a, 1114b, 1314c, 1414d of the M1 layer each use 1W routing track, and conductive structure layout patterns 1128a, 1128b, 1328c, 1428d of the M3 layer each use one M3 routing track yielding lower resistance than other approaches. In some embodiments, one or more of via layout patterns via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g and 1430h is a square via layout pattern. In some embodiments, as the number of via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g and 1430h increases and the number of conductive structure layout patterns 1114a, 1114b, 1314c, 1414d, 1128a, 1128b, 1328c, 1428d increases, more output pins are provided in layout design 1400 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1400 having better speed performance than other approaches.

Figure 15:
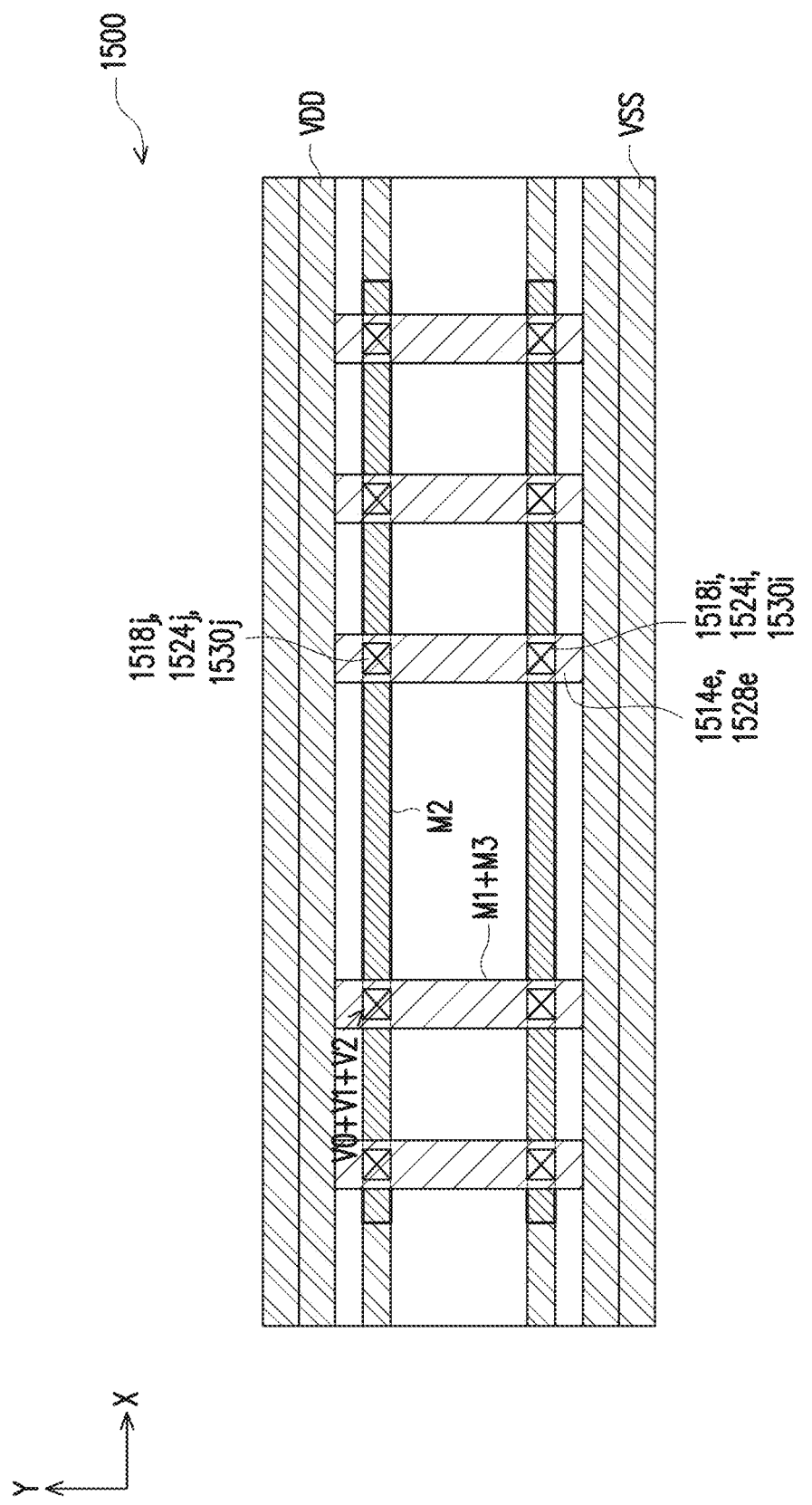
FIG. 15 is a diagram of a layout design of an IC structure, in accordance with some embodiments.

FIG. 15 is a diagram of a layout design 1400 of an IC structure, in accordance with some embodiments.

Layout design 1500 is a variation of layout design 1400 of FIG. 14. In some embodiments, layout design 1500 corresponds to a layout design of a penta-output pin having a first pin (e.g., conductive structure layout patterns 1114a, 1128a), a second pin (e.g., conductive structure layout patterns 1114b, 1128b), a third pin (e.g., conductive structure layout patterns 1314c, 1328c), a fourth pin (e.g., conductive structure layout patterns 1414d, 1428d) and a fifth pin (e.g., conductive structure layout patterns 1514e, 1528e). In some embodiments, layout design 1500 illustrates that the locations of elements in the penta-output pin are adjustable to be in other positions, and the number of elements in the penta-output pin are adjustable to be other numbers. Other configurations, locations or number of elements in layout design 1500 of FIG. 15 are within the scope of the present disclosure.

In comparison with layout design 1400 of FIG. 14, layout design 1500 further includes a conductive structure layout pattern 1514e between conductive structure layout patterns 1314c and 1414d, and a conductive structure layout pattern 1528e between conductive structure layout patterns 1328c and 1428d. Conductive structure layout pattern 1514e, 1528e are similar to corresponding conductive structure layout patterns 1114a, 1128a, and similar detailed description of these layout patterns is therefore omitted.

In comparison with layout design 1400 of FIG. 14, layout design 1500 further includes via layout patterns 1518i, 1524i, 1530i, 1518j, 1524j and 1530j similar to corresponding via layout patterns 1118a, 1124a, 1130a, 1118c, 1124c and 1130c, and similar detailed description of these layout patterns is therefore omitted.

Each of via layout patterns 1518i, 1524i and 1530i are positioned between corresponding via layout patterns 1318e, 1324e and 1330e and corresponding via layout patterns 1418g, 1424g and 1430g. Each of via layout patterns 1518j, 1524j and 1530j are positioned between corresponding via layout patterns 1318f, 1324f and 1330f and corresponding via layout patterns 1418h, 1424h and 1430h.

In some embodiments, by utilizing layout design 1500 yields a metal mesh structure configured as a penta-output pin. In some embodiments, by utilizing layout design 1500, the number of via layout patterns (e.g., via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g, 1430h, 1518i, 1518j, 1524i, 1524j, 1530i and 1530j) is increased, resulting in more connections between underlying and overlying conductive feature layout patterns (e.g., metal layers M0, M1, M2, M3 or the like), yielding lower resistance than other approaches. In some embodiments, via layout patterns 1118a, 1124a and 1130a are aligned in a stacked via configuration, yielding lower resistance than other approaches. In some embodiments, via layout patterns 1118b, 1124b and 1130b are aligned in a stacked via configuration, yielding lower resistance than other approaches. In some embodiments, via layout patterns 1118c, 1124c and 1130c are aligned in a stacked via configuration, yielding lower resistance than other approaches. In some embodiments, via layout patterns 1118d, 1124d and 1130d are aligned in a stacked via configuration, yielding lower resistance than other approaches. In some embodiments, via layout patterns 1318e, 1324e and 1330e are aligned in a stacked via configuration, yielding lower resistance than other approaches. In some embodiments, via layout patterns 1318f, 1324f and 1330f are aligned in a stacked via configuration, yielding lower resistance than other approaches. In some embodiments, via layout patterns 1418g, 1424g and 1430g are aligned in a stacked via configuration, yielding lower resistance than other approaches. In some embodiments, via layout patterns 1418h, 1424h and 1430h are aligned in a stacked via configuration, yielding lower resistance than other approaches. In some embodiments, via layout patterns 1518i, 1524i and 1530i are aligned in a stacked via configuration, yielding lower resistance than other approaches. In some embodiments, via layout patterns 1518j, 1524j and 1530j are aligned in a stacked via configuration, yielding lower resistance than other approaches. In some embodiments, conductive structure layout patterns 1114a, 1114b, 1314c, 1414d, 1514e of the M1 layer and corresponding conductive structure layout patterns 1128a, 1128b, 1328c, 1428d, 1528e of the M3 layer are aligned, yielding lower resistance than other approaches. In some embodiments, conductive structure layout patterns 1114a, 1114b, 1314c, 1414d, 1514e of the M1 layer each use 1W routing track, and conductive structure layout patterns 1128a, 1128b, 1328c, 1428d, 1528e of the M3 layer each use one M3 routing track yielding lower resistance than other approaches. In some embodiments, one or more of via layout patterns via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g, 1430h, 1518i, 1518j, 1524i, 1524j, 1530i and 1530j is a square via layout pattern. In some embodiments, as the number of via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g, 1430h, 1518i, 1518j, 1524i, 1524j, 1530i and 1530j increases and the number of conductive structure layout patterns 1114a, 1114b, 1314c, 1414d, 1514e, 1128a, 1128b, 1328c, 1428d, 1528e increases, more output pins are provided in layout design 1500 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1500 having better speed performance than other approaches.

Figure 16:
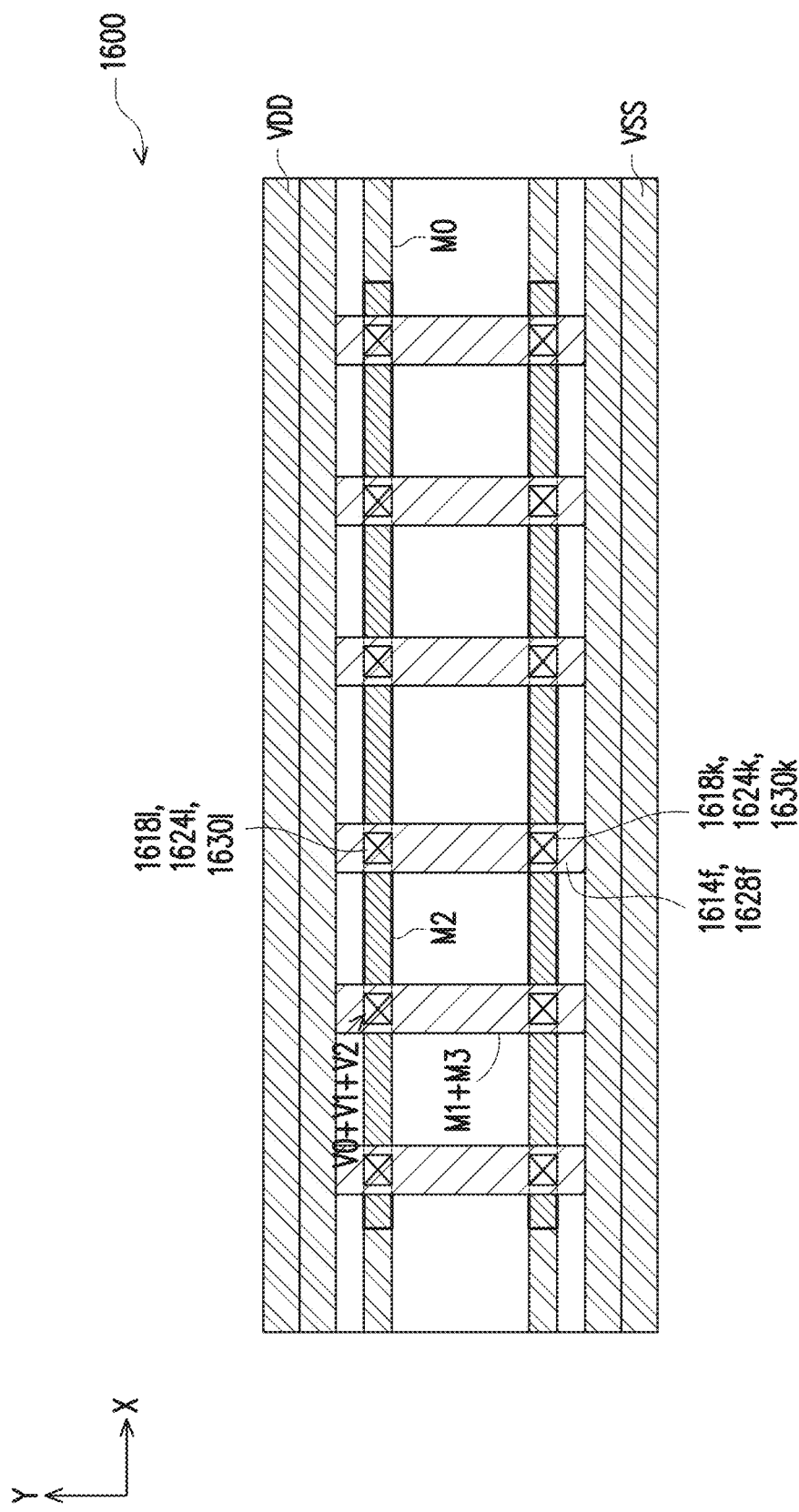
FIG. 16 is a diagram of a layout design of an IC structure, in accordance with some embodiments.

FIG. 16 is a diagram of a layout design 1600 of an IC structure, in accordance with some embodiments.

Layout design 1600 is a variation of layout design 1500 of FIG. 15. In some embodiments, layout design 1600 corresponds to a layout design of a hexa-output pin having a first pin (e.g., conductive structure layout patterns 1114a, 1128a), a second pin (e.g., conductive structure layout patterns 1114b, 1128b), a third pin (e.g., conductive structure layout patterns 1314c, 1328c), a fourth pin (e.g., conductive structure layout patterns 1414d, 1428d), a fifth pin (e.g., conductive structure layout patterns 1514e, 1528e) and a sixth pin (e.g., conductive structure layout patterns 1614f, 1628f). In some embodiments, layout design 1600 illustrates that the locations of elements in the hexa-output pin are adjustable to be in other positions, and the number of elements in the hexa-output pin are adjustable to be other numbers. Other configurations, locations or number of elements in layout design 1600 of FIG. 16 are within the scope of the present disclosure.

In comparison with layout design 1500 of FIG. 15, layout design 1600 further includes a conductive structure layout pattern 1614f between conductive structure layout patterns 1314c and 1514e, and a conductive structure layout pattern 1628f between conductive structure layout patterns 1328c and 1528e. Conductive structure layout pattern 1614f, 1628f are similar to corresponding conductive structure layout patterns 1114a, 1128a, and similar detailed description of these layout patterns is therefore omitted.

In comparison with layout design 1500 of FIG. 15, layout design 1600 further includes via layout patterns 1618k, 1624k, 1630k, 1618l, 1624l and 1630l similar to corresponding via layout patterns 1118a, 1124a, 1130a, 1118c, 1124c and 1130c, and similar detailed description of these layout patterns is therefore omitted.

Each of via layout patterns 1618k, 1624k and 1630k are positioned between corresponding via layout patterns 1318e, 1324e and 1330e and corresponding via layout patterns 1518i, 1524i and 1530i. Each of via layout patterns 1618l, 1624l and 1630l are positioned between corresponding via layout patterns 1318f, 1324f and 1330f and corresponding via layout patterns 1518j, 1524j and 1530j.

In some embodiments, by utilizing layout design 1600 yields a metal mesh structure configured as a hexa-output pin. In some embodiments, by utilizing layout design 1600, the number of via layout patterns (e.g., via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g, 1430h, 1518i, 1518j, 1524i, 1524j, 1530i, 1530j, 1618k, 1618l, 1624k, 1624l, 1630k and 1630l) is increased, resulting in more connections between underlying and overlying conductive feature layout patterns (e.g., metal layers M0, M1, M2, M3 or the like), yielding lower resistance than other approaches. In some embodiments, via layout patterns 1618k, 1564k and 1630k are aligned in a stacked via configuration, yielding lower resistance than other approaches. In some embodiments, via layout patterns 1618l, 1564l and 1630l are aligned in a stacked via configuration, yielding lower resistance than other approaches. In some embodiments, conductive structure layout patterns 1114a, 1114b, 1314c, 1414d, 1514e, 1614f of the M1 layer and corresponding conductive structure layout patterns 1128a, 1128b, 1328c, 1428d, 1528e, 1628f of the M3 layer are aligned, yielding lower resistance than other approaches. In some embodiments, conductive structure layout patterns 1114a, 1114b, 1314c, 1414d, 1514e, 1614f of the M1 layer each use 1W routing track, and conductive structure layout patterns 1128a, 1128b, 1328c, 1428d, 1528e, 1628f of the M3 layer each use one M3 routing track yielding lower resistance than other approaches. In some embodiments, one or more of via layout patterns via layout patterns 1618k, 1618l, 1624k, 1624l, 1630k and 1630l. In some embodiments, as the number of via layout patterns 1118a, 1118b, 1118c, 1118d, 1124a, 1124b, 1124c, 1124d, 1130a, 1130b, 1130c, 1130d, 1318e, 1318f, 1324e, 1324f, 1330e, 1330f, 1418g, 1418h, 1424g, 1424h, 1430g, 1430h, 1518i, 1518j, 1524i, 1524j, 1530i, 1530j, 1618k, 1618l, 1624k, 1624l, 1630k and 1630l increases and the number of conductive structure layout patterns 1114a, 1114b, 1314c, 1414d, 1514e, 1614f, 1128a, 1128b, 1328c, 1428d, 1528e, 1628f increases, more output pins are provided in layout design 1600 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1600 having better speed performance than other approaches.

Figure 17:
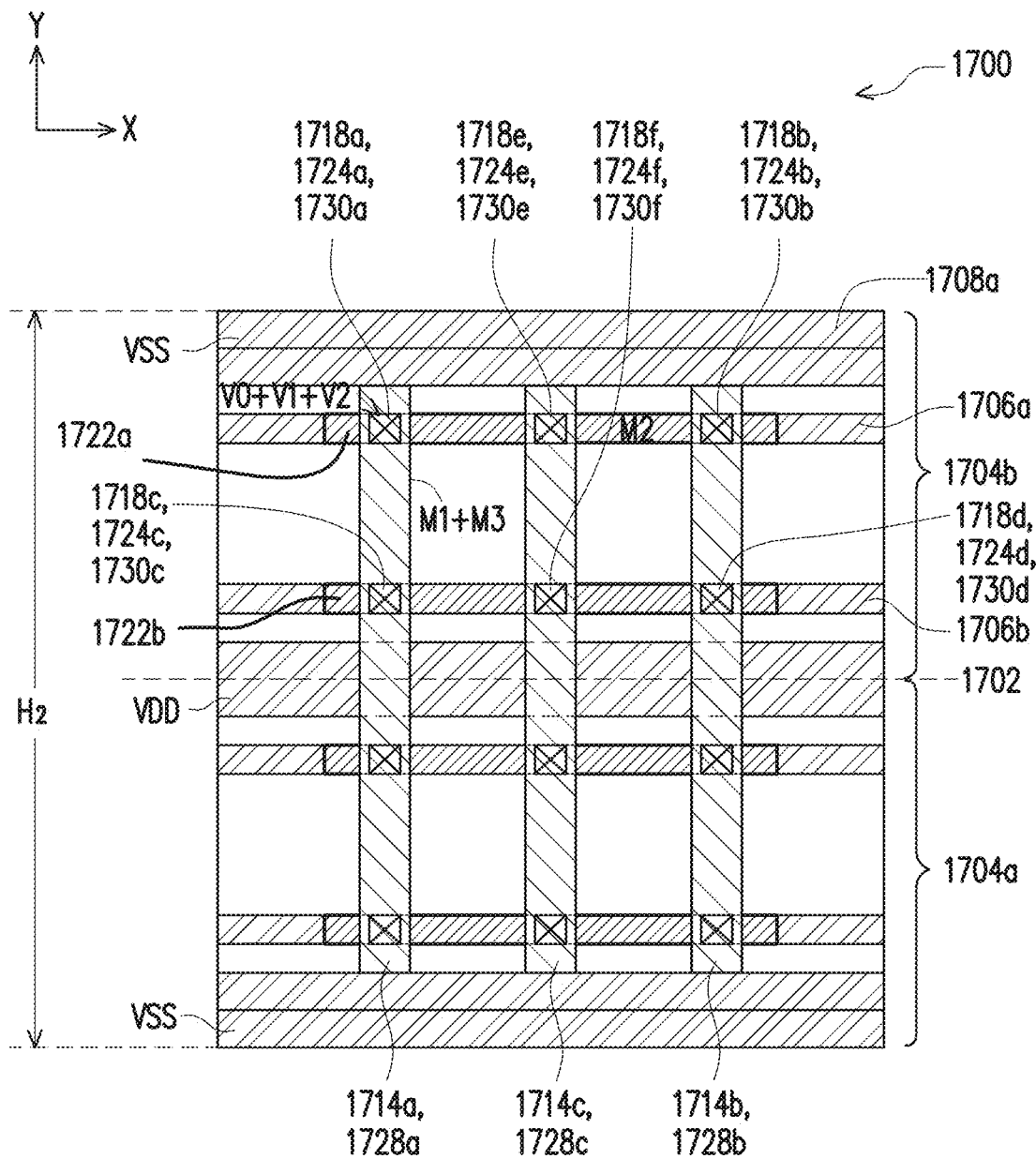
FIG. 17 is a diagram of a layout design of an IC structure, in accordance with some embodiments.

FIG. 17 is a diagram of a layout design 1700 of an IC structure, in accordance with some embodiments.

Layout design 1700 is a variation of layout design 1300 of FIG. 13. Layout design 1700 has a height H2 that is double the height H1 of one or more of layout designs 1100 and 1300-1600. In some embodiments, layout design 1700 corresponds to a layout design of a double height, triple-output pin having a first pin (e.g., conductive structure layout patterns 1714a, 1728a), a second pin (e.g., conductive structure layout patterns 1714b, 1728b) and a third pin (e.g., conductive structure layout patterns 1714c, 1728c). In some embodiments, layout design 1700 illustrates that the locations of elements in the double height, triple-output pin are adjustable to be in other positions, and the number of elements in the double height, triple-output pin are adjustable to be other numbers. Other configurations, locations or number of elements in layout design 1700 of FIG. 17 are within the scope of the present disclosure.

In comparison with layout design 1300 of FIG. 13, layout design 1700 includes a first portion 1704a and a second portion 1704b. The first portion 1704a is a minor image of the second portion 1704b with respect to a first line 1702. In some embodiments, the first portion 1704a is not a minor image of the second portion 1704b with respect to the first line 1702. Layout design 1700 is symmetric with respect to first line 1702.

The first portion 1704a includes layout patterns as described in layout pattern 1300 of FIG. 13, and similar detailed description of these layout patterns is therefore omitted.

The second portion 1704b includes a conductive structure layout pattern 1706a, a conductive structure layout pattern 1706b, a rail layout pattern 1708a, a conductive structure layout pattern 1722a, a conductive structure layout pattern 1722b, and via layout patterns 1718a, 1724a, 1730a, 1718b, 1724b, 1730b, 1718c, 1724c, 1730c, 1718d, 1724d, 1730d, 1718e, 1724e, 1730e, 1718f, 1724f and 1730f.

In comparison with layout design 1300 of FIG. 13, conductive structure layout patterns 1714a, 1728a, 1714b, 1728b, 1714c, and 1728c of layout design 1700 replace corresponding conductive structure layout patterns 1114a, 1128a, 1114b, 1128b, 1314c and 1328c. Conductive structure layout patterns 1714a, 1728a, 1714b, 1728b, 1714c, and 1728c are similar to the corresponding conductive structure layout patterns 1114a, 1128a, 1114b, 1128b, 1314c and 1328c, and similar detailed description of these layout patterns is therefore omitted.

Conductive structure layout patterns 1714a, 1728a, 1714b, 1728b, 1714c, and 1728c extend in the second direction Y to overlap the first line 1702 into the second portion 1704b of layout design 1700.

Layout patterns in the second portion 1704b are similar to corresponding layout patterns in the first portion 1704a, and similar detailed description of these layout patterns is therefore omitted.

Via layout patterns 1718a, 1724a, 1730a, 1718b, 1724b, 1730b, 1718c, 1724c, 1730c, 1718d, 1724d, 1730d, 1718e, 1724e, 1730e, 1718f, 1724f and 1730f are similar to corresponding via layout patterns 1118a, 1124a, 1130a, 1118b, 1124b, 1130b, 1118c, 1124c, 1130c, 1118d, 1124d, 1130d, 1318e, 1324e, 1330e, 1318f, 1324f and 1330f, and similar detailed description of these layout patterns is therefore omitted.

Conductive structure layout patterns 1706a, 1706b, 1722a, 1722b is similar to corresponding conductive structure layout patterns 1106a, 1106b, 1122a, 1122b and similar detailed description of these layout patterns is therefore omitted.

Rail layout pattern 1708a is similar to rail layout pattern 108a, and similar detailed description of these layout patterns is therefore omitted.

In some embodiments, by utilizing layout design 1700 yields a metal mesh structure configured as a dual-height, triple-output pin. In some embodiments, by utilizing layout design 1700, the number of via layout patterns (e.g., via layout patterns 1118*a*, 1118*b*, 1118*c*, 1118*d*, 1124*a*, 1124*b*, 1124*c*, 1124*d*, 1130*a*, 1130*b*, 1130*c*, 1130*d*, 1318*e*, 1318*f*, 1324*e*, 1324*f*, 1330*e* and 1330*f*, 1718*a*, 1718*b*, 1718*c*, 1718*d*, 1718*e*, 1718*f*, 1724*a*, 1724*b*, 1724*c*, 1724*d*, 1724*e*, 1724*f*, 1730*a*, 1730*b*, 1730*c*, 1730*d*, 1730*e* and 17300 is increased, resulting in more connections between underlying and overlying conductive feature layout patterns (e.g., metal layers M0, M1, M2, M3 or the like), yielding lower resistance than other approaches. In some embodiments, one or more of via layout patterns 1718*a*, 1724*a* and 1730*a*, or via layout patterns 1718*a*, 1724*a* and 1730*a*, or via layout patterns 1718*b*, 1724*b* and 1730*b*, or via layout patterns 1718*c*, 1724*c* and 1730*c*, or via layout patterns 1718*d*, 1724*d* and 1730*d*, or via layout patterns 1718*e*, 1724*e* and 1730*e*, or via layout patterns 1718*f*, 1724*f* and 1730*f* are aligned in a stacked via configuration, yielding lower resistance than other approaches. In some embodiments, conductive structure layout patterns 1714*a*, 1714*b*, 1714*c* of the M1 layer and corresponding conductive structure layout patterns 1728*a*, 1728*b*, 1728*c* of the M3 layer are aligned, yielding lower resistance than other approaches. In some embodiments, conductive structure layout patterns 1714*a*, 1714*b*, 1714*c* of the M1 layer each use 1W routing track, and conductive structure layout patterns 1728*a*, 1728*b*, 1728*c* of the M3 layer each use one M3 routing track yielding lower resistance than other approaches. In some embodiments, one or more of via layout patterns via layout patterns 1718*a*, 1718*b*, 1718*c*, 1718*d*, 1718*e*, 1718*f*, 1724*a*, 1724*b*, 1724*c*, 1724*d*, 1724*e*, 1724*f*, 1730*a*, 1730*b*, 1730*c*, 1730*d*, 1730*e* and 1730*f* is a square via layout pattern. In some embodiments, as the number of via layout patterns 1718*a*, 1718*b*, 1718*c*, 1718*d*, 1718*e*, 1718*f*, 1724*a*, 1724*b*, 1724*c*, 1724*d*, 1724*e*, 1724*f*, 1730*a*, 1730*b*, 1730*c*, 1730*d*, 1730*e* and 1730*f* increases and the number of conductive structure layout patterns 1714*a*, 1714*b*, 1714*c*, 1728*a*, 1728*b*, 1728*c* increases, more output pins are provided in layout design 1700 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1700 having better speed performance than other approaches.

Figure 18:
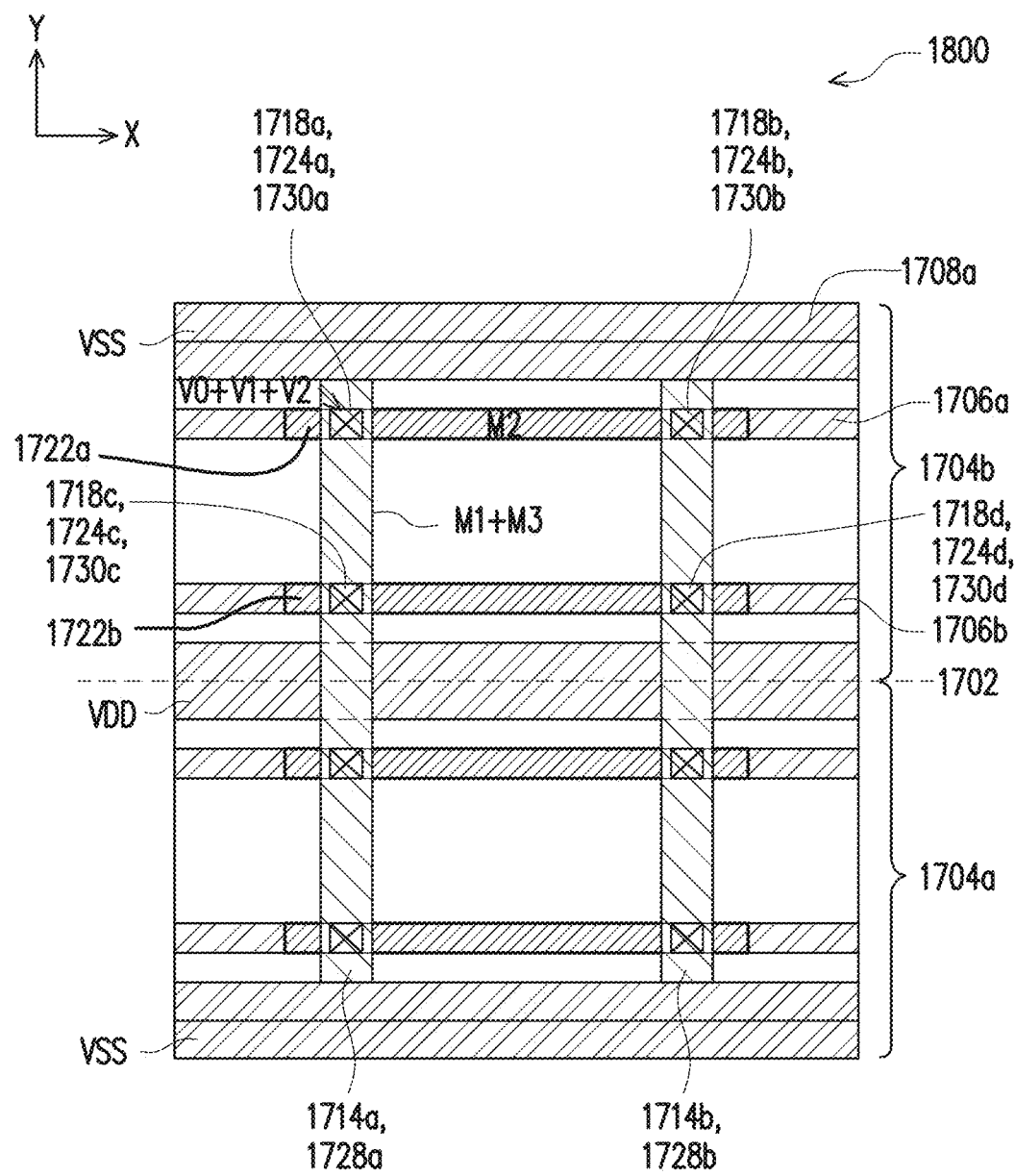
FIG. 18 is a diagram of a layout design of an IC structure, in accordance with some embodiments.

FIG. 18 is a diagram of a layout design 1800 of an IC structure, in accordance with some embodiments.

Layout design 1800 is a variation of layout design 1700 of FIG. 17. In some embodiments, layout design 1800 corresponds to a layout design of a double height, dual-output pin having a first pin (e.g., conductive structure layout patterns 1714*a*, 1728*a*) and a second pin (e.g., conductive structure layout patterns 1714*b*, 1728*b*). In some embodiments, layout design 1800 illustrates that the locations of elements in the double height, dual-output pin are adjustable to be in other positions, and the number of elements in the double height, dual-output pin are adjustable to be other numbers. Other configurations, locations or number of elements in layout design 1800 of FIG. 18 are within the scope of the present disclosure.

In comparison with layout design 1700 of FIG. 17, layout design 1800 of FIG. 18 does not include conductive structure layout patterns 1714*c* and 1728*c*, and via layout patterns 1318*e*, 1324*e*, 1330*e*, 1318*f*, 1324*f*, 1330*f*, 1718*e*, 1724*e*, 1730*e*, 1718*f*, 1724*f* and 1730*f*. Layout design 1800 has a height H2 that is double the height H1 of one or more of layout designs 1100 and 1300-1600.

In some embodiments, by utilizing layout design 1800 yields a metal mesh structure configured as a dual-height, dual-output pin. In some embodiments, by utilizing layout design 1800, the number of via layout patterns (e.g., via layout patterns 1118*a*, 1118*b*, 1118*c*, 1118*d*, 1124*a*, 1124*b*, 1124*c*, 1124*d*, 1130*a*, 1130*b*, 1130*c*, 1130*d*, 1718*a*, 1718*b*, 1718*c*, 1718*d*, 1724*a*, 1724*b*, 1724*c*, 1724*d*, 1730*a*, 1730*b*, 1730*c* and 1730*d*) is increased, resulting in more connections between underlying and overlying conductive feature layout patterns (e.g., metal layers M0, M1, M2, M3 or the like), yielding lower resistance than other approaches. In some embodiments, one or more of the via layout patterns on the V0, V1 and V2 level in layout design 1800 is in a stacked via configuration, yielding lower resistance than other approaches. In some embodiments, conductive structure layout patterns 1714*a*, 1714*b* of the M1 layer and corresponding conductive structure layout patterns 1728*a*, 1728*b* of the M3 layer are aligned, yielding lower resistance than other approaches. In some embodiments, conductive structure layout patterns 1714*a*, 1714*b* of the M1 layer each use 1W routing track, and conductive structure layout patterns 1728*a*, 1728*b* of the M3 layer each use one M3 routing track yielding lower resistance than other approaches. In some embodiments, one or more of via layout patterns via layout patterns 1118*a*, 1118*b*, 1118*c*, 1118*d*, 1124*a*, 1124*b*, 1124*c*, 1124*d*, 1130*a*, 1130*b*, 1130*c*, 1130*d*, 1718*a*, 1718*b*, 1718*c*, 1718*d*, 1724*a*, 1724*b*, 1724*c*, 1724*d*, 1730*a*, 1730*b*, 1730*c* and 1730*d* is a square via layout pattern. In some embodiments, as the number of via layout patterns 1118*a*, 1118*b*, 1118*c*, 1118*d*, 1124*a*, 1124*b*, 1124*c*, 1124*d*, 1130*a*, 1130*b*, 1130*c*, 1130*d*, 1718*a*, 1718*b*, 1718*c*, 1718*d*, 1724*a*, 1724*b*, 1724*c*, 1724*d*, 1730*a*, 1730*b*, 1730*c* and 1730*d* increases and the number of conductive structure layout patterns 1714*a*, 1714*b*, 1728*a*, 1728*b* increases, more output pins are provided in layout design 1800 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1800 having better speed performance than other approaches.

Figure 19:
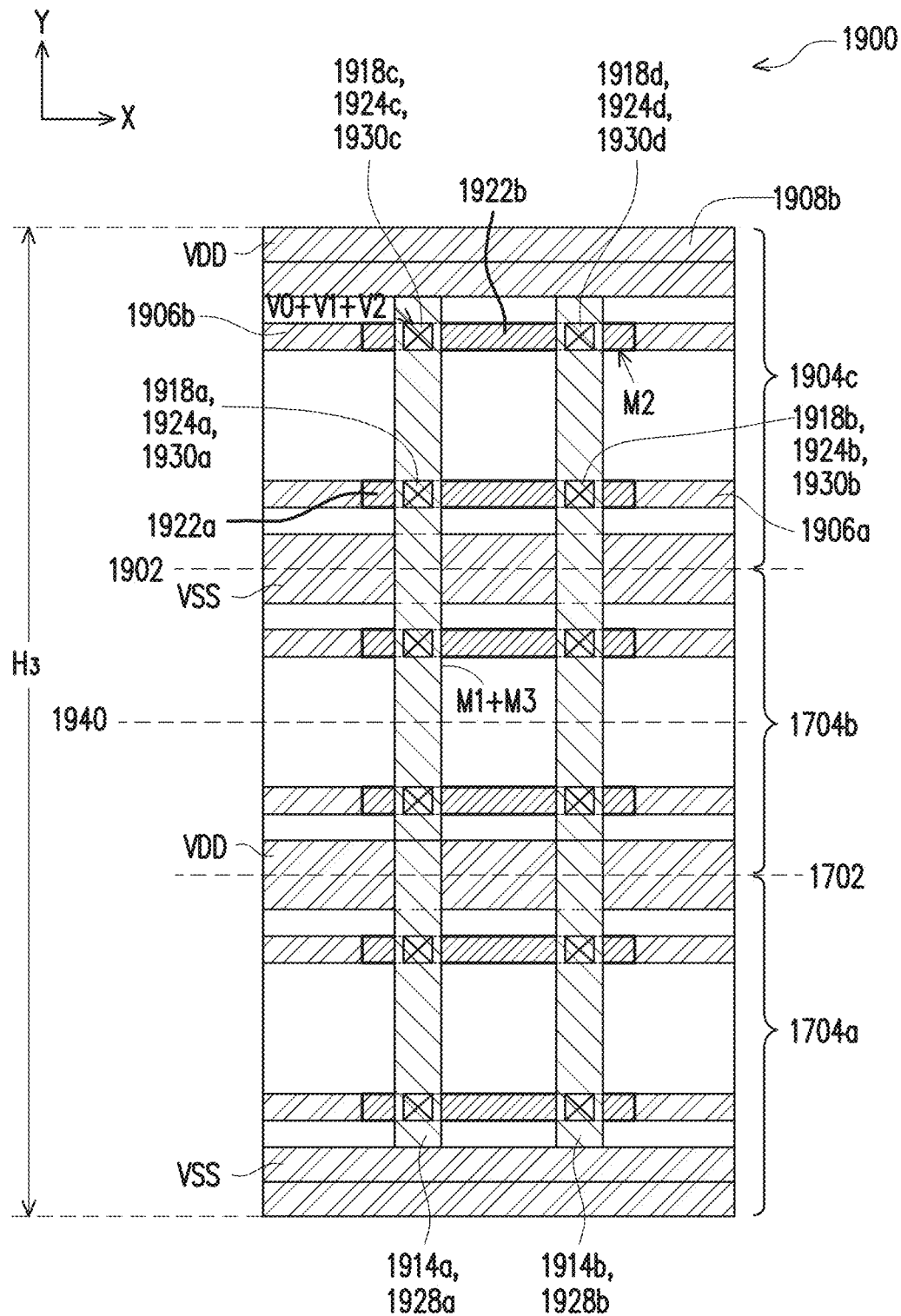
FIG. 19 is a diagram of a layout design of an IC structure, in accordance with some embodiments.

FIG. 19 is a diagram of a layout design 1900 of an IC structure, in accordance with some embodiments.

Layout design 1900 is a variation of layout design 1800 of FIG. 18. Layout design 1900 has a height H3 that is triple the height H1 of one or more of layout designs 1100 and 1300-1600. In some embodiments, layout design 1900 corresponds to a layout design of a triple height, dual-output pin having a first pin (e.g., conductive structure layout patterns 1914*a*, 1928*a*) and a second pin (e.g., conductive structure layout patterns 1914*b*, 1928*b*). In some embodiments, layout design 1900 illustrates that the locations of elements in the triple height, dual-output pin are adjustable to be in other positions, and the number of elements in the triple height, dual-output pin are adjustable to be other numbers. Other configurations, locations or number of elements in layout design 1900 of FIG. 19 are within the scope of the present disclosure.

In comparison with layout design 1800 of FIG. 18, layout design 1900 further includes a third portion 1904*c*. The third portion 1904*c* is a minor image of the second portion 1704*b* with respect to a second line 1902. In some embodiments, the third portion 1904*c* is not a minor image of the second portion 1704*b* with respect to the second line 1902. Layout design 1900 is symmetric with respect to a central line 1940.

The first portion 1704a includes layout patterns as described in layout pattern 1300 of FIG. 13, the second portion 1704b includes layout patterns as described in layout pattern 1700 of FIG. 17, and similar detailed description of these layout patterns is therefore omitted.

The third portion 1904c includes a conductive structure layout pattern 1906a, a conductive structure layout pattern 1906b, a rail layout pattern 1908b, a conductive structure layout pattern 1922a, a conductive structure layout pattern 1922b, and via layout patterns 1918a, 1924a, 1930a, 1918b, 1924b, 1930b, 1918c, 1924c, 1930c, 1918d, 1924d and 1930d.

In comparison with layout design 1800 of FIG. 18, conductive structure layout patterns 1914a, 1928a, 1914b, 1928b, 1914c, and 1928c of layout design 1900 replace corresponding conductive structure layout patterns 1714a, 1728a, 1714b, 1728b, 1714c and 1728c. Conductive structure layout patterns 1914a, 1928a, 1914b, 1928b, 1914c, and 1928c are similar to corresponding conductive structure layout patterns 1714a, 1728a, 1714b, 1728b, 1714c, and 1728c, and similar detailed description of these layout patterns is therefore omitted.

Conductive structure layout patterns 1914a, 1928a, 1914b, 1928b, 1914c, and 1928c extend in the second direction Y to overlap the first line 1702 and the second line 1902 of layout design 1900, and extend into third portion 1904c.

Layout patterns in the third portion 1904c are similar to corresponding layout patterns in the first portion 1704a or second portion 1704b, and similar detailed description of these layout patterns is therefore omitted.

Via layout patterns 1918a, 1924a, 1930a, 1918b, 1924b, 1930b, 1918c, 1924c, 1930c, 1918d, 1924d and 1930d are similar to corresponding via layout patterns 1118a, 1124a, 1130a, 1118b, 1124b, 1130b, 1118c, 1124c, 1130c, 1118d, 1124d and 1130d, or corresponding via layout patterns 1718a, 1724a, 1730a, 1718b, 1724b, 1730b, 1718c, 1724c, 1730c, 1718d, 1724d and 1730d, and similar detailed description of these layout patterns is therefore omitted.

Conductive structure layout patterns 1906a, 1906b, 1922a, 1922b is similar to corresponding conductive structure layout patterns 1106a, 1106b, 1122a, 1122b or corresponding conductive structure layout patterns 1706a, 1706b, 1722a, 1722b, and similar detailed description of these layout patterns is therefore omitted.

Rail layout pattern 1908b is similar to rail layout pattern 108b, and similar detailed description of these layout patterns is therefore omitted.

In some embodiments, by utilizing layout design 1900 yields a metal mesh structure configured as a triple-height, dual-output pin. In some embodiments, by utilizing layout design 1900, the number of via layout patterns (e.g., via layout patterns 1118a, 1118b, 1118c, 1118d, 1124a, 1124b, 1124c, 1124d, 1130a, 1130b, 1130c, 1130d, 1718a, 1718b, 1718c, 1718d, 1724a, 1724b, 1724c, 1724d, 1730a, 1730b, 1730c, 1730d, 1918a, 1918b, 1918c, 1918d, 1924a, 1924b, 1924c, 1924d, 1930a, 1930b, 1930c and 1930d) is increased, resulting in more connections between underlying and overlying conductive feature layout patterns (e.g., metal layers M0, M1, M2, M3 or the like), yielding lower resistance than other approaches. In some embodiments, one or more of via layout patterns 1918a, 1924a and 1930a, or via layout patterns 1918b, 1924b and 1930b, or via layout patterns 1918c, 1924c and 1930c or via layout patterns 1918d, 1924d and 1930d are aligned in a stacked via configuration, yielding lower resistance than other approaches. In some embodiments, conductive structure layout patterns 1914a, 1914b of the M1 layer and corresponding conductive structure layout patterns 1928a, 1928b of the M3 layer are aligned, yielding lower resistance than other approaches. In some embodiments, conductive structure layout patterns 1914a, 1914b of the M1 layer each use 1W routing track, and conductive structure layout patterns 1928a, 1928b of the M3 layer each use one M3 routing track yielding lower resistance than other approaches. In some embodiments, one or more of via layout patterns via layout patterns 1118a, 1118b, 1118c, 1118d, 1124a, 1124b, 1124c, 1124d, 1130a, 1130b, 1130c, 1130d, 1718a, 1718b, 1718c, 1718d, 1724a, 1724b, 1724c, 1724d, 1730a, 1730b, 1730c, 1730d, 1918a, 1918b, 1918c, 1918d, 1924a, 1924b, 1924c, 1924d, 1930a, 1930b, 1930c and 1930d is a square via layout pattern. In some embodiments, as the number of via layout patterns 1118a, 1118b, 1118c, 1118d, 1124a, 1124b, 1124c, 1124d, 1130a, 1130b, 1130c, 1130d, 1718a, 1718b, 1718c, 1718d, 1724a, 1724b, 1724c, 1724d, 1730a, 1730b, 1730c, 1730d, 1918a, 1918b, 1918c, 1918d, 1924a, 1924b, 1924c, 1924d, 1930a, 1930b, 1930c and 1930d increases and the number of conductive structure layout patterns 1914a, 1914b, 1928a, 1928b increases, more output pins are provided in layout design 1900 resulting in more current paths between underlying and overlying conductive feature layout patterns (e.g., metal layers M0, M1, M2, M3 or the like). In some embodiments, as the number of current paths increases, the distance of each corresponding current path is reduced resulting in layout design 1900 having better speed performance than other approaches.

FIGS. 20A-20D are diagrams of layout designs 2000A-2000D of an IC structure, in accordance with some embodiments.

Layout design 2000A includes a cell layout pattern 2002a and power pillar layout patterns 2008a and 2014a.

Cell layout pattern 2002a, 2002b (described below), 2002c (described below) or 2002d (described below) corresponds to layout design 100, 300-1000, 1300-1900, and 2100-2400 (described below), and similar detailed description is omitted. Each of cell layout patterns 2002a, 2002b, 2002c or 2002d is a layout design of a standard cell.

Figure 24:
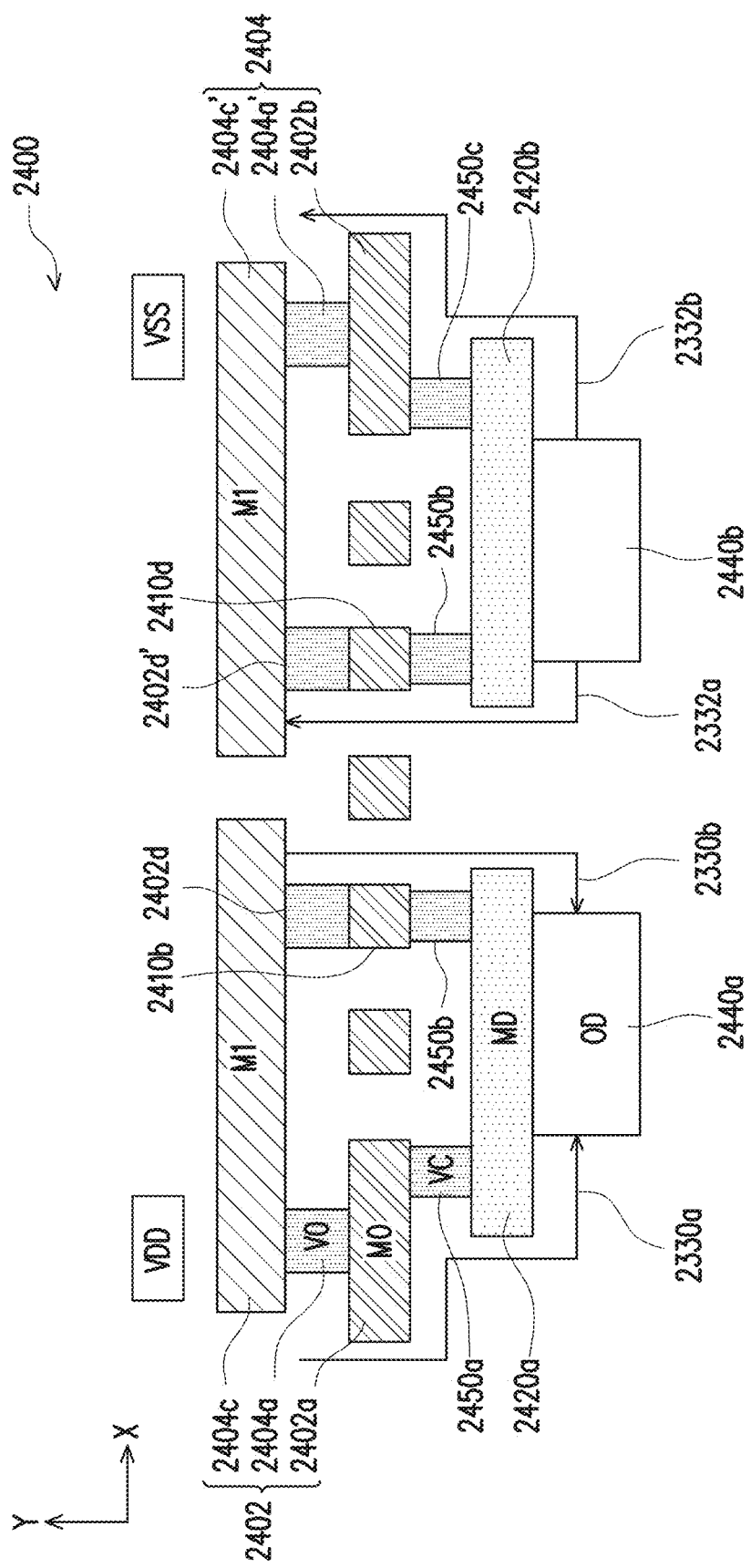
FIG. 24 is a diagram of an IC structure, in accordance with some embodiments.

Power pillar layout pattern 2008a includes a via layout pattern 2004a and a conductive structure layout pattern 2006a. Power pillar layout pattern 2008a is usable to manufacture a corresponding power pillar structure 2410a (FIG. 24).

Power pillar layout pattern 2014a includes a via layout pattern 2010a and a conductive structure layout pattern 2012a. Power pillar layout pattern 2014a is usable to manufacture a corresponding power pillar structure 2410b (FIG. 24).

In some embodiments, power pillar layout patterns 2008a, . . . , 2008d and corresponding power pillar layout patterns 2014a . . . , 2014d are embedded into corresponding cell layout pattern 2002a, 2002b, 2002c, 2202d.

One or more of power pillar layout patterns 2008a, . . . , 2008d and 2014a . . . , 2014d provide additional power pillar layout patterns to one or more cells of layout designs 2000A, 2000B, 2000C and 2000D.

Via layout patterns 2004a, 2010a are located between the second layout level (e.g., M0) and the third layout level (e.g., M1) in the V0 layout level. Via layout patterns 2004a, 2010a are usable to manufacture corresponding vias 2418a, 2418b (FIG. 24). Via layout patterns 2004a, 2010a are similar to corresponding via layout patterns 1118a, 1118b, and similar detailed description is omitted.

Conductive structure layout patterns 2006a, 2012a are located on the second layout level (e.g., M0). Conductive structure layout patterns 2006a, 2012a are usable to manufacture corresponding conductive structures 2414a, 2414b (FIG. 24). Conductive structure layout patterns 2006a, 2012a are similar to corresponding conductive structure layout patterns 1114a, 1114b, and similar detailed description is omitted.

Layout design 2000B, 2000C or 2000D is similar to layout design 2000A, and similar detailed description is omitted. Each of layout designs 2000B, 2000C and 2000D are variations of layout design 2000A. For example, layout design 2000B corresponds to layout design 2000A with a different width in the first direction X. Similarly, layout designs 2000C and 2000D each also have a different width in the first direction X than layout design 2000A. In some embodiments, one or more of layout designs 2000A, 2000B, 2000C and 2000D have a same width in the first direction X as another layout design of layout designs 2000A, 2000B, 2000C and 2000D.

Each of the elements within layout design 2000B, 2000C or 2000D is similar to the corresponding elements in layout design 2000A, and similar detailed description of these layout patterns is therefore omitted.

In comparison with layout design 2000A of FIG. 20A, power pillar layout patterns 2008b, 2014b of layout design 2000B replace corresponding power pillar layout patterns 2008a, 2014a, cell layout pattern 2002b of layout design 2000B replaces cell layout pattern 2002a, conductive structure layout patterns 2006b, 2012b of layout design 2000B replace corresponding conductive structure layout patterns 2006a, 2012a, and via layout patterns 2000b, 2010b of layout design 2000B replace corresponding via layout patterns 2004a, 2010a.

In comparison with layout design 2000A of FIG. 20A, power pillar layout patterns 2008c, 2014c of layout design 2000C replace corresponding power pillar layout patterns 2008a, 2014a, cell layout pattern 2002c of layout design 2000C replaces cell layout pattern 2002a, conductive structure layout patterns 2006c, 2012c of layout design 2000C replace corresponding conductive structure layout patterns 2006a, 2012a, and via layout patterns 2000c, 2010c of layout design 2000C replace corresponding via layout patterns 2004a, 2010a.

In comparison with layout design 2000A of FIG. 20A, power pillar layout patterns 2008d, 2014d of layout design 2000D replace corresponding power pillar layout patterns 2008a, 2014a, cell layout pattern 2002d of layout design 2000D replaces cell layout pattern 2002a, conductive structure layout patterns 2006d, 2012d of layout design 2000D replace corresponding conductive structure layout patterns 2006a, 2012a, and via layout patterns 2000d, 2010d of layout design 2000D replace corresponding via layout patterns 2004a, 2010a.

Cell layout pattern 2002b, 2002c or 2002d corresponds to layout design 100, 300-1000, 1300-1900, and 2100-2400 (described below), and similar detailed description is omitted. Cell layout pattern 2002b, 2002c or 2002d is a layout design of a standard cell.

Figure 21A:
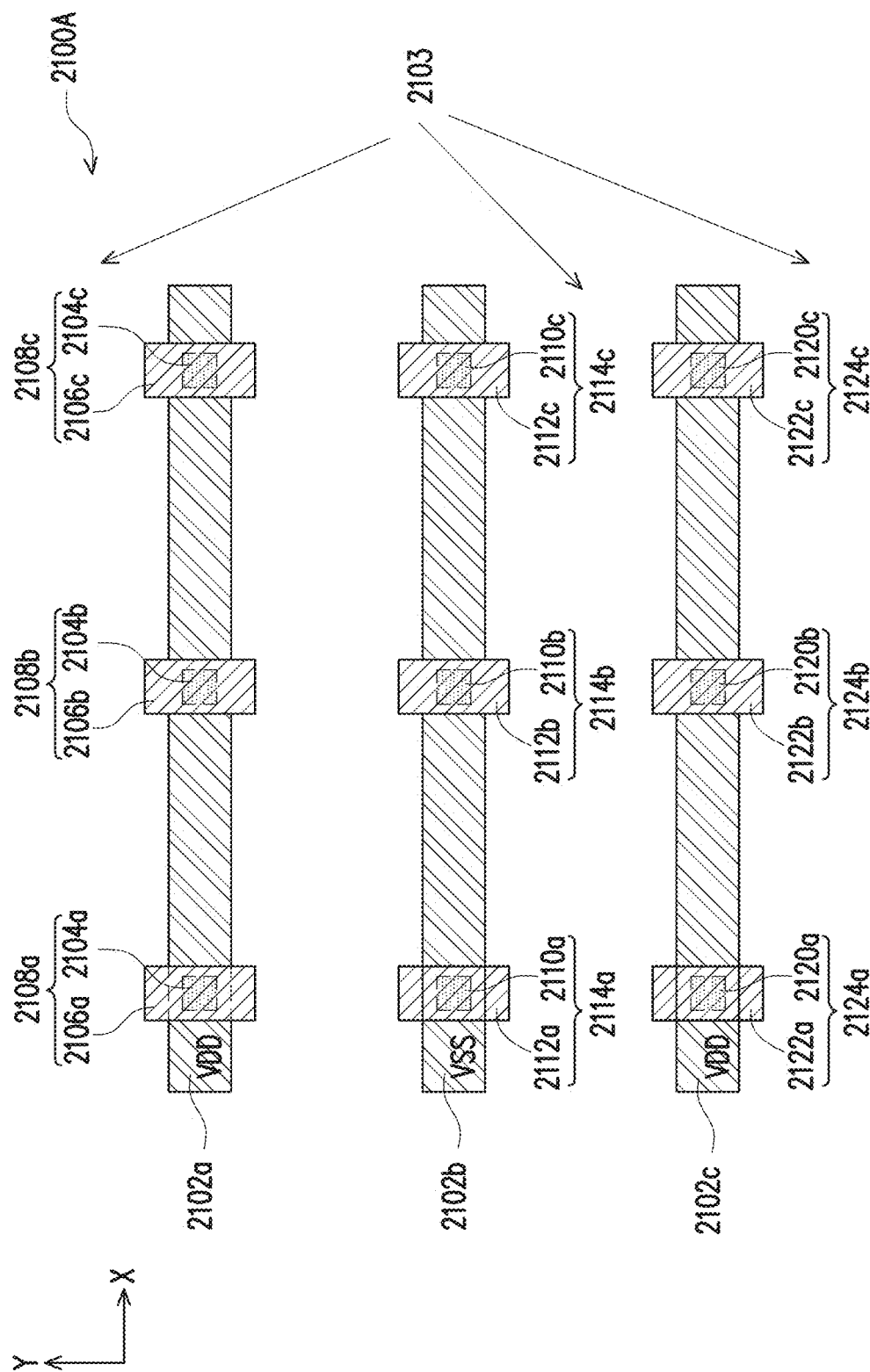
FIG. 21A is a diagram of a layout design of an IC structure, in accordance with some embodiments.

FIG. 21A is diagram of a layout design 2100A of an IC structure, in accordance with some embodiments.

Layout design 2100A includes rail layout patterns 2102a, 2102b, 2102c (collectively, referred to as "set of rail layout patterns 2102") each extending in the first direction X and separated from one another in the second direction Y. Set of rail layout patterns 2102 is on the second layout level (e.g., M0). Set of rail layout patterns 2102 is usable to manufacture rail structures 2402a, 2402b (FIG. 24). Set of rail layout patterns 2102 is similar to set of rail layout patterns 108a, 108b, and detailed description is omitted.

Layout design 2100A further includes a set of power pillar layout patterns 2103 arranged in rows and columns. For ease of illustration, the arrow identifying the set of power pillar layout patterns 2103 points to power pillar layout patterns 2108c, 2110c, 2124c. However, the set of power pillar layout patterns 2103 also refers to one or more members not identified in FIG. 2100A (e.g., one or more of power pillar layout patterns 2108a, 2108b, 2108c, 2114a, . . . , 2114c, or 2124a, . . . , 2124c). Other configurations of power pillar layout patterns, via layout patterns or conductive structure layout patterns are within the scope of the present disclosure.

Set of power pillar layout patterns 2103 includes one or more of power pillar layout patterns 2108a, 2108b, 2108c, 2114a, 2114b, 2114c, 2124a, 2124b and 2124c.

One or more of power pillar layout patterns 2108a, 2108b, 2108c, 2124a, 2124b and 2124c is usable to manufacture power pillar structure (e.g., source conductive structure 2402 FIG. 24) coupled to the first supply voltage VDD. One or more of power pillar layout patterns 2114a, 2114b and 2114c is usable to manufacture power pillar structure (e.g., source conductive structure 2404 FIG. 24) coupled to the second supply voltage VSS.

Each of power pillar layout patterns 2108a, 2108b, 2108c includes a corresponding via layout pattern 2104a, 2104b, 2104c and a corresponding conductive structure layout pattern 2106a, 2106, 2106c. Each of power pillar layout patterns 2114a, 2114b, 2114c includes a corresponding via layout pattern 2110a, 2110b, 2110c and a corresponding conductive structure layout pattern 2112a, 2112b, 2112c. Each of power pillar layout patterns 2124a, 2124b, 2124c includes a corresponding via layout pattern 2120a, 2120b, 2120c and a corresponding conductive structure layout pattern 2122a, 2122b, 2122c.

Each of via layout patterns 2104a, . . . , 2104c is located where corresponding conductive structure layout pattern 2106a, . . . , 2106c overlaps rail layout pattern 2102a. Similarly, each of via layout patterns 2110a, . . . , 2110c and 2120a, . . . , 2120c is located where corresponding conductive structure layout patterns 2112a, . . . , 2112c and 2122a, . . . , 2122c overlaps corresponding rail layout pattern 2102b and 2102c.

In some embodiments, power pillar patterns 2108a, 2108b, 2108c, 2114a, 2114b, 2114c, 2124a, 2124b and 2124c of FIG. 21A are referred to as part of a chip level design, and power pillar patterns 2108a, 2108b, 2108c, 2114a, 2114b, 2114c, 2124a, 2124b and 2124c of FIG. 20 are referred to as part of a cell level design.

Figure 21B:
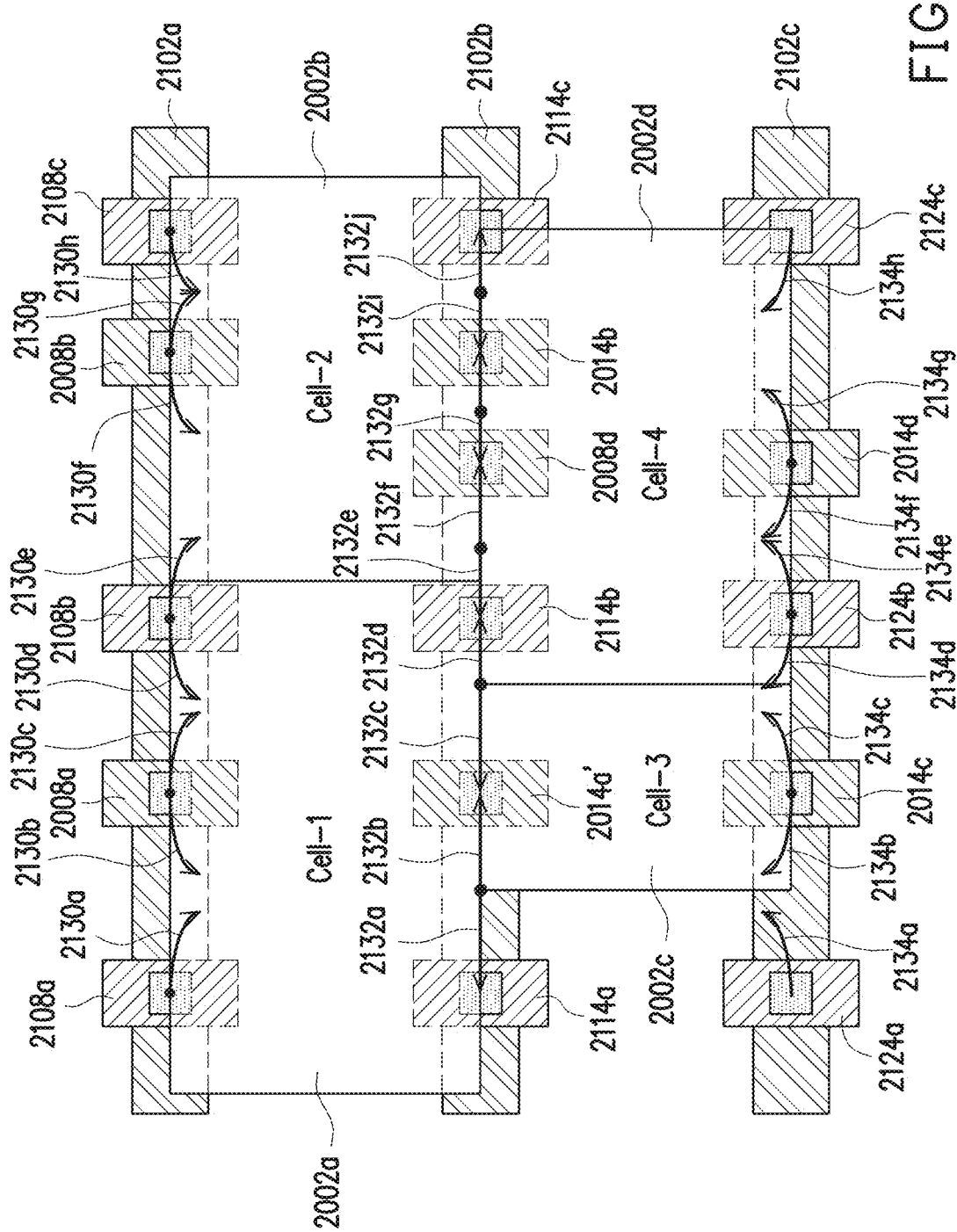
FIG. 21B is diagram of a layout design of an IC structure, in accordance with some embodiments.

FIG. 21B is diagram of a layout design 2100B of an IC structure, in accordance with some embodiments.

Layout design 2100B is a variation of layout design 2100A of FIG. 21A and layout design 2000 of FIG. 20. Layout design 2100B combines layout design 2100A of FIG. 21A and layout design 2000 of FIG. 20.

Figure 28:
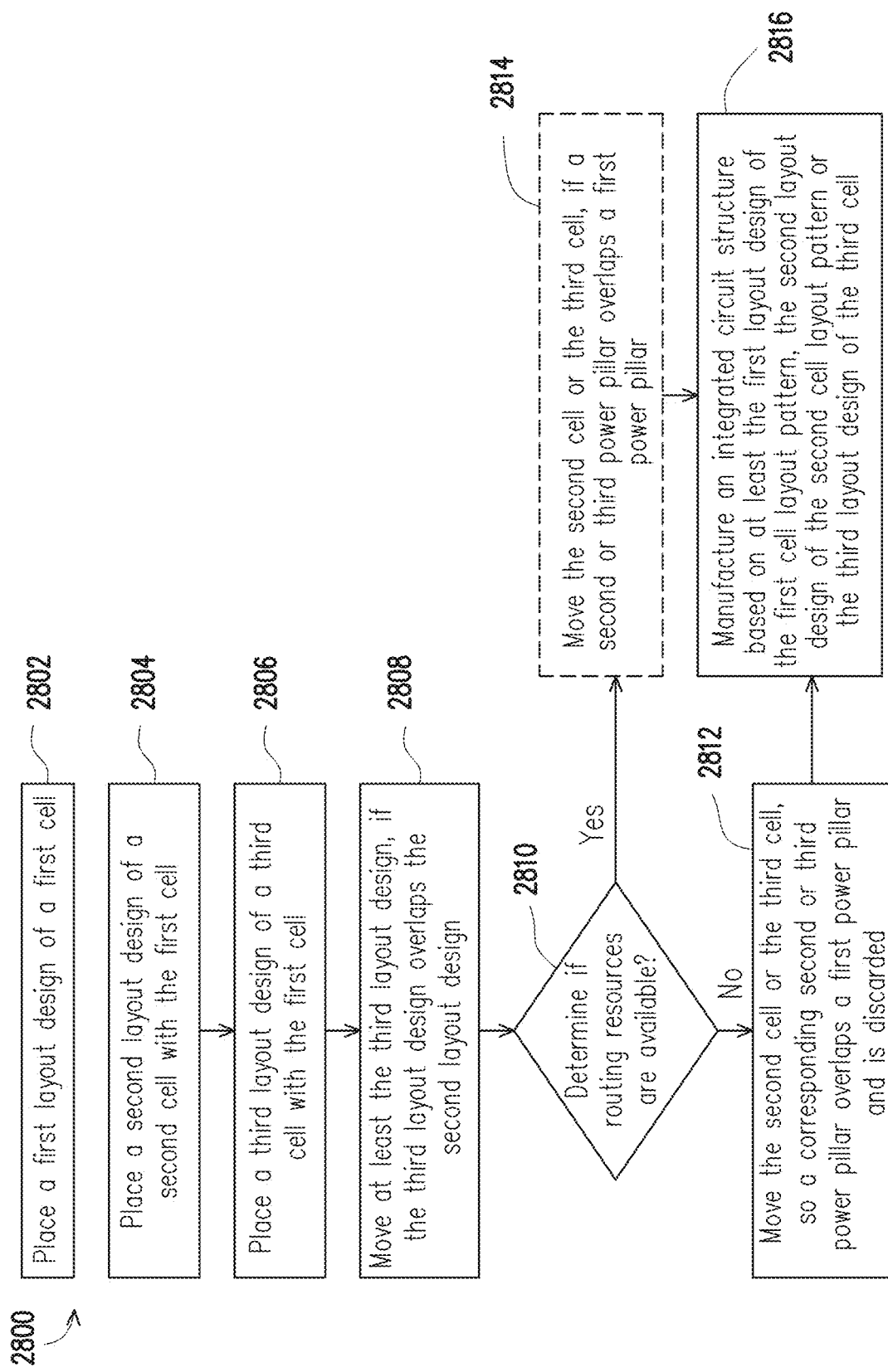
FIG. 28 is a flowchart of a method of forming an IC structure, in accordance with some embodiments.

Cell layout patterns 2002a and 2002b are placed directly next to each other. In some embodiments, placement of cell layout patterns 2002a and 2002b corresponds to operation 2806 (FIG. 28).

Each of cell layout patterns 2002a and 2002b are placed over rail layout pattern 2102a and 2102b.

Cell layout patterns 2002c and 2002d are placed directly next to each other. Each of cell layout patterns 2002c and 2002d are placed over rail layout patterns 2102b and 2102c. In some embodiments, placement of cell layout patterns 2002c and 2002d corresponds to operation 2806 (FIG. 28).

In some embodiments, layout design 2100B is an example layout design after one or more of operations 2802-2814 of method 2800 of FIG. 28, and details of placing layout designs is described in more detail below in FIG. 28.

Power pillar layout pattern 2108a provides a current path 2130a to cell layout pattern 2002a. Power pillar layout pattern 2108b provides a current path 2130d to cell layout pattern 2002a, and a current path 2130e to cell layout pattern 2002b. Power pillar layout pattern 2108c provides a current path 2130h to cell layout pattern 2002b. In some embodiments, as shown in FIG. 21B, current paths provided from power pillar layout patterns (e.g., power pillar layout pattern 2108a or 2124a) to cell layout patterns (e.g., cell layout pattern 2002a or 2002c) are shown with curved lines (e.g., current path 2130a or 2134a) in the direction of the cell layout pattern. For example, current path 2130a is provided from power pillar layout pattern 2108a to cell layout pattern 2002a, and current path 2130a is curved towards cell layout pattern 2002a. Similarly, current path 2134a is provided from power pillar layout pattern 2124a to cell layout pattern 2002c, and current path 2134a is curved towards cell layout pattern 2002c. In some embodiments, as shown in FIG. 21B, current paths provided from cell layout patterns (e.g., cell layout pattern 2002a or 2002c) to power pillar layout patterns (e.g., power pillar layout pattern 2114a or 2014a') are shown with straight lines (e.g., current path 2132a or 2132b) in the direction of the power pillar layout patterns. For example, current path 2132a is provided from cell layout pattern 2002a to power pillar layout pattern 2114a, and current path 2132a is a straight line in the direction of power pillar layout pattern 2114a. Similarly, current path 2132b is provided from cell layout pattern 2002c to power pillar layout pattern 2014a', and current path 2132b is a straight line in the direction of power pillar layout pattern 2014a'.

A current path 2132a is provided from cell layout pattern 2002a to power pillar layout pattern 2114a. A current path 2132d is provided from cell layout pattern 2002a and 2002c to power pillar layout pattern 2114b. A current path 2132e is provided from each of cell layout patterns 2002b and 2002d to power pillar layout pattern 2114b. A current path 2132j is provided from each of cell layout patterns 2002b and 2002d to power pillar layout pattern 2114c.

Power pillar layout pattern 2124a provides a current path 2134a to cell layout pattern 2002c. Power pillar layout pattern 2124b provides a current path 2134d to cell layout pattern 2002c and a current path 2132e to cell layout pattern 2002d. Power pillar layout pattern 2124c provides a current path 2134h to cell layout pattern 2002d.

Power pillar layout pattern 2008a provides additional current paths 2130b, 2130c to cell layout pattern 2002a. Power pillar layout pattern 2008b provides additional current paths 2130f, 2130g to cell layout pattern 2002b.

Additional current paths 2132b, 2132c are provided from cell layout pattern 2002a or 2002c to power pillar layout pattern 2014a'. Additional current paths 2132f, 2132g are provided from cell layout pattern 2002b or 2002d to power pillar layout pattern 2008d. Additional current paths 2132h, 2132i are provided from cell layout pattern 2002b and 2002d to power pillar layout pattern 2014b.

Power pillar layout pattern 2014c provides additional current paths 2134b, 2134c to cell layout pattern 2002c. Power pillar layout pattern 2014d provides additional current paths 2134f, 2134g to cell layout pattern 2002d.

In some embodiments, one or more of current paths 2132b, 2132c, 2132f, 2132g, 2132h, 2132i, 2134b, 2134c, 2134d are referred to as additional current paths because they provide paths for current to flow that are not provided by one or more of current paths 2130a, 2130d, 2130e, 2130h, 2132a, 2132d, 2132e, 2132j, 2134a, 2134d, 2134e and 2134h.

By utilizing one or more of power pillar layout patterns 2008a, 2008b, 2014a', 2008d, 2014b, 2014c or 2014d, the density of cell level embedded power pillar layout patterns and corresponding power pillars present in each of cells 2002a, 2002b, 2002c, 2002d is increased resulting in lower resistance than other approaches. Furthermore, by increasing the density of power pillar layout patterns and corresponding power pillars present in each of cells 2002a, 2002b, 2002c, 2002d, additional current paths 2130b, 2130c, 2130f, 2130g, 2132b, 2132c, 2132f, 2132g, 2132i, 2134b, 2134c, 2134f or 2134g are provided to or from each of the cells 2002a, 2002b, 2002c, 2002d and corresponding IC device (not shown) yielding better synchronized timing than other approaches.

Figure 22:
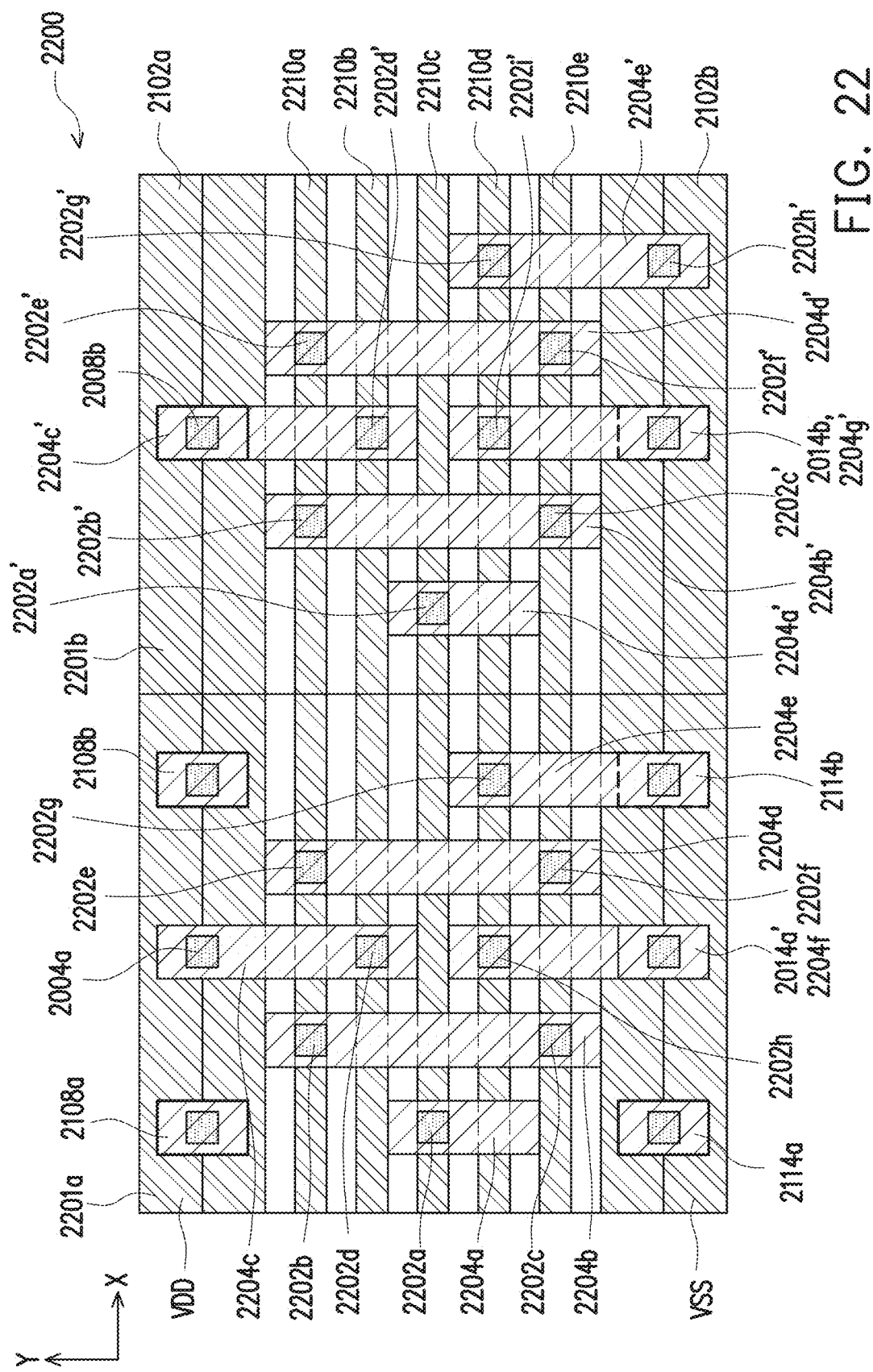
FIG. 22 is diagram of a layout design of an IC structure, in accordance with some embodiments.

FIG. 22 is diagram of a layout design 2200 of an IC structure, in accordance with some embodiments.

Layout design 2200 is a variation of layout design 2100B of FIG. 21B and layout design 2000 of FIG. 20.

In comparison with layout design 2100B of FIG. 21, layout design 2200 does not include rail layout pattern 2102c, cell 2002c, cell 2002d, and power pillar layout patterns 2014c, 2014d, 2124a, 2124b and 2124C.

In comparison with layout design 2100B of FIG. 21, cell 2201a of layout design 2200 replaces cell 2002a, and cell 2201b of layout design 2200 replaces cell 2002b.

Cell 2201a includes one or more of via layout patterns 2202a, 2202b, . . . , 2202h. Via layout patterns 2202a . . . 2202h are similar to set of via layout patterns 1118, and similar detailed description of these layout patterns is therefore omitted.

Cell 2201a further includes one or more of conductive structure layout patterns 2204a, . . . , 2204f extending in the second direction Y, and being on the third layout level (e.g., M1). Conductive structure layout pattern 2204a, . . . , 2204f are similar to conductive structure layout pattern 1128a or 1128b, and similar detailed description of these layout patterns is therefore omitted.

Cell 2201a further includes one or more conductive structure layout patterns 2210a, 2210b, . . . , 2210e (collectively referred to as "set of conductive structure layout patterns 2210") extending in the first direction X, and being on the second layout level (e.g., M0). Set of conductive structure layout patterns 2210 are similar to set of conductive structure layout patterns 1106, and similar detailed description of these layout patterns is therefore omitted.

In some embodiments, conductive structure layout pattern 2204c, via layout patterns 2004a and 2202d correspond to layout design 1000 of FIG. 10. In some embodiments, conductive structure layout pattern 2204f, via layout pattern 2202h and power pillar layout pattern 2014a' correspond to layout design 1000 of FIG. 10.

In comparison with layout design 2000A of FIG. 20A, conductive feature layout pattern 2204c and via layout patterns 2004a and 2202d of layout design 2200 replace power pillar layout pattern 2008a, and conductive feature layout pattern 2204e' and via layout patterns 2202g' and 2202h' of layout design 2200 replace power pillar layout pattern 2114c. Conductive structure layout pattern 2204e overlaps power pillar layout pattern 2114b. Power pillar layout pattern 2204c' overlaps conductive structure layout pattern 2008b.

Cell 2201b is similar to cell 2201a, and similar detailed description of these layout patterns is therefore omitted. In comparison with layout design 2100B of FIG. 2100B, cell 2201b of layout design 2200 does not include power pillar layout patterns 2008d, 2108c and 2114c. In comparison with layout design 2100B of FIG. 2100B, conductive structure layout pattern 2204e' and via layout patterns 2202g' and 2202h' of cell 2201b replace power pillar layout pattern 2114c of cell 2201a. Conductive structure layout pattern 2204c' overlaps power pillar layout pattern 2008b. Power pillar layout pattern 2014b overlaps conductive structure layout pattern 2204g'.

In some embodiments, power pillar layout pattern 2204c, 2204e, 2204c' or 2204e' are related to a source conductive structure layout pattern which is a combination of power pillar layout patterns as described in FIGS. 20A-20D, and output pin layout designs 1100 & 1300-1900 described in FIGS. 11 & 13-19.

Figure 23A:
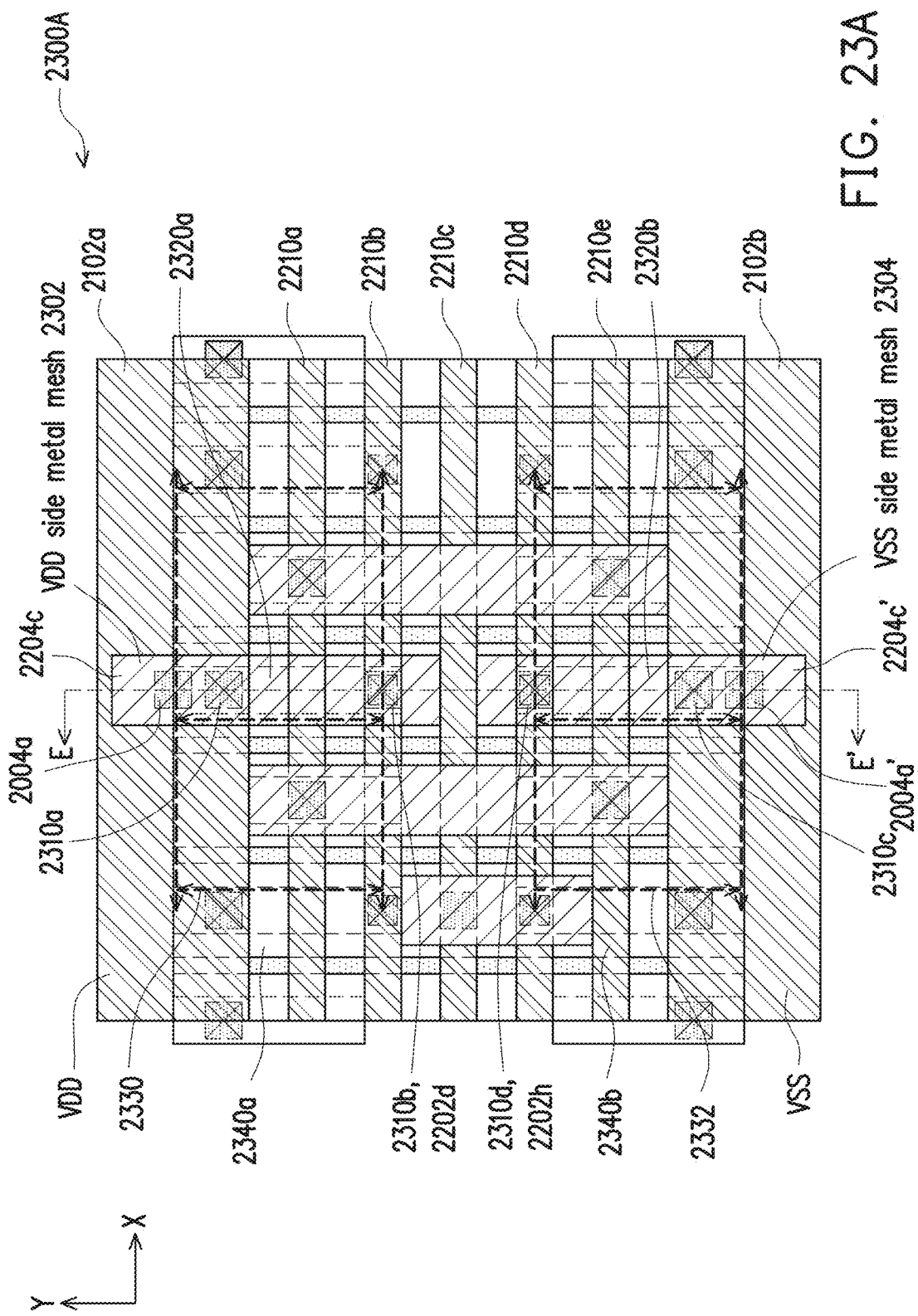
FIG. 23A is a diagram of a layout design of an IC structure, in accordance with some embodiments.

FIG. 23A is a diagram of a layout design 2300A of an IC structure, in accordance with some embodiments.

Layout design 2300A is a variation of layout design 1100 of FIG. 11, layout designs 1300-1900 of FIG. 13-19 or 2200 of FIG. 22. Layout design 2300A combines the features of layout design 2200 and layout designs 1300-1900. Layout design 2300A is a variation of layout design 2200 of FIG. 22. Layout design 2300A corresponds to cell 2201a or cell 2201b of FIG. 22. In comparison with cell 2201a of layout design 2200 of FIG. 22, layout design 2300A does not include power pillar layout pattern 2114b, via layout pattern 2202g or conductive structure layout pattern 2204e.

Layout design 2300A includes a source conductive structure layout pattern 2302 and a source conductive structure layout pattern 2304. Source conductive structure layout patterns 2302, 2304 are usable to manufacture corresponding source conductive structures 2402, 2404 (shown in FIG. 24) of IC structure 200.

Source conductive structure layout pattern 2302 or 2304 is similar to corresponding power pillar layout pattern 2204c or 2204f, and similar detailed description of these layout patterns is therefore omitted. In some embodiments, source conductive structure layout pattern 2302 or 2304 corresponds to a combination of one or more of the power pillar layout patterns (e.g., power pillar layout patterns 2008a, . . . , 2008d, 2014a . . . , 2014d, set of power pillar layout patterns 2103 or power pillar layout patterns 2204c, 2204e, 2204c', 2204e') described in FIGS. 20A-20D, and the output pin layout designs 1100 & 1300-1900 described in FIGS. 11 & 13-19.

In some embodiments, source conductive structure layout pattern 2302 corresponds to an output pin coupled to a source or drain (defined by MD region 2420a in FIG. 24) of a transistor (not shown). In some embodiments, source conductive structure layout pattern 2304 corresponds to an output pin coupled to a source or drain (defined by MD region 2420b in FIG. 24) of another transistor (not shown). In some embodiments, source conductive structure layout pattern 2302 or 2304 corresponds to one or more of layout designs 1100 and 1300-1900.

Source conductive structure layout pattern 2302 is located on the first supply voltage VDD side (e.g., overlapping rail layout pattern 2102a), and source conductive structure layout pattern 2304 is located on the second supply voltage VSS side (e.g., overlapping rail layout pattern 2102b). Source conductive structure layout pattern 2302 and source conductive structure layout pattern 2304 are located directly across from each other (e.g., a center of each layout pattern 2302 and 2304 is aligned in the second direction Y).

Source conductive structure layout pattern 2302 includes conductive structure layout pattern 2204c, via layout patterns 2004a and 2202d, rail layout pattern 2102a and conductive structure layout pattern 2210b.

Conductive structure layout pattern 2204c is usable to manufacture conductive structure 2404c (shown in FIG. 24) of IC structure 2400. Via layout patterns 2004a, 2202d are usable to manufacture corresponding vias 2404a, 2402d (shown in FIG. 24) of IC structure 2400. Rail layout pattern 2102a is usable to manufacture rail 2402a (shown in FIG. 24) of IC structure 2400. Conductive structure layout pattern 2210b is usable to manufacture conductive structure 2410b (shown in FIG. 24) of IC structure 2400.

Source conductive structure layout pattern 2304 is a minor image of source conductive structure layout pattern 2302 relative to line 2350, and similar detailed description is omitted. Source conductive structure layout pattern 2304 includes conductive structure layout pattern 2204c', via layout patterns 2004a' and 2202h, rail layout pattern 2102b and conductive structure layout pattern 2210d.

Conductive structure layout pattern 2204c' is usable to manufacture conductive structure 2404c' (shown in FIG. 24) of IC structure 2400. Via layout patterns 2004a', 2202h are usable to manufacture corresponding vias 2404a', 2402d' (shown in FIG. 24) of IC structure 2400. Rail layout pattern 2102b is usable to manufacture rail 2402b (shown in FIG. 24) of IC structure 2400. Conductive structure layout pattern 2210d is usable to manufacture conductive structure 2410d (shown in FIG. 24) of IC structure 2400.

Layout design 2300A further includes an oxide definition (OD) layout pattern 2340a, a metal diffusion (MD) layout pattern 2320a and via layout patterns 2310a, 2310b.

OD layout pattern 2340a extends in the first direction X, and is located on the OD level of layout design 2300A. OD layout pattern 2340a is usable to manufacture OD region 2440a (shown in FIG. 24) of IC structure 2400. In some embodiments, OD layout pattern 2340A defines an active or a source diffusion region of a transistor (not shown) of IC structure 2400.

Metal diffusion (MD) layout pattern 2320a extends in the second direction Y, and is located on the MD level of layout design 2300A. MD layout pattern 2320a is usable to manufacture MD region 2420 (shown in FIG. 24) of IC structure 2400.

Via layout pattern 2310a is below the MD layout pattern 2320a, and above the rail layout pattern 2102a.

Via layout pattern 2310b is below the MD layout pattern 2320a, and above the conductive structure layout pattern 2210b. In some embodiments, via layout pattern 2310a and 2310b is located on the VC level. Via layout patterns 2310a, 2310b are usable to manufacture corresponding vias 2450a and 2450b (shown in FIG. 24) of IC structure 2400.

In some embodiments, the OD level is below the MD level. In some embodiments, the MD level is below the VC level. In some embodiments, the VC level is below the M0 level.

Layout design 2300A further includes OD layout pattern 2340b, an MD layout pattern 2320b and via layout patterns 2310c, 2310d.

OD layout pattern 2340b extends in the first direction X, and is located on the OD level of layout design 2300A. OD layout pattern 2340b is usable to manufacture OD region 2440b (shown in FIG. 24) of IC structure 2400. In some embodiments, OD layout pattern 2340b defines an active or a source diffusion region of a transistor (not shown) of IC structure 2400.

MD layout pattern 2320b extends in the second direction Y, and is located on the MD level of layout design 2300A.

MD layout pattern 2320*b* is usable to manufacture MD region 2420 (shown in FIG. 24) of IC structure 2400.

Via layout pattern 2310*c* is below the MD layout pattern 2320*a*, and above the rail layout pattern 2102*b*.

Via layout pattern 2310*d* is below the MD layout pattern 2320*b*, and above the conductive structure layout pattern 2210*d*. In some embodiments, via layout pattern 2310*d* and 2310*c* are located on the VC level. Via layout patterns 2310*c*, 2310*d* are usable to manufacture corresponding vias 2450*c* and 2450*d* (shown in FIG. 24) of IC structure 2400.

A set of current paths 2330 are shown from rail layout pattern 2102*a* to OD layout pattern 2340*a*. Set of current paths 2330 includes two or more current paths. In some embodiments, source conductive structure layout pattern 2302 provides at least an additional current path of the set of current paths 2330 than other approaches.

A set of current paths 2332 are shown from OD layout pattern 2340*b* to rail layout pattern 2102*b*. Set of current paths 2332 includes two or current paths. In some embodiments, source conductive structure layout pattern 2304 provides at least an additional current path of the set of current paths 2332 than other approaches.

By utilizing source conductive structure layout pattern 2302 or 2304 (and corresponding IC structures 2402, 2404 manufactured using similar source conductive structure layout pattern 2302 or 2304), the density of cell level embedded power pillar layout patterns and corresponding power pillars present in layout design 2300A is increased resulting in lower resistance than other approaches. Furthermore, each of source conductive structure layout pattern 2302 or 2304 provides at least two current paths (e.g., current path 2330 or 2332) between rail layout pattern 2102*a* or 2102*b* and OD layout pattern 2340*a* or 2340*b* resulting in better synchronized timing operations than other approaches.

Figure 23B:
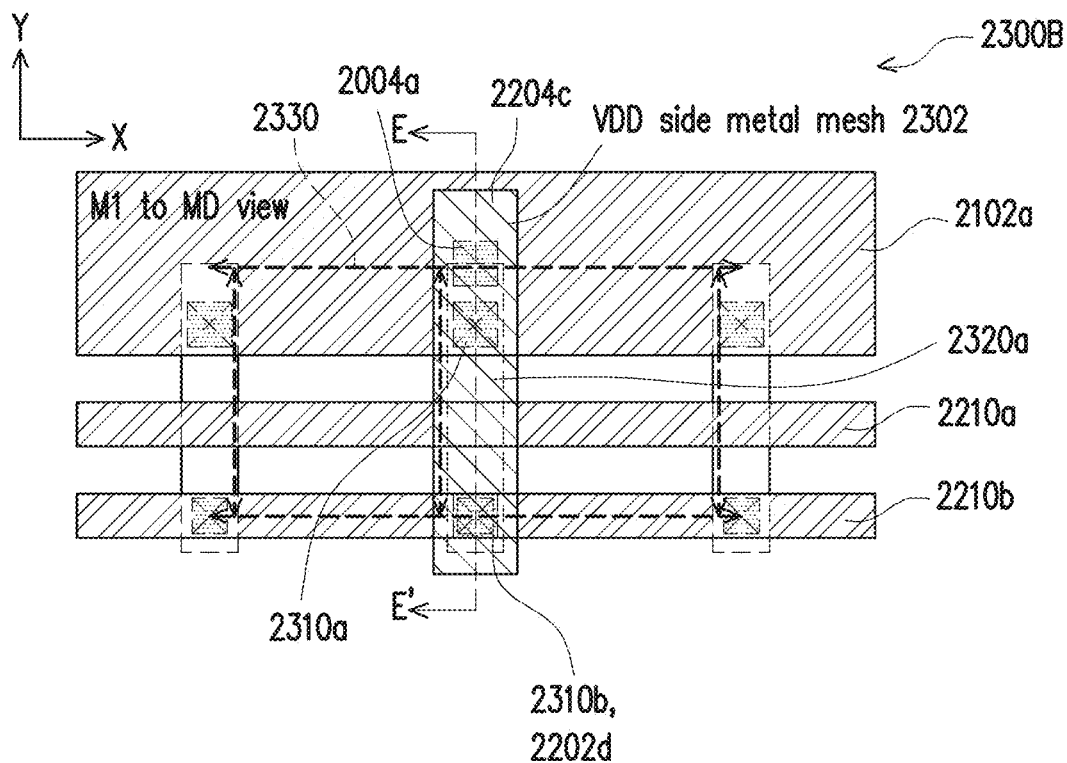
FIG. 23B is a diagram of a layout design of an IC structure, in accordance with some embodiments.

FIG. 23B is a diagram of a layout design 2300B of an IC structure, in accordance with some embodiments.

Layout design 2300B is a zoomed in portion of layout design 2300A of FIG. 23A, and for simplicity does not include other layers (e.g., OD, PO, etc.). For example, layout design 2300B illustrates a portion of layout design 2300A positioned between line 2350 and rail layout pattern 2102A from the M1 layout level to the MD layout level. For simplicity, layout design 2300 B does not include other layers.

Figure 23C:
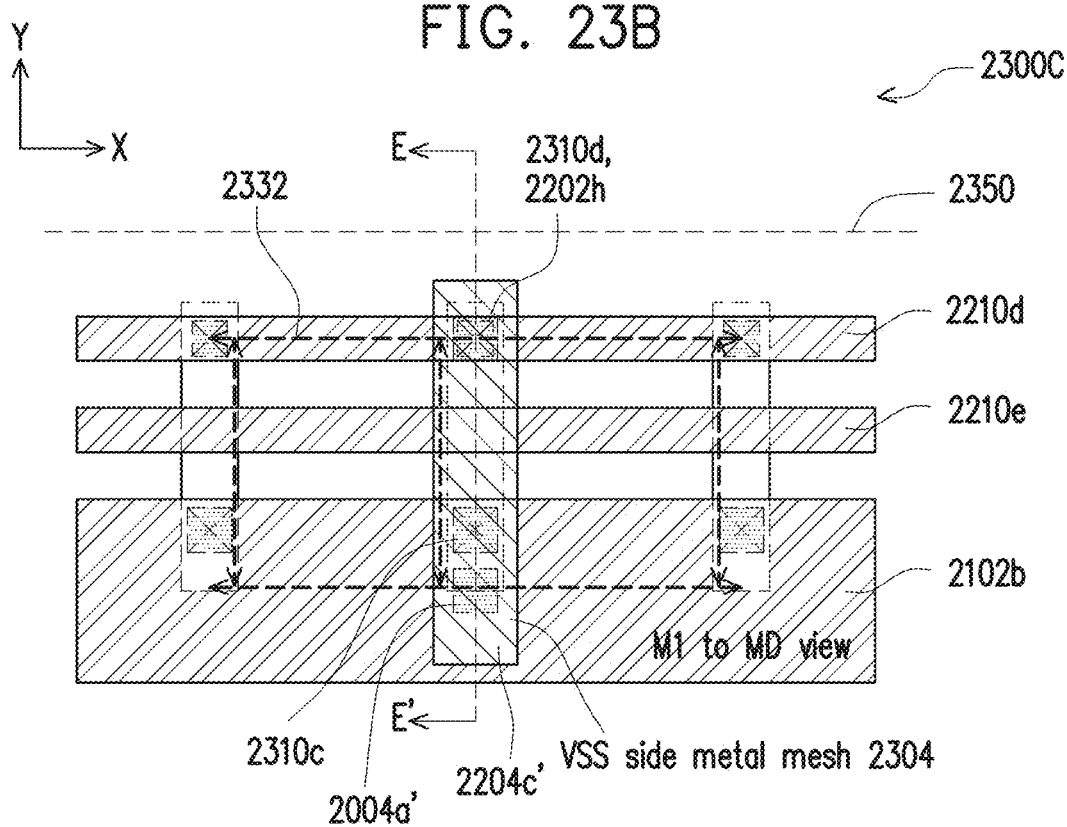
FIG. 23C is a diagram of a layout design of an IC structure, in accordance with some embodiments.

FIG. 23C is a diagram of a layout design 2300C of an IC structure, in accordance with some embodiments.

Layout design 2300C is a zoomed in portion of layout design 2300A of FIG. 23A, and for simplicity does not include other layers (e.g., OD, PO, etc.). For example, layout design 2300C illustrates a portion of layout design 2300A positioned between line 2350 and rail layout pattern 2102*b* from the M1 layout level to the M0 layout level to the MD layout level. For simplicity, layout design 2300C does not include other layers.

Figure 23D:
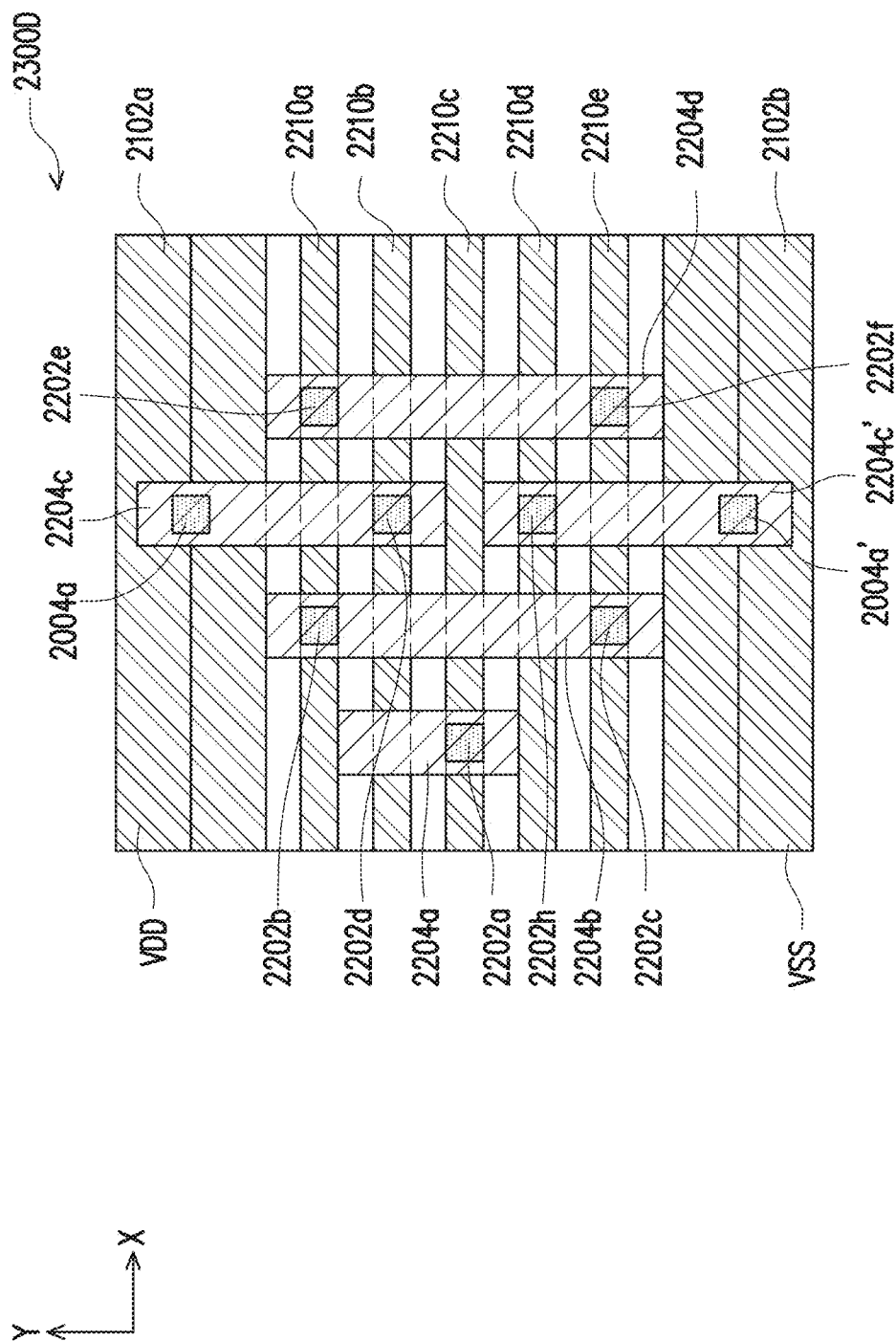
FIG. 23D is a diagram of a layout design of an IC structure, in accordance with some embodiments.

FIG. 23D is a diagram of a layout design 2300D of an IC structure, in accordance with some embodiments.

Layout design 2300D is a variation of layout design 2300A of FIG. 23A. Compared to layout design 2300A of FIG. 23A, layout design 2300D includes the M0 level, the M1 level and the V0 level. For simplicity, layout design 2300C does not include the OD level, the PO level, the MD level, and the VC level.

FIG. 24 is a diagram of an IC structure 2400, in accordance with some embodiments. FIG. 24 is a cross-sectional view of IC structure 2400 corresponding to layout design 2300A, 2300B or 2300C as intersected by plane E-E', in accordance with some embodiments. IC structure 2400 is manufactured by layout designs 2300A, 2300B or 2300C. In some embodiments, the M0 level, M1 level and the V0 level are manufactured by layout design 2300D.

Structural relationships including alignment, lengths and widths, as well as configurations of IC structure 2400 are similar to the structural relationships and configurations of layout design 2300A-2300C of FIGS. 2300A-2300C, and will not be described in FIG. 24A for the sake of brevity.

IC structure 2400 includes OD region 2440*a* and OD region 2440*b* extending in the first direction X, and being separated from each other in the second direction Y. In some embodiments, OD region 2440*a* defines an active or a source diffusion region of a first transistor (not shown) of IC structure 2400. In some embodiments, OD region 2440*b* defines an active or a source diffusion region of second transistor (not shown) of IC structure 2400. In some embodiments, the first transistor in the second transistor are integrated together in forming a transistor. In some embodiments, the first transistor is different from the second transistor. In some embodiments, the first transistor is the same as the second transistor.

IC structure 2400 further includes MD region 2420*a* and MD region 2420*b* extending in the second direction Y, and being separated from each other in the first direction X. MD region 2420*a*, 2420*b* are located on the MD level of IC structure 2400.

IC structure 2400 further includes vias 2450*a*, 2450*b*, 2450*c*, 2450*d* positioned above MD regions 2420*a*, 2420*b*. Vias 2450*a*, 2450*b*, 2450*c*, 2450*d* are located on the VC level. Vias 2450*a*, 2450*b* provide an electrical connection between M0 level and the MD level. Via 2450*a* electrically couples conductive structure 2402*a* to MD region 2420*a*. Via 2450*b* electrically couples conductive structure 2410*b* to MD region 2420*a*.

Vias 2450*c*, 2450*d* provide an electrical connection between M0 level and the MD level. Via 2450*c* electrically couples conductive structure 2402*b* to MD region 2420*b*. Via 2450*d* electrically couples conductive structure 2410*d* to MD region 2420*b*.

IC structure 2400 further includes rail 2402*a*, 2402*b* and conductive structures 2410*b*, 2410*d* on the M0 level. Each rail of rails 2402*a*, 2402*b* or each conductive structure of conductive structures 2410*b*, 2410*d* extend in the first direction X, and are spaced from each other in the second direction Y. Rail 2402*a* is configured to provide the first supply voltage VDD. Rail 2402*b* is configured to provide the second supply voltage VSS.

IC structure 2400 further includes vias 2404*a*, 2402*d*, 2404*a*', 2402*d*' positioned above the M0 level.

Vias 2404*a*, 2402*d*, 2404*a*', 2402*d*' are located on the V0 level. Vias 2404*a*, 2402*d* provide an electrical connection between M1 level and the M0 level. Via 2404*a* electrically couples conductive structure 2402*a* to conductive structure 2404*c*. Via 2402*d* electrically couples conductive structure 2410*b* to conductive structure 2404*c*.

Vias 2404*a*', 2402*d*' provide an electrical connection between M1 level and the M0 level. Via 2404*a*' electrically couples conductive structure 2402*b* to conductive structure 2404*c*'. Via 2402*d*' electrically couples conductive structure 2410*d* to conductive structure 2404*c*'.

IC structure 2400 further includes conductive structures 2404*c*, 2404*c*' on the M1 level. Each conductive structure of conductive structures 2404*c*, 2404*c*' extends in the second direction Y, and is spaced from each other in the first direction X.

Rail 2402*a*, conductive structures 2410*b*, 2404*c* and vias 2404*a*, 2402*d* are grouped together as source conductive structure 2402. In some embodiments, source conductive structure 2402, 2404 is referred to as a power pillar structure. In some embodiments, source conductive structures 2402 corresponds to an output pin coupled to a source (defined by MD region 2420a in FIG. 24) of a first transistor (not shown).

Rail 2402b, conductive structures 2410d, 2404c' and vias 2404a', 2402d' are grouped together as source conductive structure 2404. In some embodiments, source conductive structure 2404 corresponds to an output pin coupled to a source (defined by MD region 2420b in FIG. 24) of a second transistor (not shown). In some embodiments, source conductive structure 2402 or 2404 is manufactured by one or more of layout designs 1100 and 1300-1900, 2300A, 2300B, 2500A, 2500B, 2600A-2600D, 2700A-2700D. Source conductive structure 2402 or 2404 is similar to IC structure 1200 of FIG. 12. In some embodiments, source conductive structure 2402 or 2404 corresponds to a source metal mesh structure.

Source conductive structure 2402 provides at least two current paths (current paths 2330a and 2330b) from rail 2402a to OD region 2440a. In some embodiments, current path 2330a flows from rail 2402a (M0 level) to via 2450a (VC level) to MD region 2420a (MD level) to OD region 2440a (OD level) of IC structure 2400. In some embodiments, current path 2330b flows from rail 2302a (M0) to via 2404a (V0 level) to conductive structure 2404c (M1 level) to via 2402d (V0 level) to conductive structure 2410b (M0 level) to via 2450b (VC level) to MD region 2420a (MD level) to OD region 2440a (OD level). Source conductive structure 2402 provides two or more current paths (e.g., current path 2330a and 2330b) between rail 2402a and OD region 2440a resulting in better synchronized timing operations than other approaches.

Source conductive structure 2404 provides at least two current paths (current paths 2332a and 2332b) from OD region 2440b to rail 2402b. In some embodiments, current path 2332a flows from OD region 2440b (OD level) to MD region 2420b (MD level) to via 2450b (VC level) to conductive structure 2410d (M0 level) to via 2402d' (V0 level) to conductive structure 2404c' (M1 level) to via 2404a' (V0 level) to rail 2402b (M0 level). In some embodiments, current path 2332b flows from OD region 2440b (OD level) to MD region 2420b (MD level) to via 2450c (VC level) to rail 2402b (M0 level). Source conductive structure 2404 provides two or more current paths (e.g., current path 2332a and 2332b) between OD region 2440b and rail 2402b resulting in better synchronized timing operations than other approaches.

By utilizing source conductive structure 2402, 2404, the density of embedded power pillars present in integrated circuit 2400 is increased resulting in lower resistance than other approaches. Furthermore, source conductive structure 2402 provides an additional current path (e.g., current path 2330b) between rail 2402a and OD region 2440a resulting in better synchronized timing operations than other approaches. Similarly, source conductive structure 2404 provides an additional current path (e.g., current path 2332b) between rail 2402b and OD region 2440b resulting in better synchronized timing operations than other approaches.

Figures 25A, 25B:
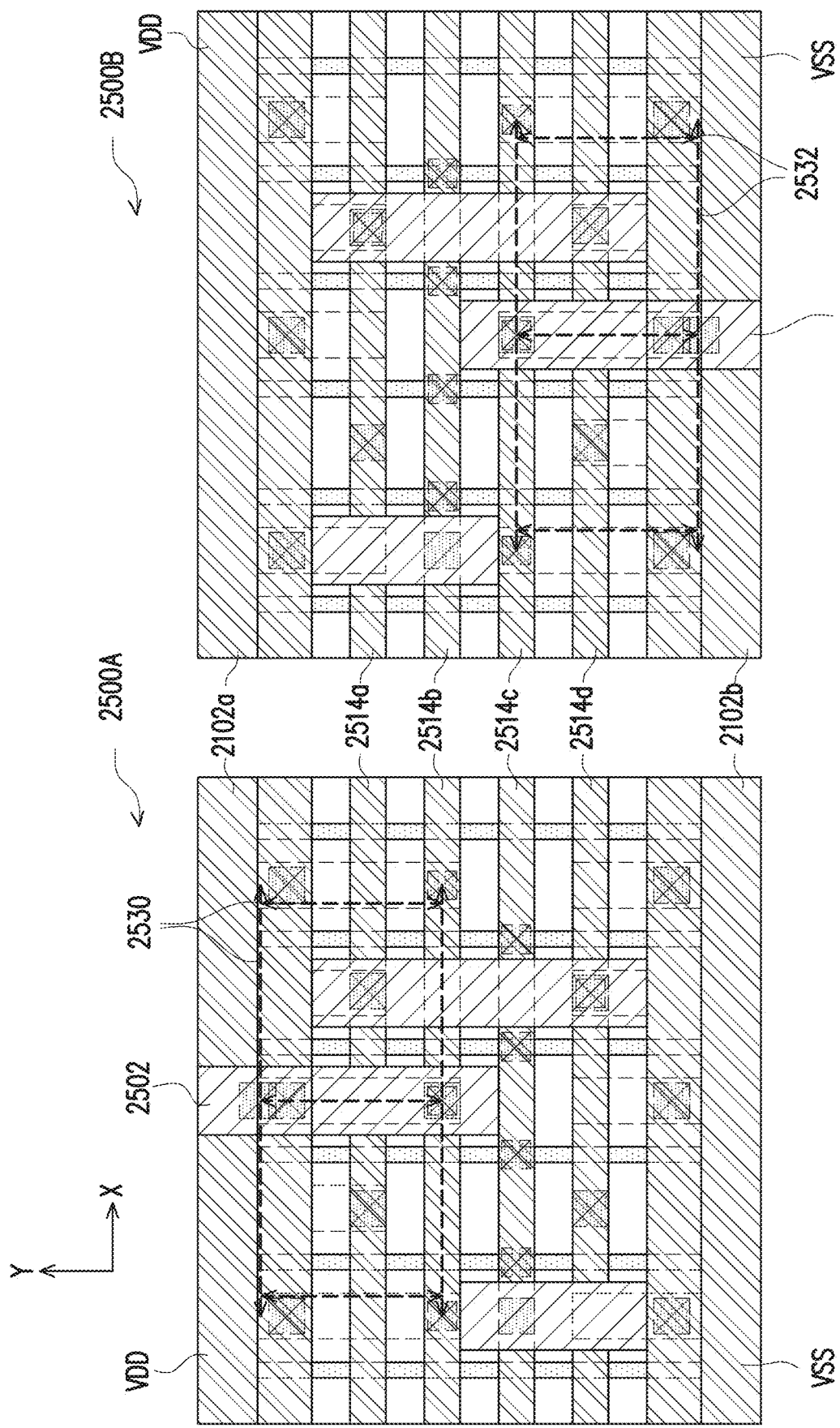
FIG. 25A is a diagram of a layout design of an IC structure, in accordance with some embodiments.
FIG. 25B is a diagram of a layout design of an IC structure, in accordance with some embodiments.

FIGS. 25A and 25B are diagrams of corresponding layout designs 2500A and 2500B of an IC structure, in accordance with some embodiments.

Layout designs 2500A and 2500B are variations of layout design 2300A of FIG. 23A.

In comparison with layout design 2300A of FIG. 23A, four M0 conductive structure layout patterns (e.g., conductive structure layout patterns 2514a-2514d) of each of layout designs 2400A and 2400B replace five M0 conductive structure layout patterns (e.g., conductive structure layout patterns 2314a-2314e). Conductive structure layout patterns 2514a-2514d are similar to conductive structure layout patterns 2314a-2314e of layout design 2300A, and similar detailed description of these layout patterns is therefore omitted.

In comparison with layout design 2300 of FIG. 23, current paths 2530, 2532 of each corresponding layout design 2500A, 2500B replace corresponding current paths 2330, 2332. Current paths 2530, 2532 are similar to current paths 2330, 2332 of layout design 2300A, and similar detailed description of these layout patterns is therefore omitted.

In comparison with layout design 2300A of FIG. 23A, source conductive structure layout patterns 2502, 2504 of corresponding layout designs 2400A, 2400B replace corresponding source conductive structure layout patterns 2302, 2304. Conductive structure layout patterns 2502, 2504 are similar to corresponding source conductive structure layout patterns 2302, 2304 of layout design 2300A, and similar detailed description of these layout patterns is therefore omitted.

Layout design 2500A of FIG. 25A illustrates source conductive structure layout pattern 2502 being located on the first supply voltage VDD side (e.g., overlapping rail layout pattern 2102a). By utilizing four M0 conductive structure layout patterns (e.g., conductive structure layout patterns 2514a-2514d) and the source metal mesh (e.g., source conductive structure layout pattern 2502) on the VDD side of power rail layout pattern 2102a, the density of cell level embedded power pillar layout patterns present in layout design 2500A is increased resulting in lower resistance than other approaches. Furthermore, source conductive structure layout pattern 2502 provides at least two current paths (e.g., set of current paths 2530) between rail layout pattern 2102a and OD layout pattern 2340a resulting in better synchronized timing operations than other approaches.

Layout design 2500B of FIG. 25B illustrates source conductive structure layout pattern 2504 being located on the second supply voltage VSS side (e.g., overlapping rail layout pattern 2102b). By utilizing four M0 conductive structure layout patterns (e.g., conductive structure layout patterns 2514a-2514d) and the source metal mesh (e.g., source conductive structure layout pattern 2504) on the VSS side of power rail layout pattern 2102b, the density of cell level embedded power pillar layout patterns present in layout design 2500B is increased resulting in lower resistance than other approaches. Furthermore, source conductive structure layout pattern 2504 provides at least two current paths (e.g., set of current paths 2532) between rail layout pattern 2102b and OD layout pattern 2340b resulting in better synchronized timing operations than other approaches.

FIGS. 26A, 26B, 26C and 26D are diagrams of corresponding layout designs 2600A, 2600B, 2600C and 2600D of an IC structure, in accordance with some embodiments.

Layout designs 2600A, 2600B, 2600C and 2600D are variations of corresponding layout design 2500A of FIG. 25A or layout design 2500B of FIG. 25B.

In comparison with layout design 2500A of FIG. 25A or layout design 2500B of FIG. 25B, five M0 conductive structure layout patterns (e.g., conductive structure layout patterns 2614a-2614e) of each of layout designs 2500A, 2500B, 2500C and 2500D replace four M0 conductive structure layout patterns (e.g., conductive structure layout patterns 2514a-2514d). Conductive structure layout patterns 2614a-2614e are similar to conductive structure layout patterns 2514a-2514d of layout designs 2500A, 2500B, 2500C and 2500D, and similar detailed description of these layout patterns is therefore omitted.

In comparison with layout design 2500A of FIG. 25A or layout design 2500B of FIG. 25B, current paths 2630a-2630d, 2632a-2632d of each corresponding layout design 2600A, 2600B, 2600C and 2600D replace corresponding current paths 2530, 2532. Current paths 2630a-2630d, 2632a-2632d are similar to current paths 2530, 2532 of layout design 2500, and similar detailed description of these layout patterns is therefore omitted.

Figure 26A:
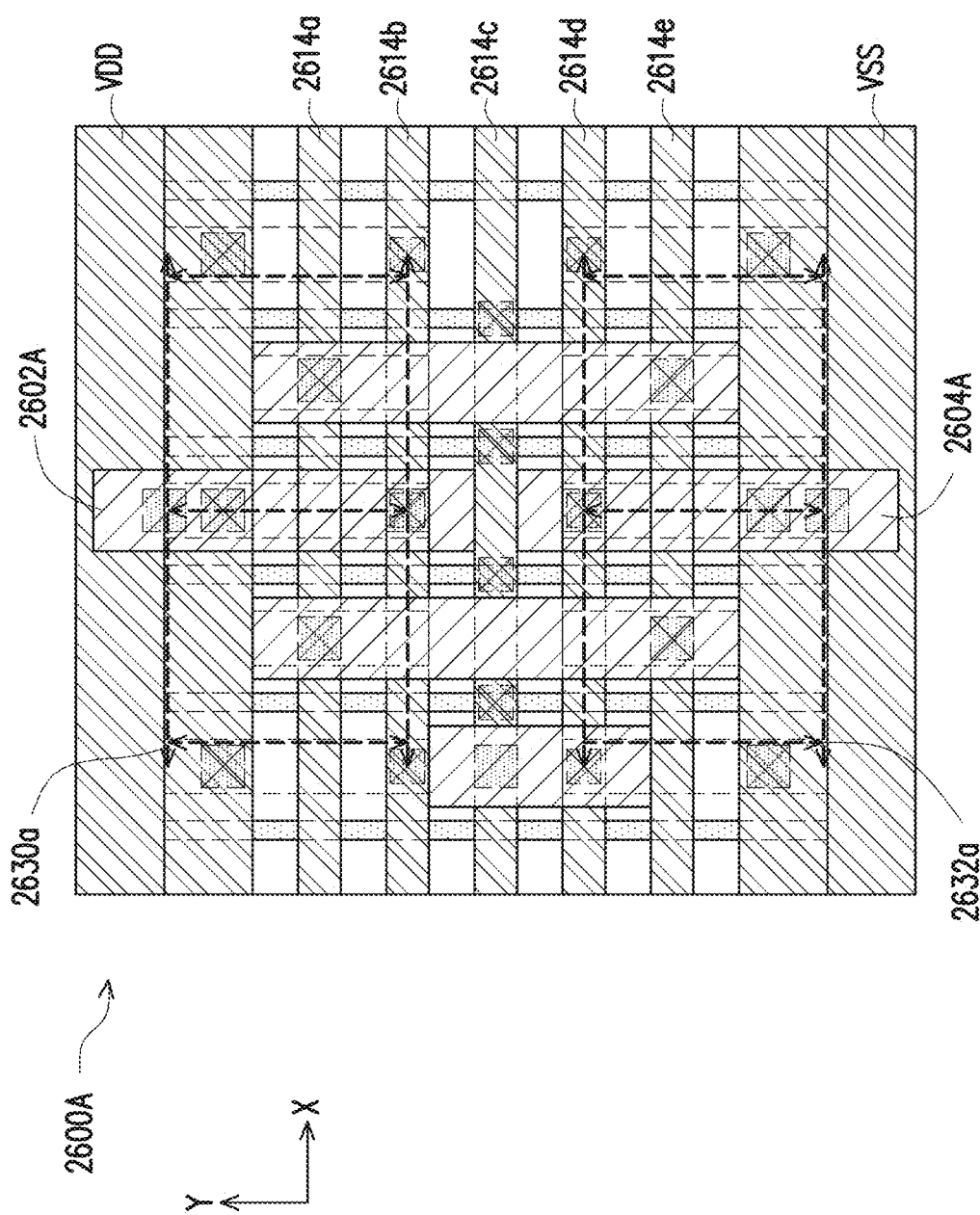
FIG. 26A is a diagram of a layout design of an IC structure, in accordance with some embodiments.

Layout design 2600A of FIG. 26A illustrates source conductive structure layout pattern 2602A and source conductive structure layout pattern 2604A being located directly across from each other (e.g., a center of each layout pattern 2602A and 2604A is aligned in the second direction Y) over the first supply voltage VDD and the second supply voltage VSS. By utilizing five M0 conductive structure layout patterns (e.g., conductive structure layout patterns 2614a-2614e), the source metal mesh (e.g., source conductive structure layout pattern 2602A) on the VDD side of power rail layout pattern 2102a, and the source metal mesh (e.g., source conductive structure layout pattern 2604A) on the VSS side of power rail layout pattern 2102b, the density of cell level embedded power pillar layout patterns present in layout design 2600A is increased resulting in lower resistance than other approaches. Furthermore, source conductive structure layout pattern 2602A provides at least two current paths (e.g., set of current paths 2630a) between rail layout pattern 2102a and OD layout pattern 2340a, and source conductive structure layout pattern 2604A provides at least two current paths (e.g., set of current paths 2632a) between rail layout pattern 2102b and OD layout pattern 2340b resulting in better synchronized timing operations than other approaches.

Figure 26B:
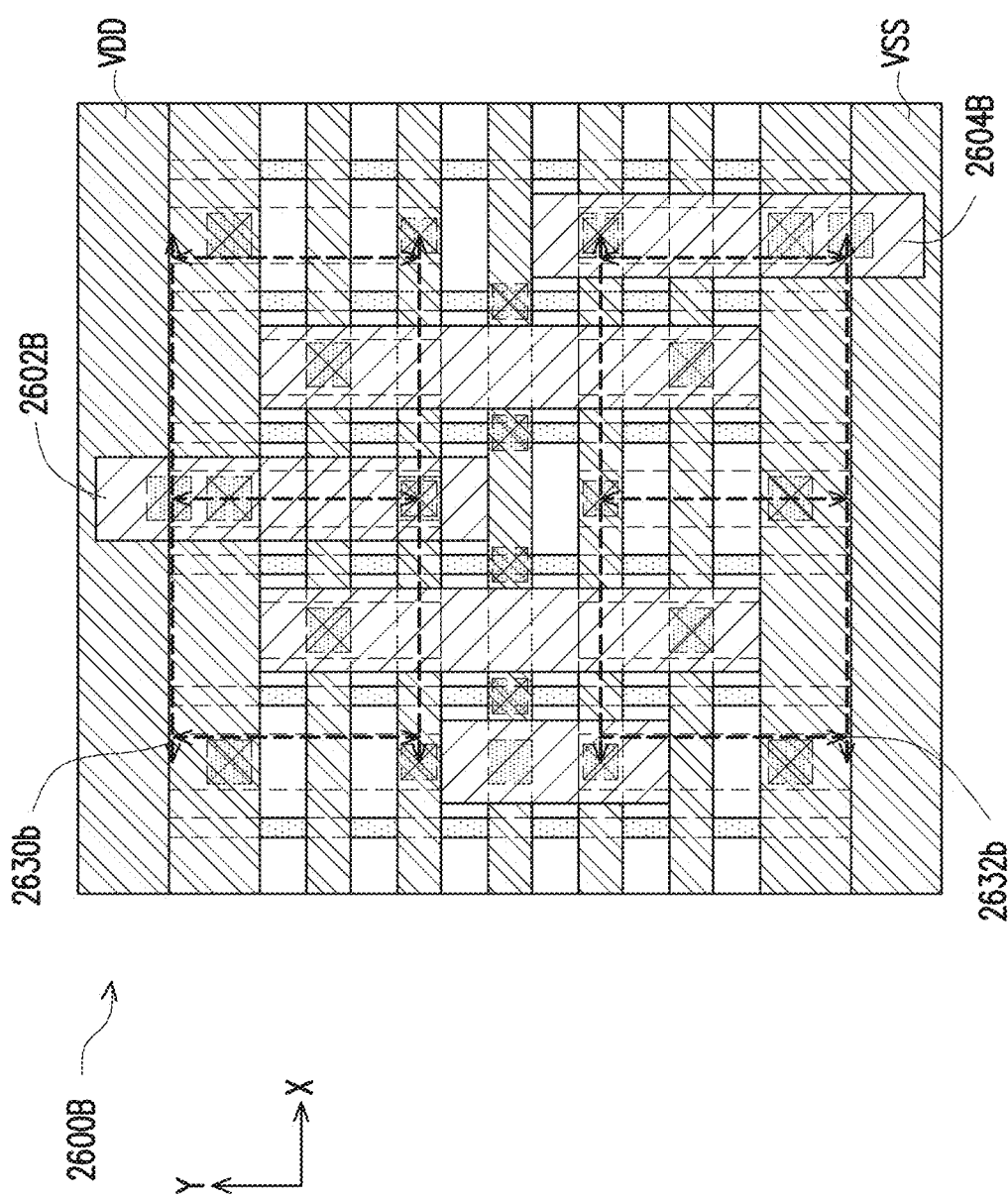
FIG. 26B is a diagram of a layout design of an IC structure, in accordance with some embodiments.

Layout design 2600B of FIG. 26B illustrates source conductive structure layout pattern 2602B and source conductive structure layout pattern 2604B being staggered from each other. (e.g., a center of each layout pattern 2602A and 2604A is not aligned in first direction X and the second direction Y). By utilizing five M0 conductive structure layout patterns (e.g., conductive structure layout patterns 2614a-2614e), the source metal mesh (e.g., source conductive structure layout pattern 2602B) on the VDD side of power rail layout pattern 2102a, and the staggered source metal mesh (e.g., source conductive structure layout pattern 2604B) on the VSS side of power rail layout pattern 2102b, the density of cell level embedded power pillar layout patterns present in layout design 2600B is increased resulting in lower resistance than other approaches. Furthermore, source conductive structure layout pattern 2602B provides at least two current paths (e.g., set of current paths 2630b) between rail layout pattern 2102a and OD layout pattern 2340a, and source conductive structure layout pattern 2604B provides at least two current paths (e.g., set of current paths 2632b) between rail layout pattern 2102b and OD layout pattern 2340b resulting in better synchronized timing operations than other approaches.

Figure 26C:
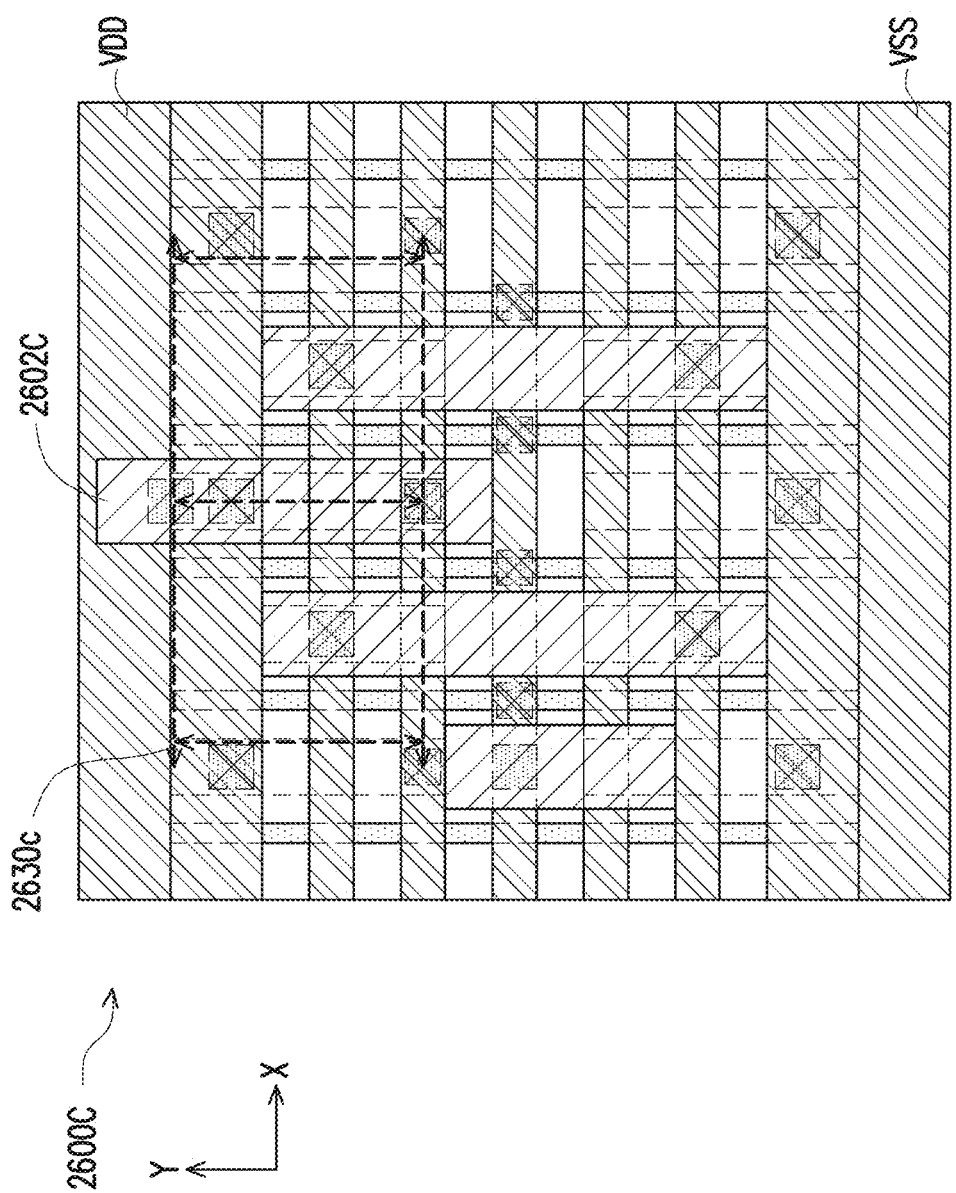
FIG. 26C is a diagram of a layout design of an IC structure, in accordance with some embodiments.

Layout design 2600C of FIG. 26C illustrates source conductive structure layout pattern 2602C being located on the first supply voltage VDD side (e.g., overlapping rail layout pattern 2102a). By utilizing five M0 conductive structure layout patterns (e.g., conductive structure layout patterns 2614a-2614e) and the source metal mesh (e.g., source conductive structure layout pattern 2602C) on the VDD side of power rail layout pattern 2102a, the density of cell level embedded power pillar layout patterns present in layout design 2600C is increased resulting in lower resistance than other approaches. Furthermore, source conductive structure layout pattern 2602C provides at least two current paths (e.g., set of current paths 2630c) between rail layout pattern 2102a and OD layout pattern 2340a resulting in better synchronized timing operations than other approaches.

Figure 26D:
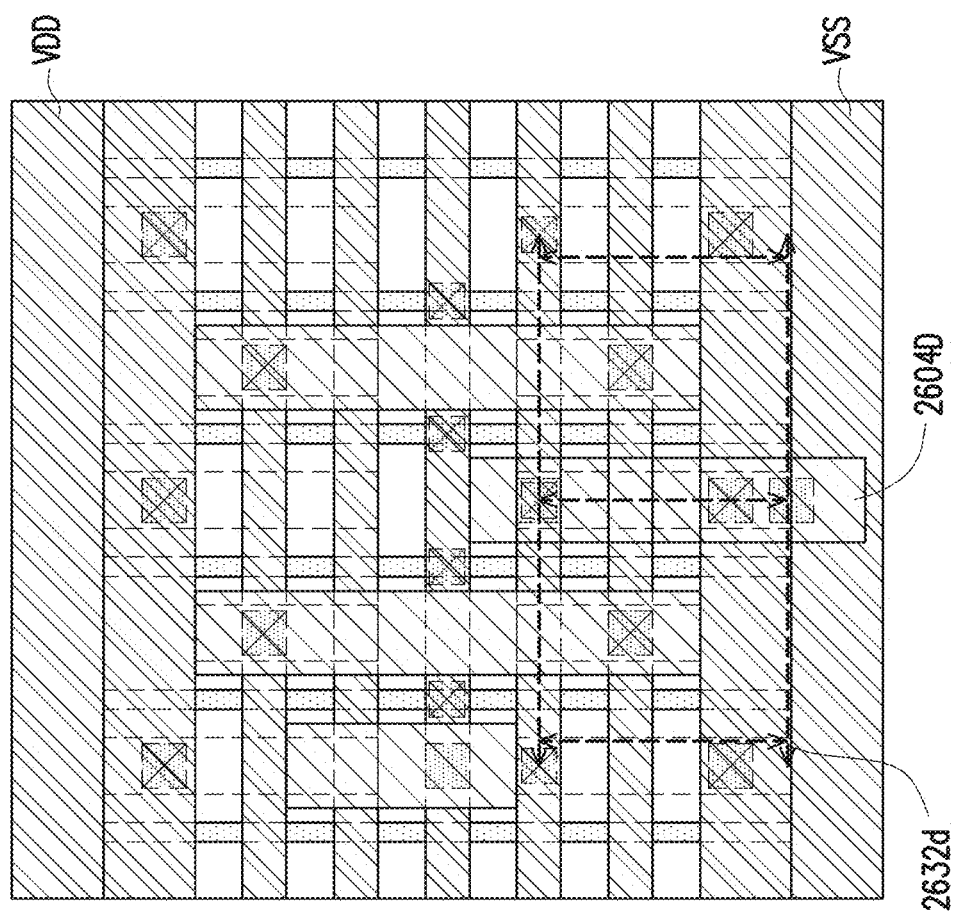
FIG. 26D is a diagram of a layout design of an IC structure, in accordance with some embodiments.

Layout design 2600D of FIG. 26D illustrates source conductive structure layout pattern 2604D being located on the second supply voltage VSS side (e.g., overlapping rail layout pattern 2102b). By utilizing five M0 conductive structure layout patterns (e.g., conductive structure layout patterns 2614a-2614e) and the source metal mesh (e.g., source conductive structure layout pattern 2604D) on the VSS side of power rail layout pattern 2102b, the density of cell level embedded power pillar layout patterns present in layout design 2600D is increased resulting in lower resistance than other approaches. Furthermore, source conductive structure layout pattern 2604D provides at least two current paths (e.g., set of current paths 2632d) between rail layout pattern 2102b and OD layout pattern 2340b resulting in better synchronized timing operations than other approaches.

FIGS. 27A, 27B, 27C and 27D are diagrams of corresponding layout designs 2700A, 2700B, 2700C and 2700D of an IC structure, in accordance with some embodiments.

Layout designs 2700A, 2700B, 2700C and 2700D are variations of corresponding layout designs 2600A, 2600B, 2600C and 2600D of corresponding FIGS. 26A, 26B, 26C and 26D.

For example, each of layout designs 2700A, 2700B, 2700C and 2700D includes six M0 conductive structure layout patterns (e.g., conductive structure layout patterns 2714a-2714f). The six M0 conductive structure layout patterns 2714a-2714f replace the five M0 conductive structure layout patterns (e.g., conductive structure layout patterns 2614a-2614e) of corresponding FIGS. 26A, 26B, 26C and 26D. Conductive structure layout patterns 2714a-2714f are similar to conductive structure layout patterns 2614a-2614e of layout designs 2600A, 2600B, 2600C and 2500D, and similar detailed description of these layout patterns is therefore omitted.

In comparison with layout design 2600A of FIG. 26A, layout design 2600B of FIG. 26B, layout design 2600C of FIG. 26C or layout design 2600D of FIG. 26D, current paths 2730a-2730d, 2732a-2732d of each corresponding layout design 2700A, 2700B, 2700C and 2700D replace corresponding current paths 2630a-2630d, 2632a-2632d, and similar detailed description is therefore omitted.

Figure 27A:
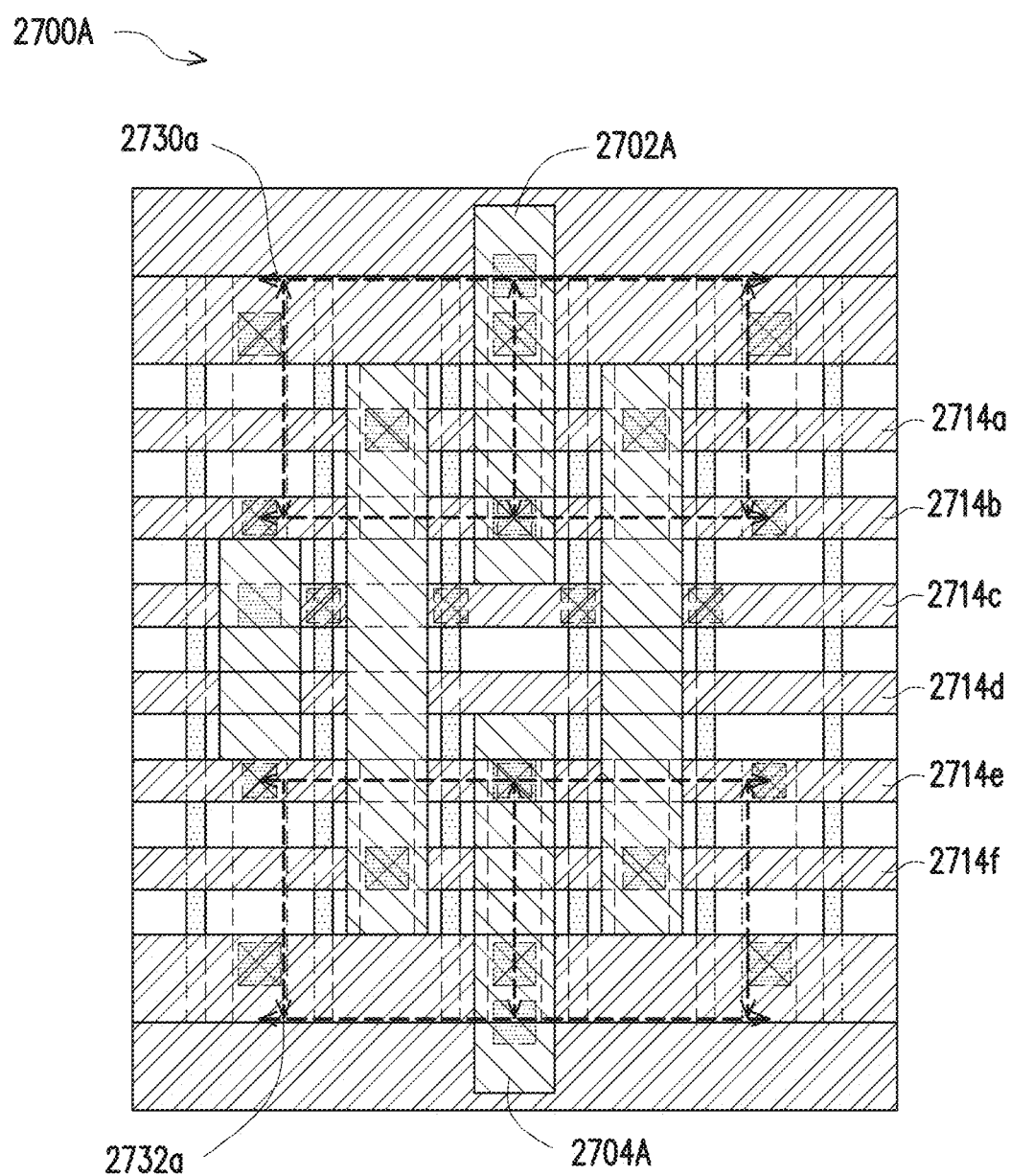
FIG. 27A is a diagram of a layout design of an IC structure, in accordance with some embodiments.

Layout design 2700A of FIG. 27A illustrates source conductive structure layout pattern 2702A and source conductive structure layout pattern 2704A being located directly across from each other (e.g., a center of each layout pattern 2702A and 2704A is aligned in the second direction Y) over the first supply voltage VDD and the second supply voltage VSS. By utilizing six M0 conductive structure layout patterns (e.g., conductive structure layout patterns 2714a-2714f), the source metal mesh (e.g., source conductive structure layout pattern 2702A) on the VDD side of power rail layout pattern 2102a, and the source metal mesh (e.g., source conductive structure layout pattern 2704A) on the VSS side of power rail layout pattern 2102b, the density of cell level embedded power pillar layout patterns present in layout design 2700A is increased resulting in lower resistance than other approaches. Furthermore, source conductive structure layout pattern 2702A provides at least two current paths (e.g., set of current paths 2730a) between rail layout pattern 2102a and OD layout pattern 2340a, and source conductive structure layout pattern 2704A provides at least two current paths (e.g., set of current paths 2732a) between rail layout pattern 2102b and OD layout pattern 2340b resulting in better synchronized timing operations than other approaches.

Figure 27B:
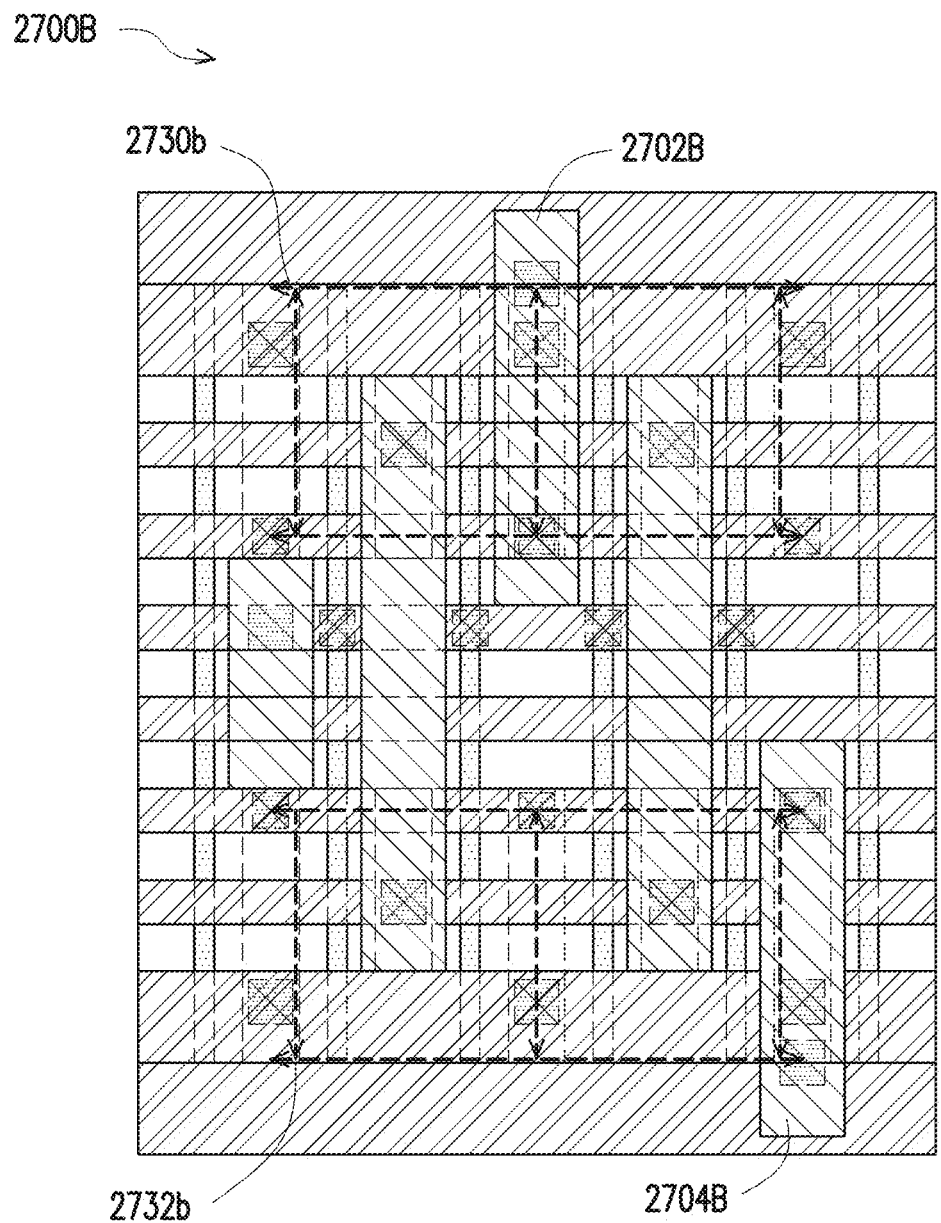
FIG. 27B is a diagram of a layout design of an IC structure, in accordance with some embodiments.

Layout design 2700B of FIG. 27B illustrates source conductive structure layout pattern 2702B and source conductive structure layout pattern 2704B being staggered from each other. (e.g., a center of each layout pattern 2702A and 2704A is not aligned in first direction X and the second direction Y). By utilizing six M0 conductive structure layout patterns (e.g., conductive structure layout patterns 2714a-2714f), the source metal mesh (e.g., source conductive structure layout pattern 2702B) on the VDD side of power rail layout pattern 2102a, and the staggered source metal mesh (e.g., source conductive structure layout pattern 2704B) on the VSS side of power rail layout pattern 2102b, the density of cell level embedded power pillar layout patterns present in layout design 2700B is increased resulting in lower resistance than other approaches. Furthermore, source conductive structure layout pattern 2702B provides at least two current paths (e.g., set of current paths 2730b) between rail layout pattern 2102a and OD layout pattern 2340a, and source conductive structure layout pattern 2704B provides at least two current paths (e.g., set of current paths 2732b) between rail layout pattern 2102b and OD layout pattern 2340b resulting in better synchronized timing operations than other approaches.

Figure 27C:
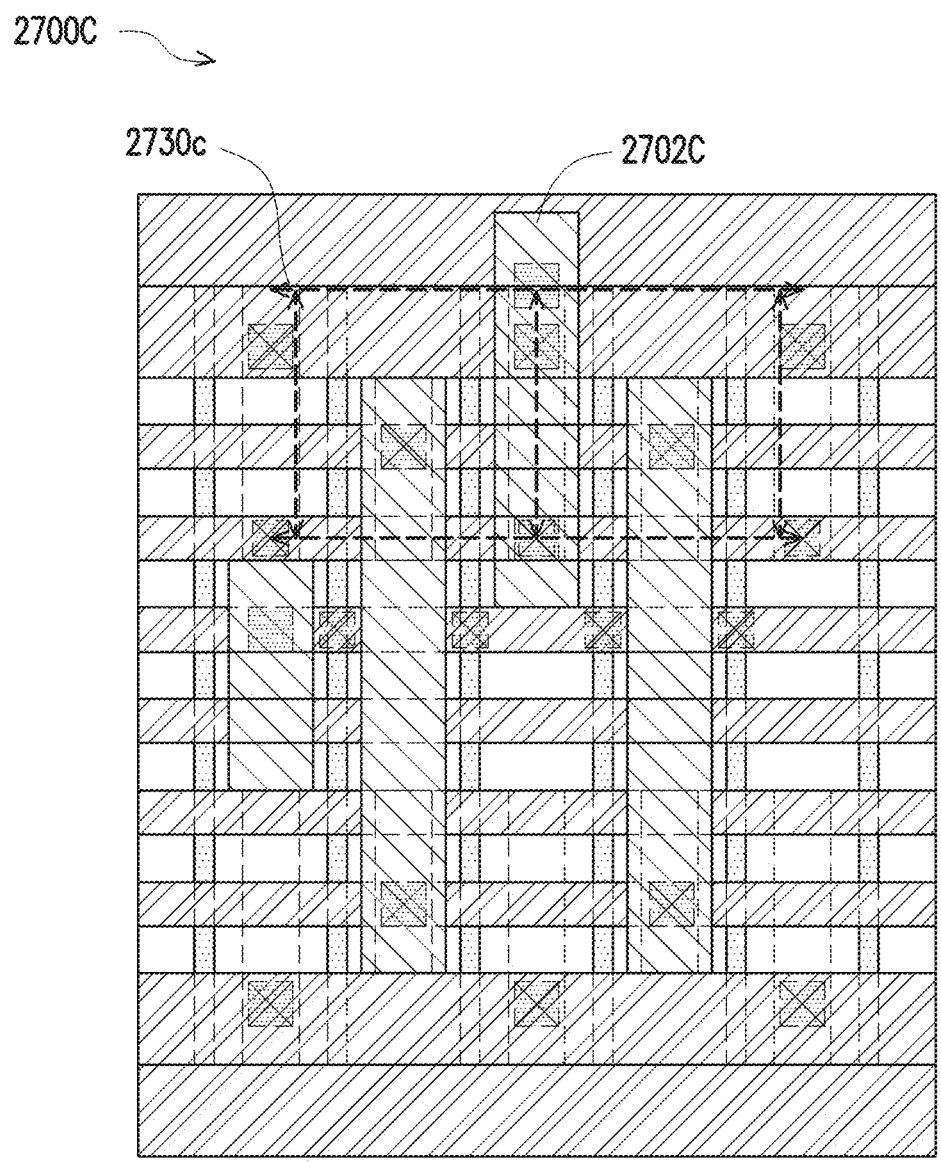
FIG. 27C is a diagram of a layout design of an IC structure, in accordance with some embodiments.

Layout design 2700C of FIG. 27C illustrates source conductive structure layout pattern 2602C being located on the first supply voltage VDD side (e.g., overlapping rail layout pattern 2102a). By utilizing six M0 conductive structure layout patterns (e.g., conductive structure layout patterns 2714a-2714f) and the source metal mesh (e.g., source conductive structure layout pattern 2702C) on the VDD side of power rail layout pattern 2102a, the density of cell level embedded power pillar layout patterns present in layout design 2700C is increased resulting in lower resistance than other approaches. Furthermore, source conductive structure layout pattern 2702C provides at least two current paths (e.g., set of current paths 2730c) between rail layout pattern 2102a and OD layout pattern 2340a resulting in better synchronized timing operations than other approaches.

Figure 27D:
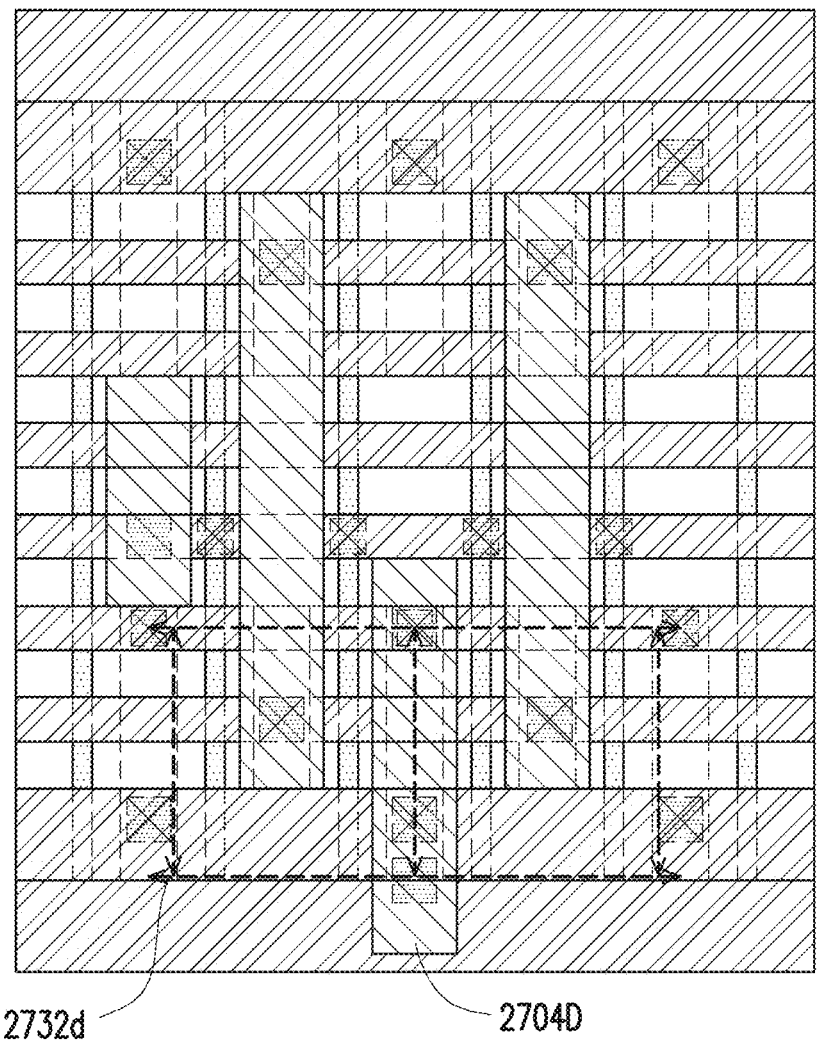
FIG. 27D is a diagram of a layout design of an IC structure, in accordance with some embodiments.

Layout design 2700D of FIG. 27D illustrates source conductive structure layout pattern 2704D being located on the second supply voltage VSS side (e.g., overlapping rail layout pattern 2102b). By utilizing six M0 conductive structure layout patterns (e.g., conductive structure layout patterns 2714a-2714f) and the source metal mesh (e.g., source conductive structure layout pattern 2704D) on the VSS side of power rail layout pattern 2102b, the density of cell level embedded power pillar layout patterns present in layout design 2700D is increased resulting in lower resistance than other approaches. Furthermore, source conductive structure layout pattern 2704D provides at least two current paths (e.g., set of current paths 2732d) between rail layout pattern 2102b and OD layout pattern 2340b resulting in better synchronized timing operations than other approaches.

FIG. 28 is a flowchart of a method 2800 of forming or manufacturing an IC in accordance with some embodiments. It is understood that additional operations may be performed before, during, and/or after the method 2800 depicted in FIG. 28, and that some other processes may only be briefly described herein. In some embodiments, the method 2800 is usable to form integrated circuits, such as IC structure 200, 1200 or 2400 (FIG. 2A-2B, 12A-12B or 24). In some embodiments, the method 2800 is usable to form integrated circuits having similar structural relationships as one or more of layout patterns 100, 300-1100, 1300-2300 or 2500-2800D (FIG. 1, 3-11, 13-23 or 25-28D).

In operation 2802 of method 2800, a first layout design (e.g., layout design 2100A) of a first cell (e.g., the features of layout design 2100A) is placed on a layout. In some embodiments, operation 2802 further includes generating the first layout design (e.g., layout design 2100A) of the first cell.

In operation 2804, a second layout design (e.g., layout design 2000A-2000D) of a second cell (e.g., cell layout patterns 2002a-2202d) is placed with the first cell. In some embodiments, operation 2804 further includes generating the second layout design of the second cell.

In operation 2806, a third layout design (e.g., layout design 2000A-2000D) of a third cell (e.g., cell layout patterns 2002a-2202d) is placed with the first cell (e.g., cell layout patterns 2002a-2202d). In some embodiments, the third cell is different than the second cell. In some embodiments, operation 2806 further includes generating the third layout design of the third cell.

In operation 2808, at least the third layout design (e.g., layout design 2000A-2000D) is moved, if the third layout design (e.g., layout design 2000A-2000D) overlaps the second layout design (e.g., layout design 2000A-2000D). In some embodiments, operation 2808 is not performed if the third layout design (e.g., layout design 2000A-2000D) does not overlap the second layout design (e.g., layout design 2000A-2000D). In some embodiments, operation 2808 includes moving the third layout design (e.g., layout design 2000A-2000D) in the first direction X until the third layout design (e.g., layout design 2000A-2000D) does not overlap the second layout design (e.g., layout design 2000A-2000D). In some embodiments, operation 2808 includes moving the third layout design (e.g., layout design 2000A-2000D) in the second direction Y until the third layout design (e.g., layout design 2000A-2000D) does not overlap the second layout design (e.g., layout design 2000A-2000D).

In operation 2810, a determination is made if routing resources are available. In some embodiments, operation 2810 is performed by system 3000. In some embodiments, routing resources refers to space for additional conductive structure layout patterns (or corresponding conductive structures) or via layout patterns (or corresponding vias) to provide interconnections to underlying or overlying layers. If routing resources are determined to be available, then operation 2810 proceeds to operation 2814. If routing resources are determined to be unavailable, then operation 2810 proceeds to operation 2812.

In operation 2812, the second cell (e.g. cell layout pattern 2002a) or the third cell (e.g., cell layout pattern 2002c) is moved until a corresponding second power pillar layout pattern (e.g., power pillar layout pattern 2014a) of the second cell (e.g., cell layout pattern 2002c) or a third power pillar layout pattern (e.g., power pillar layout pattern 2008c) of the third cell (e.g., cell layout pattern 2002c) overlaps a first power pillar layout pattern (e.g., power pillar layout pattern 2008c) of the first cell. In some embodiments, operation 2812 includes removing the overlapped first power pillar layout pattern (e.g., power pillar layout pattern 2008c).

In some embodiments, operation 2812 includes removing the overlapping second power pillar layout pattern (e.g., power pillar layout pattern 2014*a*) or third power pillar layout pattern (e.g., power pillar layout pattern 2008*c*).

In some embodiments, operation 2812 includes replacing the third power pillar pattern (e.g., power pillar layout pattern 2014*a*) and the first power pillar layout pattern (e.g., power pillar layout pattern 2114*b*) with a new power pillar layout pattern (e.g., power pillar layout pattern 2014*a*'). In some embodiments, operation 2812 includes merging the second power pillar layout pattern or the third power pillar layout pattern with the first power pillar layout pattern to place the new power pillar layout pattern (e.g., power pillar layout pattern 2014*a*').

In some embodiments, layout design 2200 of FIG. 22 illustrates the result of operation 2812. For example, in these embodiments, the first power pillar layout pattern (e.g., power pillar layout pattern 2114*b*) of the first cell (e.g., layout design 2100A) is overlapped or shares the same position as the second power pillar layout pattern (e.g., power pillar layout pattern 2014*a*) of the second cell (e.g., cell layout pattern 2002*a*), and are merged to place power pillar layout pattern (e.g., power pillar layout pattern 2014*a*') on the layout.

In operation 2814, the second cell (e.g. cell layout pattern 2002*a*) or the third cell (e.g., cell layout pattern 2002*c*) is moved, if a second power pillar layout pattern (e.g., power pillar layout pattern 2014*a*) of the second cell (e.g., cell layout pattern 2002*a*) or a third power pillar layout pattern (e.g., power pillar layout pattern 2008*c*) of the third cell (e.g., cell layout pattern 2002*c*) overlaps the first power pillar layout pattern (e.g., power pillar layout pattern 2014*a*) of the first cell.

In some embodiments, if the second power pillar layout pattern (e.g., power pillar layout pattern 2014*a*) of the second cell (e.g., cell layout pattern 2002*a*) or the third power pillar layout pattern (e.g., power pillar layout pattern 2008*c*) of the third cell (e.g., cell layout pattern 2002*c*) does not overlap the first power pillar layout pattern (e.g., power pillar layout pattern 2014*a*) of the first cell, then the second cell (e.g. cell layout pattern 2002*a*) or the third cell (e.g., cell layout pattern 2002*c*) in operation 2814 is not moved.

In some embodiments, in operation 2814, even though routing resources are available, if the second power pillar layout pattern (e.g., power pillar layout pattern 2014*a*) of the second cell (e.g., cell layout pattern 2002*a*) or the third power pillar layout pattern (e.g., power pillar layout pattern 2008*c*) of the third cell (e.g., cell layout pattern 2002*c*) overlaps the first power pillar layout pattern (e.g., power pillar layout pattern 2014*a*) of the first cell, then the second power pillar layout pattern (e.g., power pillar layout pattern 2014*a*) or the third power pillar layout pattern (e.g., power pillar layout pattern 2008*c*) are merged to form power pillar layout pattern (e.g., power pillar layout pattern 2014*a*') similar to operation 2812.

In some embodiments, when placing the second cell located on a different row from the third cell, operation 2814 further includes operation 2814*a* (not shown). In some embodiments, operation 2814*a* (not shown) includes merging the second power pillar layout pattern (e.g., power pillar layout pattern 2014*a*) of the second cell (e.g., cell layout pattern 2002*a*) with the third power pillar layout pattern (e.g., power pillar layout pattern 2008*c*) of the third cell (e.g., cell layout pattern 2002*c*) to form a new power pillar layout pattern (e.g., power pillar layout pattern 2014*a*') of either the second cell (e.g., cell layout pattern 2002*a*) or the third cell (e.g., cell layout pattern 2002*c*) the result of which is shown as layout design 2100 of FIG. 21B.

In operation 2816, an IC structure 200, 1200 or 2400 is manufactured based on at least the first layout design (e.g., layout design 2100A) of the first cell layout pattern (e.g., layout design 2100A), the second layout design (e.g., layout design 2000A-2000D) of the second cell layout pattern (e.g., cell layout pattern 2002*a*-2002*d*) or the third layout design (e.g., layout design 2000A-2000D) of the third cell (e.g., cell layout pattern 2002*a*-2002*d*).

In some embodiments, the first power pillar layout pattern of method 2800 includes at least one or more power pillar layout patterns of the set of power pillar layout patterns 2103, 2204*c*, 2204*e*, 2204*c*' or 2204*e*' (FIG. 22) or source conductive structure layout patterns 2302, 2304, 2502, 2404, 2602*a*, 2602*b*, 2602*c*, 2604*a*, 2604*b*, 2604*d*, 2702*a*, 2702*b*, 2702*c*, 2704*a*, 2704*b* and 2704*d*. In some embodiments, the second power pillar layout pattern or the third power pillar layout pattern of method 2800 includes at least one or more power pillar layout patterns 2008*a*, 2008*b*, 2008*c*, 2008*d*, 2014*a*, 2014*b*, 2104*c*, 2014*d*, 2204*c*, 2204*e*, 2204*c*' or 2204*e*' (FIG. 22) or source conductive structure layout patterns 2302, 2304, 2502, 2404, 2602*a*, 2602*b*, 2602*c*, 2604*a*, 2604*b*, 2604*d*, 2702*a*, 2702*b*, 2702*c*, 2704*a*, 2704*b* and 2704*d*.

In some embodiments, the first layout design of method 2800 includes one or more of layout patterns 100, 300-1100, 1300-2300 or 2500-2800D (FIG. 1, 3-11, 13-23 or 25-28D). In some embodiments, the second layout design of method 2800 includes one or more of layout patterns 100, 300-1100, 1300-2300 or 2500-2800D (FIG. 1, 3-11, 13-23 or 25-28D). In some embodiments, the third layout design of method 2800 includes one or more of layout patterns 100, 300-1100, 1300-2300 or 2500-2800D (FIG. 1, 3-11, 13-23 or 25-28D).

In some embodiments, one or more of operations 2808, 2810, 2812 and 2814 is not performed.

Figure 29:
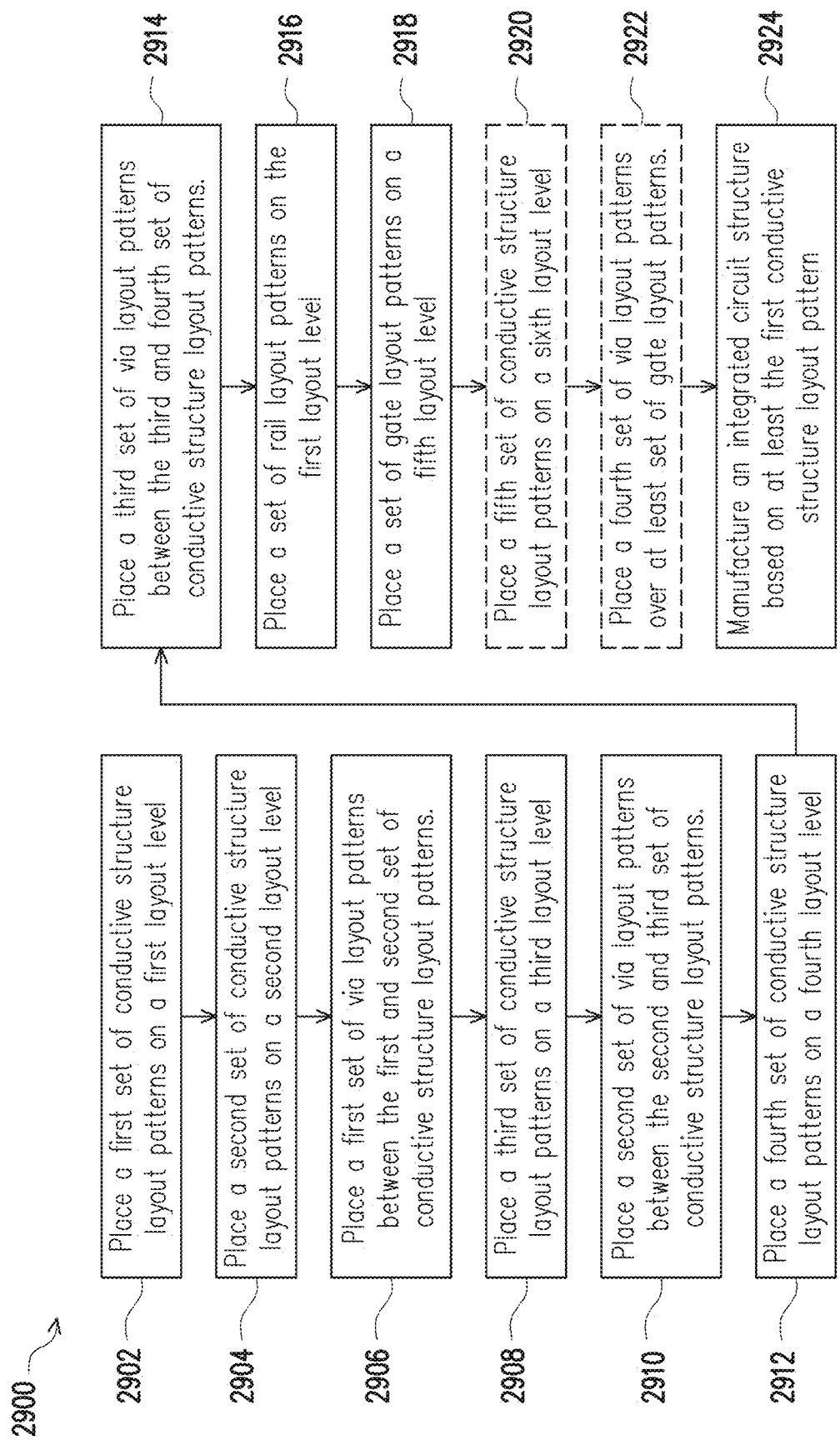
FIG. 29 is a flowchart of a method of manufacturing an IC, in accordance with some embodiments.

FIG. 29 is a flowchart of a method 2900 of forming or manufacturing an IC in accordance with some embodiments. It is understood that additional operations may be performed before, during, and/or after the method 2900 depicted in FIG. 29, and that some other processes may only be briefly described herein. In some embodiments, the method 2900 is usable to form integrated circuits, such as IC structure 200, 1200 or 2400 (FIG. 2A-2B, 12A-12B or 24). In some embodiments, the method 2900 is usable to form integrated circuits having similar structural relationships as one or more of layout patterns 100, 300-1100, 1300-2300 or 2500-2800D (FIG. 1, 3-11, 13-23 or 25-28D).

In operation 2902 of method 2900, a first set of conductive structure layout patterns (e.g., first conductive structure layout pattern 106, set of conductive structure layout patterns 1106) is placed on a first layout level (e.g., M0). In some embodiments, the first set of conductive structure layout patterns correspond to fabricating a first set of conductive structures (e.g., first conductive structure 206, set of conductive structures 1214) of an integrated circuit structure 200, 1200, 2400. In some embodiments, the first set of conductive structure layout patterns extend in the first direction X. In some embodiments, each conductive structure layout pattern of the first set of conductive structure layout patterns is separated from each other in the second direction Y. In some embodiments, operation 2902 includes generating the first set of conductive structure layout patterns.

In operation 2904, a second set of conductive structure layout patterns (e.g., first set of conductive structure layout patterns 114, set of conductive structure layout patterns 1114) is placed on a second layout level (e.g., M1) different from the first layout level. In some embodiments, the second set of conductive structure layout patterns correspond to fabricating a second set of conductive structures (e.g., conductive structures 214a, 214b, 1214a, 1214b) of the integrated circuit structure 200, 1200, 2400. In some embodiments, the second set of conductive structure layout patterns extend in the second direction Y, and overlap the first set of conductive structure layout patterns. In some embodiments, each conductive structure layout pattern of the second set of conductive structure layout patterns is separated from each other in the first direction X. In some embodiments, operation 2904 includes generating the second set of conductive structure layout patterns.

In operation 2906, a first set of via layout patterns (e.g., second set of via layout patterns 118, set of via layout patterns 1118) is placed between the second set of conductive structure layout patterns and the first set of conductive structure layout patterns. In some embodiments, the first set of via layout patterns are located at V0. In some embodiments, the first set of via layout patterns correspond to fabricating a first set of vias (e.g., second set of vias 218a and 218b, via structure 1218a, 1218b, 1218c, 1218d) of IC structure 200, 1200, 2400. In some embodiments, the first set of vias electrically couple the second set of conductive structures to the first set of conductive structures. In some embodiments, each via layout pattern of the first set of via layout patterns is located where each conductive structure layout pattern of the second set of conductive structure layout patterns overlaps each conductive structure layout pattern of the first set of conductive structure layout patterns. In some embodiments, operation 2906 includes generating the first set of via layout patterns.

In operation 2908, a third set of conductive structure layout patterns (e.g., second conductive structure layout pattern 122, set of conductive structure layout patterns 1122) is placed at a third layout level (e.g., M2) different from the first layout level and the second layout level. In some embodiments, the third set of conductive structure layout patterns correspond to fabricating a third set of conductive structures (e.g., second conductive structure 222, conductive structure 1222a, 1222b) of the integrated circuit structure 200, 1200, 2400. In some embodiments, the third set of conductive structure layout patterns extend in the first direction X, overlap the second set of conductive structure layout patterns, and cover a portion of the first set of conductive structure layout patterns. In some embodiments, each conductive structure layout pattern of the third set of conductive structure layout patterns is separated from each other in the second direction Y. In some embodiments, operation 2908 includes generating the third set of conductive structure layout patterns.

In operation 2910, a second set of via layout patterns (e.g., third set of via layout patterns 124, set of via layout patterns 1124) is placed between the third set of conductive structure layout patterns and the second set of conductive structure layout patterns. In some embodiments, the second set of via layout patterns are located at V1. In some embodiments, the second set of via layout patterns correspond to fabricating a second set of vias (e.g., third set of vias 224a and 224b, via structure 1224a, 1224b, 1224c, 1224d) of IC structure 200, 1200, 2400. In some embodiments, the second set of vias electrically couple the third set of conductive structures to the second set of conductive structures of IC structure 200, 1200, 2400. In some embodiments, each via layout pattern of the second set of via layout patterns is located where each conductive structure layout pattern of the third set of conductive structure layout patterns overlaps each conductive structure layout pattern of the second set of conductive structure layout patterns. In some embodiments, operation 2910 includes generating the second set of via layout patterns.

In operation 2912, a fourth set of conductive structure layout patterns (e.g., second set of conductive structure layout patterns 128, set of conductive structure layout patterns 1128) is placed on a fourth layout level (e.g., M3) different from the first layout level, the second layout level and the third layout level. In some embodiments, the fourth set of conductive structure layout patterns correspond to fabricating a fourth set of conductive structures (e.g., conductive structures 228a, 228b, 1228a, 1228b) of the integrated circuit structure 200, 1200, 2400. In some embodiments, the fourth set of conductive structure layout patterns extend in the second direction, overlap the third set of conductive structure layout patterns and the first set of conductive structure layout patterns, and cover a portion of the second set of conductive structure layout patterns. In some embodiments, each conductive structure layout pattern of the fourth set of conductive structure layout patterns is separated from each other in the first direction. In some embodiments, operation 2912 includes generating the fourth set of conductive structure layout patterns.

In operation 2914, a third set of via layout patterns (e.g., fourth set of via layout patterns 130, set of via layout patterns 1130) is placed between the fourth set of conductive structure layout patterns and the third set of conductive structure layout patterns. In some embodiments, the third set of via layout patterns are located at V2. In some embodiments, the third set of via layout patterns correspond to fabricating a third set of vias (e.g., fourth set of vias 230a and 230b, via structure 1230a, 1230b, 1230c, 1230d) of IC structure 200, 1200, 2400. In some embodiments, the third set of vias electrically couple the fourth set of conductive structures to the third set of conductive structures of IC structure 200, 1200, 2400. In some embodiments, each via layout pattern of the third set of via layout patterns is located where each conductive structure layout pattern of the fourth set of conductive structure layout patterns overlaps each conductive structure layout pattern of the third set of conductive structure layout patterns. In some embodiments, operation 2914 includes generating the third set of via layout patterns.

In some embodiments, a center of at least one via layout pattern of the first set of via layout patterns, the second set of via layout patterns, or the third set of via layout patterns is aligned in each of the first direction and the second direction with a center of another via layout pattern of the first set of via layout patterns, the second set of via layout patterns, or the third set of via layout patterns.

In operation 2916, a set of power rail layout patterns (e.g., set of rail layout patterns 108a, 108b, set of rail layout patterns 2102) is placed on the first layout level (M0). In some embodiments, the set of power rail layout patterns correspond to manufacturing a set of power rails (e.g., set of rails 208a, 208b, rail layout patterns 2102) of IC structure 200, 1200, 2400. In some embodiments, the set of power rails are configured to supply the first supply voltage VDD or the second supply voltage VSS. In some embodiments, at least the first set of conductive structure layout patterns, the second set of conductive structure layout patterns, the third set of conductive structure layout patterns or the fourth set of conductive structure layout patterns is between the first set of power rail layout patterns. In some embodiments, operation 2916 includes generating the set of rail layout patterns.

In operation 2918, a set of gate layout patterns (e.g., set of gate layout patterns 104) is placed on a fifth layout level (e.g., Poly level) different from the first layout level, the second layout level, the third layout level. In some embodiments, the set of gate layout patterns correspond to fabricating a set of gates (e.g., set of gates 202) of an integrated circuit structure 200, 1200, 2400. In some embodiments, the set of gate layout patterns 104 are below the first layout level (M0). In some embodiments, the set of gate layout patterns extend in the first direction. In some embodiments, each gate layout pattern of the set of gate layout patterns is separated from each other in the second direction. In some embodiments, operation 2918 is not performed. In some embodiments, operation 2918 includes generating the set of gate layout patterns.

In operation 2920, a fifth set of conductive structure layout patterns (e.g., conductive structure layout pattern 140) is placed on a sixth layout level (MP) different from the first layout level, the second layout level, the third layout level, the fourth layout level and the fifth layout level. In some embodiments, the fifth set of conductive structure layout patterns correspond to fabricating a fifth set of conductive structures (e.g., set of contacts 204a, 204b and 204c) of the integrated circuit structure 200, 1200, 2400. In some embodiments, the fifth set of conductive structure layout patterns extend in the second direction Y, and overlap the set of gate layout patterns. In some embodiments, each conductive structure layout pattern of the fifth set of conductive structure layout patterns being separated from each other in the first direction X. In some embodiments, operation 2920 is not performed. In some embodiments, operation 2920 includes generating the fifth set of conductive structure layout patterns.

In operation 2922, a fourth set of via layout patterns (e.g., first set of via layout patterns 112) is placed between the set of gate layout patterns and the first set of conductive structure layout patterns. In some embodiments, operation 2922 includes placing the fourth set of via layout patterns between the set of gate layout patterns and the fifth set of conductive structure layout patterns. In some embodiments, the fourth set of via layout patterns are located at VC. In some embodiments, the fourth set of via layout patterns correspond to fabricating a fourth set of vias (e.g., set of vias 212a, 212b and 212c,) of IC structure 200, 1200, 2400. In some embodiments, the fourth set of vias electrically couple the set of gates to the first set of conductive structures. In some embodiments, each via layout pattern of the fourth set of via layout patterns is located where each conductive structure layout pattern of the first set of conductive structure layout patterns overlaps each gate layout pattern of the set of gate layout patterns. In some embodiments, operation 2922 is not performed. In some embodiments, operation 2922 includes generating the fourth set of via layout patterns.

In operation 2924, an integrated circuit structure 200, 1200, 2400 is manufactured based on at least one of the layout patterns of method 2900. In some embodiments, operation 2924 further includes manufacturing a set of masks based on one or more layout patterns of method 2900, and using the set of masks to manufacture the one or more integrated circuit structures in method 2900. In some embodiments, at least one of the layout patterns of method 2900 is stored on a non-transitory computer-readable medium, and at least one of the above operations is of method 2900 performed by a hardware processor. In some embodiments, operation 2924 further includes manufacturing an integrated circuit structure 200, 1200, 2400 based on at least one of layout designs 100, 300-1100, 1300-2300 or 2500-2800D (FIG. 1, 3-11, 13-23 or 25-28D).

Other configurations of one or more via layout patterns, conductive structure layout patterns, set of rail layout patterns or set of gate layout patterns, of method 2900 are within the scope of the present disclosure. Other configurations of levels are within the scope of the present disclosure.

In some embodiments, one or more of operations 2902, 2904, 2906, 2908, 2910, 2912, 2914, 2916, 2918, 2920 or 2922 are not performed.

In some embodiments, the layout designs of method 2800 or 2900 corresponds to one or more of layout designs 100, 300-1100, 1300-1900, 2000A-2000D, 2100A-2100B, 2300A-2300B, 2500A-2500B, 2600A-2600D or 2700A-2700D.

In some embodiments, the first, second, third, fourth or fifth sets of conductive structure layout patterns of method 2800 or 2900 corresponds to one or more layout patterns of layout designs 100, 300-1100, 1300-1900, 2000A-2000D, 2100A-2100B, 2300A-2300B, 2500A-2500B, 2600A-2600D or 2700A-2700D.

In some embodiments, the first, second, third or fourth sets of via layout patterns of method 2800 or 2900 corresponds to one or more layout patterns of layout designs 100, 300-1100, 1300-1900, 2000A-2000D, 2100A-2100B, 2300A-2300B, 2500A-2500B, 2600A-2600D or 2700A-2700D.

In some embodiments, the set of rail layout patterns of method 2800 or 2900 corresponds to one or more layout patterns of layout designs 100, 300-1100, 1300-1900, 2000A-2000D, 2100A-2100B, 2300A-2300B, 2500A-2500B, 2600A-2600D or 2700A-2700D.

In some embodiments, the set of gate layout patterns of method 2800 or 2900 corresponds to one or more layout patterns of layout designs 100, 300-1100, 1300-1900, 2000A-2000D, 2100A-2100B, 2300A-2300B, 2500A-2500B, 2600A-2600D or 2700A-2700D.

One or more of the operations of method 2800 or 2900 is performed by a processing device configured to execute instructions for manufacturing an IC, such as IC structure 200, 1200 or 2400. In some embodiments, one or more operations of method 2800 or 2900 is performed using a same processing device as that used in a different one or more operations of method 2800 or 2900. In some embodiments, a different processing device is used to perform one or more operations of method 2800 or 2900 from that used to perform a different one or more operations of method 2800 or 2900.

Figure 30:
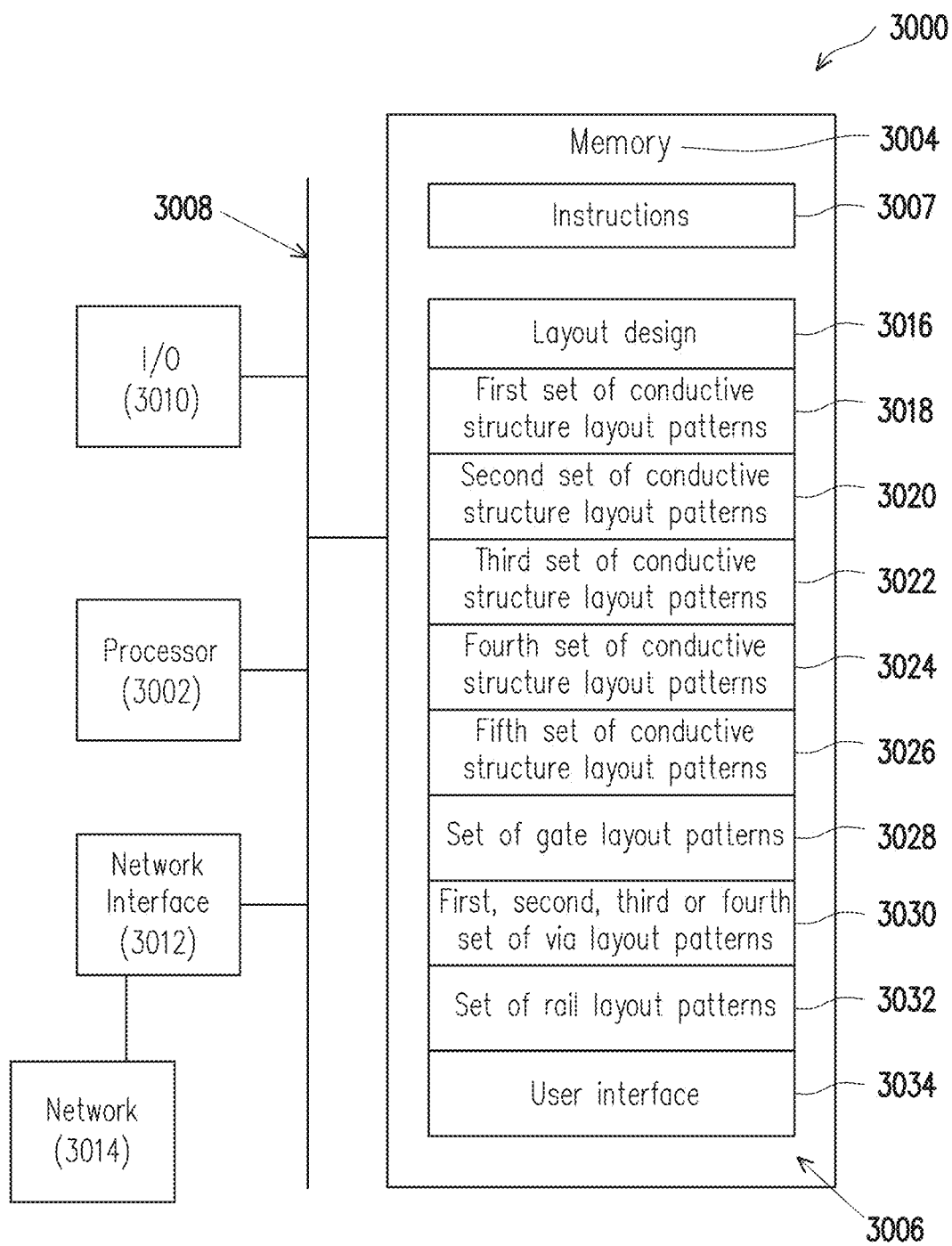
FIG. 30 is a block diagram of a system of designing an IC layout design, in accordance with some embodiments.

FIG. 30 is a schematic view of a system 3000 for designing an IC layout design in accordance with some embodiments. In some embodiments, system 3000 generates or places one or more IC layout designs described herein. System 3000 includes a hardware processor 3002 and a non-transitory, computer readable storage medium 3004 encoded with, i.e., storing, the computer program code 3006, i.e., a set of executable instructions. Computer readable storage medium 3004 is also encoded with instructions 3007 for interfacing with manufacturing machines for producing the integrated circuit. The processor 3002 is electrically coupled to the computer readable storage medium 3004 via a bus 3008. The processor 3002 is also electrically coupled to an I/O interface 3010 by bus 3008. A network interface 3012 is also electrically connected to the processor 3002 via bus 3008. Network interface 3012 is connected to a network 3014, so that processor 3002 and computer readable storage medium 3004 are capable of connecting to external elements via network 3014. The processor 3002 is configured to execute the computer program code 3006 encoded in the computer readable storage medium 3004 in order to cause system 3000 to be usable for performing a portion or all of the operations as described in methods 2800 and 2900.

In some embodiments, the processor 3002 is a central processing unit (CPU), a multi-processor, a distributed processing system, an application specific integrated circuit (ASIC), and/or a suitable processing unit.

In some embodiments, the computer readable storage medium 3004 is an electronic, magnetic, optical, electromagnetic, infrared, and/or a semiconductor system (or apparatus or device). For example, the computer readable storage medium 3004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 3004 includes a compact disk-read only memory (CD-ROM), a compact disk-read/write (CD-R/W), and/or a digital video disc (DVD).

In some embodiments, the storage medium 3004 stores the computer program code 3006 configured to cause system 3000 to perform method 2800 or 2900. In some embodiments, the storage medium 3004 also stores information needed for performing method 2800 or 2900 as well as information generated during performing method 2800 or 2900, such as layout design 3016, first set of conductive structure layout patterns 3018, second set of conductive structure layout patterns 3020, third set of conductive structure layout patterns 3022, fourth set of conductive structure layout patterns 3024, fifth set of conductive structure layout patterns 3026, set of gate layout patterns 3028, at least one set of via layout patterns 3030, set of rail layout patterns 3032 and user interface 3034, and/or a set of executable instructions to perform the operation of method 2800 or 2900. In some embodiments, the at least one set of via layout patterns 3030 includes one or more of first set of via layout patterns, second set of via layout patterns, third set of via layout patterns or fourth set of via layout patterns of FIG. 29.

In some embodiments, the storage medium 3004 stores instructions 3007 for interfacing with manufacturing machines. The instructions 3007 enable processor 3002 to generate manufacturing instructions readable by the manufacturing machines to effectively implement method 2800 or 2900 during a manufacturing process.

System 3000 includes I/O interface 3010. I/O interface 3010 is coupled to external circuitry. In some embodiments, I/O interface 3010 includes a keyboard, keypad, mouse, trackball, trackpad, and/or cursor direction keys for communicating information and commands to processor 3002.

System 3000 also includes network interface 3012 coupled to the processor 3002. Network interface 3012 allows system 3000 to communicate with network 3014, to which one or more other computer systems are connected. Network interface 3012 includes wireless network interfaces such as BLUETOOTH, WIFE WIMAX, GPRS, or WCDMA; or wired network interface such as ETHERNET, USB, or IEEE-1394. In some embodiments, method 2800 or 2900 is implemented in two or more systems 3000, and information such as layout design, first set of conductive structure layout patterns, second set of conductive structure layout patterns, third set of conductive structure layout patterns, fourth set of conductive structure layout patterns, fifth set of conductive structure layout patterns, set of gate layout patterns, at least one set of via layout patterns, set of rail layout patterns and user interface are exchanged between different systems 3000 by network 3014.

System 3000 is configured to receive information related to a layout design through I/O interface 3010 or network interface 3012. The information is transferred to processor 3002 by bus 3008 to determine a layout design for producing integrated circuit structure 200, 1200 or 2400. The layout design is then stored in computer readable medium 3004 as layout design 3016. System 3000 is configured to receive information related to a first set of conductive structure layout patterns through I/O interface 3010 or network interface 3012. The information is stored in computer readable medium 3004 as first set of conductive structure layout patterns 3018. System 3000 is configured to receive information related to a second set of conductive structure layout patterns through I/O interface 3010 or network interface 3012. The information is stored in computer readable medium 3004 as second set of conductive structure layout patterns 3020. System 3000 is configured to receive information related to a third set of conductive structure layout patterns through I/O interface 3010 or network interface 3012. The information is stored in computer readable medium 3004 as third set of conductive structure layout patterns 3022. System 3000 is configured to receive information related to a fourth set of conductive structure layout patterns through I/O interface 3010 or network interface 3012. The information is stored in computer medium 3004 as fourth set of conductive structure layout patterns 3024. System 3000 is configured to receive information related to a fifth set of conductive structure layout patterns through I/O interface 3010 or network interface 3012. The information is stored in computer readable medium 3004 as fifth set of conductive structure layout patterns 3026. System 3000 is configured to receive information related to a set of gate layout patterns through I/O interface 3010 or network interface 3012. The information is stored in computer readable medium 3004 as set of gate layout patterns 3028. System 3000 is configured to receive information related to at least one set of via layout patterns through I/O interface 3010 or network interface 3012. The information is stored in computer readable medium 3004 as at least one set of via layout patterns 3030. System 3000 is configured to receive information related to a set of rail layout patterns through I/O interface 3010 or network interface 3012. The information is stored in computer readable medium 3004 as set of rail layout patterns 3032. System 3000 is configured to receive information related to a user interface through I/O interface 3010 or network interface 3012. The information is stored in computer readable medium 3004 as user interface 3034.

In some embodiments, method 2800 or 2900 is implemented as a standalone software application for execution by a processor. In some embodiments, method 2800 or 2900 is implemented as a software application that is a part of an additional software application. In some embodiments, method 2800 or 2900 is implemented as a plug-in to a software application. In some embodiments, method 2800 or 2900 is implemented as a software application that is a portion of an EDA tool. In some embodiments, method 2800 or 2900 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 2800 or 2900 is implemented by a manufacturing device to manufacture an integrated circuit (e.g., integrated circuit 200, 1200 or 2400) using a set of masks manufactured based on one or more layout designs (e.g., layout design 100, 300-1100, 1300-1900, 2000A-2000D, 2100A-2100B, 2300A-2300B, 2500A-2500B, 2600A-2600D or 2700A-2700D) generated by system 3000.

System 3000 of FIG. 30 generates layout designs (e.g., layout design 100, 300-1100, 1300-1900, 2000A-2000D, 2100A-2100B, 2300A-2300B, 2500A-2500B, 2600A-2600D or 2700A-2700D) of integrated circuit structure 200, 1200 or 2400 that occupy less area and provide better routing resources than other approaches.

One aspect of this description relates to an integrated circuit structure. In some embodiments, the integrated circuit structure includes a first set of conductive structures extending in a first direction, being located at a first level, and each conductive structure of the first set of conductive structures being separated from each other in a second direction different from the first direction. In some embodiments, the integrated circuit structure further includes a second set of conductive structures extending in the second direction, overlapping the first set of conductive structures, being located at a second level different from the first level. In some embodiments, each conductive structure of the second set of conductive structures being separated from each other in the first direction. In some embodiments, the integrated circuit structure further includes a first set of vias between the second set of conductive structures and the first set of conductive structures. In some embodiments, the first set of vias couple the second set of conductive structures to the first set of conductive structures, and each via of the first set of vias being located where each conductive structure of the second set of conductive structures overlaps each conductive structure of the first set of conductive structures. In some embodiments, the integrated circuit structure further includes a third set of conductive structures extending in the first direction, overlapping the second set of conductive structures, covering a portion of the first set of conductive structures, and being located at a third level different from the first level and the second level. In some embodiments, each conductive structure of the third set of conductive structures is separated from each other in the second direction. In some embodiments, the integrated circuit structure further includes a second set of vias between the third set of conductive structures and the second set of conductive structures. In some embodiments, the second set of vias couple the third set of conductive structures to the second set of conductive structures. In some embodiments, each via of the second set of vias is located where each conductive structure of the third set of conductive structures overlaps each conductive structure of the second set of conductive structures.

Another aspect of this description relates to an integrated circuit structure. In some embodiments, the integrated circuit structure includes a first conductive structure extending in a first direction and being located at a first level. In some embodiments, the integrated circuit structure further includes a second conductive structure extending in the first direction, being located at the first level, and being separated from the first conductive structure in a second direction different from the first direction. In some embodiments, the integrated circuit structure further includes a first set of conductive structures extending in the second direction, overlapping the first conductive structure and the second conductive structure, being located at a second level different from the first level. In some embodiments, each conductive structure of the first set of conductive structures being separated from each other in the first direction. In some embodiments, the integrated circuit structure further includes a first set of vias between the first set of conductive structures and each of the first conductive structure and the second conductive structure. In some embodiments, the first set of vias couple the first set of conductive structures to each of the first conductive structure and the second conductive structure. In some embodiments, each via of the first set of vias is located where each conductive structure of the first set of conductive structures overlaps each of the first conductive structure and the second conductive structure. In some embodiments, the integrated circuit structure further includes a third conductive structure extending in the first direction, overlapping the first set of conductive structures, covering a portion of the first conductive structure, and being located at a third level different from the first level and the second level.

Yet another aspect of this description relates to an integrated circuit structure. In some embodiments, the integrated circuit structure includes a first set of conductive structures extending in a first direction and being located at a first level. In some embodiments, each conductive structure of the first set of conductive structures is separated from each other in a second direction different from the first direction. In some embodiments, the integrated circuit structure further includes a first conductive structure extending in the second direction, overlapping the first set of conductive structures, and being located at a second level different from the first level. In some embodiments, the integrated circuit structure further includes a second conductive structure extending in the second direction, overlapping the first set of conductive structures, being located at the second level, and being separated from the first conductive structure in the first direction. In some embodiments, the integrated circuit structure further includes a first set of vias between the first set of conductive structures and each of the first conductive structure and the second conductive structure. In some embodiments, the first set of vias couple the first set of conductive structures to each of the first conductive structure and the second conductive structure. In some embodiments, each via of the first set of vias is located where each of the first conductive structure and the second conductive structure overlaps each conductive structure of the first set of conductive structures. In some embodiments, the integrated circuit structure further includes a second set of conductive structures extending in the first direction, overlapping the first conductive structure and the second conductive structure, covering a portion of at least the first conductive structure or the second conductive structure, and being located at a third level different from the first level and the second level. In some embodiments, each conductive structure of the second set of conductive structures is separated from each other in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
a first set of conductive structures extending in a first direction, being located at a first level, and each conductive structure of the first set of conductive structures being separated from each other in a second direction different from the first direction;
a second set of conductive structures extending in the second direction, overlapping the first set of conductive structures, being located at a second level different from the first level, and each conductive structure of the second set of conductive structures being separated from each other in the first direction;
a first set of vias between the second set of conductive structures and the first set of conductive structures, the first set of vias coupling the second set of conductive structures to the first set of conductive structures, and each via of the first set of vias being located where each conductive structure of the second set of conductive structures overlaps each conductive structure of the first set of conductive structures;
a third set of conductive structures extending in the first direction, overlapping the second set of conductive structures, covering a portion of the first set of conductive structures, and being located at a third level different from the first level and the second level, each conductive structure of the third set of conductive structures being separated from each other in the second direction;
a second set of vias between the third set of conductive structures and the second set of conductive structures, the second set of vias coupling the third set of conductive structures to the second set of conductive structures, and each via of the second set of vias being located where each conductive structure of the third set of conductive structures overlaps each conductive structure of the second set of conductive structures;
a first power rail located at the first level, and configured to supply a first supply voltage; and
a second power rail located at the first level, and configured to supply a second supply voltage different from the first supply voltage,
wherein at least the first set of conductive structures, the second set of conductive structures or the third set of conductive structures is between the first power rail and the second power rail.

2. The integrated circuit structure of claim 1, further comprising:
a fourth set of conductive structures extending in the second direction, overlapping the third set of conductive structures and the first set of conductive structures, covering a portion of the second set of conductive structures, being located at a fourth level different from the first level, the second level and the third level, and each conductive structure of the fourth set of conductive structures being separated from each other in the first direction; and
a third set of vias between the fourth set of conductive structures and the third set of conductive structures, the third set of vias coupling the fourth set of conductive structures to the third set of conductive structures, and each via of the third set of vias being located where each conductive structure of the fourth set of conductive structures overlaps each conductive structure of the third set of conductive structures.

3. The integrated circuit structure of claim 2, wherein the second set of conductive structures comprises:
a first structure extending in the second direction; and
a second structure extending in the second direction, the second structure being separated from the first structure in the first direction; and
the fourth set of conductive structures comprises:
a third structure extending in the second direction; and
a fourth structure extending in the second direction, the fourth structure being separated from the third structure in the first direction.

4. The integrated circuit structure of claim 2, wherein a center of the first set of vias, a center of the second set of vias, and a center of the third set of vias are aligned in the first direction and the second direction.

5. The integrated circuit structure of claim 1, wherein the first set of conductive structures have a different length from the third set of conductive structures.

6. The integrated circuit structure of claim 2, wherein the fourth set of conductive structures is between the first power rail and the second power rail.

7. The integrated circuit structure of claim 2, further comprising:
a conductive structure of the first set of conductive structures is electrically coupled to a drain terminal of a transistor, the transistor being part of a standard cell; and
the conductive structure of the first set of conductive structures corresponds to an output pin of the integrated circuit structure.

8. The integrated circuit structure of claim 2, wherein the first set of conductive structures comprises:
a first conductive structure extending in the first direction; and
a second conductive structure extending in the first direction, the second conductive structure being separated from the first conductive structure in the second direction; and
the third set of conductive structures comprises:
a third conductive structure extending in the first direction and covering a portion of the first conductive structure; and
a fourth conductive structure extending in the first direction and covering the portion of the second conductive structure, the fourth conductive structure being separated from the third conductive structure in the second direction.

9. The integrated circuit structure of claim 2, wherein the second set of conductive structures have a same width as the fourth set of conductive structures.

10. The integrated circuit structure of claim 2, wherein the second set of conductive structures have a same length as the fourth set of conductive structures.

11. An integrated circuit structure comprising:
a first conductive structure extending in a first direction and being located at a first level;
a second conductive structure extending in the first direction, being located at the first level, and being separated from the first conductive structure in a second direction different from the first direction;
a first set of conductive structures extending in the second direction, overlapping the first conductive structure and the second conductive structure, being located at a second level different from the first level, and each conductive structure of the first set of conductive structures being separated from each other in the first direction;

a first set of vias between the first set of conductive structures and each of the first conductive structure and the second conductive structure, the first set of vias coupling the first set of conductive structures to each of the first conductive structure and the second conductive structure, and each via of the first set of vias being located where each conductive structure of the first set of conductive structures overlaps each of the first conductive structure and the second conductive structure;

a third conductive structure extending in the first direction, overlapping the first set of conductive structures, covering a portion of the first conductive structure, being located at a third level different from the first level and the second level;

a first power rail located at the first level, and configured to supply a first supply voltage; and a second power rail located at the first level, and configured to supply a second supply voltage different from the first supply voltage, wherein at least the first set of conductive structures, the first conductive structure, the second conductive structure or the third conductive structure is between the first power rail and the second power rail.

12. The integrated circuit structure of claim 11, further comprising:
a fourth conductive structure extending in the first direction, overlapping the first set of conductive structures, covering a portion of the second conductive structure, being located at the third level, and being separated from the third conductive structure in the second direction; and a second set of vias between the first set of conductive structures and each of the third conductive structure and the fourth conductive structure, the second set of vias coupling the first set of conductive structures to each of the third conductive structure and the fourth conductive structure, and each via of the second set of vias being located where each conductive structure of the first set of conductive structures is overlapped by each of the third conductive structure and the fourth conductive structure.

13. The integrated circuit structure of claim 12, further comprising:
a second set of conductive structures extending in the second direction, overlapping the third conductive structure and the fourth conductive structure, covering at least a portion of the first set of conductive structures, being located at a fourth level different from the first level, the second level and the third level, and each conductive structure of the second set of conductive structures being separated from each other in the first direction; and a third set of vias between the second set of conductive structures and each of the third conductive structure and the fourth conductive structure, the third set of vias coupling the second set of conductive structures to each of the third conductive structure and the fourth conductive structure, and each via of the third set of vias being located where each conductive structure of the second set of conductive structures overlaps each of the third conductive structure and the fourth conductive structure.

14. The integrated circuit structure of claim 13, wherein the fourth conductive structure is between the first power rail and the second power rail.

15. The integrated circuit structure of claim 11, wherein the first conductive structure is electrically coupled to a source terminal of a first transistor, the first transistor being part of a standard cell; and
the first conductive structure corresponds to an output pin of the integrated circuit structure.

16. An integrated circuit structure comprising:
a first set of conductive structures extending in a first direction and being located at a first level, and each conductive structure of the first set of conductive structures being separated from each other in a second direction different from the first direction;

a first conductive structure extending in the second direction, overlapping the first set of conductive structures, and being located at a second level different from the first level;

a second conductive structure extending in the second direction, overlapping the first set of conductive structures, being located at the second level, and being separated from the first conductive structure in the first direction;

a first set of vias between the first set of conductive structures and each of the first conductive structure and the second conductive structure, the first set of vias coupling the first set of conductive structures to each of the first conductive structure and the second conductive structure, and each via of the first set of vias being located where each of the first conductive structure and the second conductive structure overlaps each conductive structure of the first set of conductive structures;

a second set of conductive structures extending in the first direction, overlapping the first conductive structure and the second conductive structure, covering a portion of at least the first conductive structure or the second conductive structure, and being located at a third level different from the first level and the second level, and each conductive structure of the second set of conductive structures being separated from each other in the second direction; and a set of power rails extending in the first direction and being located at the first level, the set of power rails comprising:
a first power rail configured to supply a first supply voltage; and
a second power rail separated from the first power rail in the second direction, and being configured to supply a second supply voltage different from the first supply voltage,
wherein at least the first set of conductive structures, the second set of conductive structures, the first conductive structure or the second conductive structure is between the first power rail and the second power rail.

17. The integrated circuit structure of claim 16, further comprising:
a second set of vias between the second set of conductive structures and each of the first conductive structure and the second conductive structure, the second set of vias coupling the second set of conductive structures to each of the first conductive structure and the second conductive structure, and each via of the second set of vias being located where the second set of conductive structures overlaps each of the first conductive structure and the second conductive structure.

18. The integrated circuit structure of claim 17, further comprising:
- a third conductive structure extending in the second direction, overlapping the second set of conductive structures, covering a portion of a conductive structure of the second set of conductive structures, and being located at a fourth level different from the first level, the second level and the third level;
- a fourth conductive structure extending in the second direction, overlapping the second set of conductive structures, covering a portion of another conductive structure of the second set of conductive structures, being located at the fourth level, and being separated from the third conductive structure in the first direction; and
- a third set of vias between the second set of conductive structures and each of the third conductive structure and the fourth conductive structure, the third set of vias coupling the second set of conductive structures to each of the third conductive structure and the fourth conductive structure, and each via of the third set of vias being located where each conductive structure of the second set of conductive structures is overlapped by each of the third conductive structure and the fourth conductive structure.

19. The integrated circuit structure of claim 18, wherein
the first set of conductive structures have a same width as the second set of conductive structures; and
at least the first conductive structure or the second conductive structure has a same length as at least the third conductive structure or the fourth conductive structure.

20. The integrated circuit structure of claim 18,
wherein at least the third conductive structure or the fourth conductive structure is between the first power rail and the second power rail.

* * * * *